(12) United States Patent
Park et al.

(10) Patent No.: US 9,583,592 B2
(45) Date of Patent: Feb. 28, 2017

(54) METHODS OF MANUFACTURING SEMICONDUCTOR DEVICES

(71) Applicants: Pan-Kwi Park, Incheon (KR);
Dong-Suk Shin, Gyeonggi-Do (KR);
Seok-Jun Won, Seoul (KR);
Weon-Hong Kim, Suwon-si (KR);
Jae-Gon Lee, Hwaseong-si (KR)

(72) Inventors: Pan-Kwi Park, Incheon (KR);
Dong-Suk Shin, Gyeonggi-Do (KR);
Seok-Jun Won, Seoul (KR);
Weon-Hong Kim, Suwon-si (KR);
Jae-Gon Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/697,266

(22) Filed: Apr. 27, 2015

(65) Prior Publication Data

US 2016/0035861 A1    Feb. 4, 2016

(30) Foreign Application Priority Data

Aug. 4, 2014  (KR) .................. 10-2014-0099738

(51) Int. Cl.
*H01L 29/66* (2006.01)
*H01L 21/02* (2006.01)
*H01L 21/311* (2006.01)
*H01L 21/3213* (2006.01)
(Continued)

(52) U.S. Cl.
CPC .... *H01L 29/66545* (2013.01); *H01L 21/0206* (2013.01); *H01L 21/0217* (2013.01); *H01L 21/02247* (2013.01); *H01L 21/31111* (2013.01); *H01L 21/32139* (2013.01); *H01L 21/823418* (2013.01); *H01L 21/823814* (2013.01); *H01L 29/6653* (2013.01); *H01L 29/6656* (2013.01);
(Continued)

(58) Field of Classification Search
CPC .......... H01L 29/66545; H01L 29/6656; H01L 29/6653; H01L 29/66636; H01L 21/823814; H01L 29/7833; H01L 29/7848
See application file for complete search history.

(56) References Cited

U.S. PATENT DOCUMENTS

| | | | |
|---|---|---|---|
| 5,739,573 A * | 4/1998 | Kawaguchi | H01L 21/82344 257/368 |
| 6,235,568 B1 * | 5/2001 | Murthy | H01L 21/82381 257/E21.634 |
| 6,753,232 B2 | 6/2004 | Kwak et al. | |

(Continued)

FOREIGN PATENT DOCUMENTS

| | | |
|---|---|---|
| JP | 2006-024679 A | 1/2006 |
| JP | 2008-171910 A | 7/2008 |

(Continued)

*Primary Examiner* — Jaehwan Oh
(74) *Attorney, Agent, or Firm* — Volentine & Whitt, PLLC

(57) ABSTRACT

In a method of manufacturing a semiconductor device, a dummy gate structure is formed on a substrate. A first spacer layer is formed on the substrate to cover the dummy gate structure. A nitridation process is performed on the first spacer layer. An upper portion of the substrate adjacent to the dummy gate structure is removed to form a trench. An inner wall of the trench is cleaned. An epitaxial layer is formed to fill the trench. The dummy gate structure is replaced with a gate structure.

20 Claims, 47 Drawing Sheets

(51) Int. Cl.
*H01L 21/8238* (2006.01)
*H01L 21/8234* (2006.01)

(52) U.S. Cl.
CPC  *H01L 29/66636* (2013.01); *H01L 21/823437* (2013.01); *H01L 21/823828* (2013.01)

(56) References Cited

U.S. PATENT DOCUMENTS

| | | | |
|---|---|---|---|
| 6,812,535 | B2 | 11/2004 | Yagishita et al. |
| 8,394,688 | B2 | 3/2013 | Lin et al. |
| 8,592,265 | B2 | 11/2013 | Kim et al. |
| 2007/0138573 | A1* | 6/2007 | Kashihara ............ H01L 29/665 257/382 |
| 2008/0121932 | A1* | 5/2008 | Ranade ............ H01L 21/28255 257/192 |
| 2011/0156099 | A1* | 6/2011 | Hoentschel ......... H01L 21/2807 257/192 |
| 2012/0028431 | A1 | 2/2012 | Niimi et al. |
| 2012/0153387 | A1* | 6/2012 | Murthy ............ H01L 21/28512 257/335 |
| 2012/0251737 | A1* | 10/2012 | Osaki ................ H01L 29/4983 427/575 |
| 2013/0280878 | A1 | 10/2013 | Wen et al. |
| 2013/0292774 | A1* | 11/2013 | Hoentschel ....... H01L 21/82341 257/368 |

FOREIGN PATENT DOCUMENTS

| | | |
|---|---|---|
| KR | 2001-0058942 A | 7/2001 |
| KR | 0451038 B | 9/2004 |
| KR | 2005-0010227 A | 1/2005 |

\* cited by examiner

METHODS OF MANUFACTURING SEMICONDUCTOR DEVICES

CROSS-REFERENCE TO RELATED APPLICATION

This application claims priority under 35 USC §119 to Korean Patent Application No. 10-2014-0099738, filed on Aug. 4, 2014 in the Korean Intellectual Property Office (KIPO), the contents of which are hereby incorporated by reference in their entirety.

BACKGROUND

Representative embodiments relate to methods of manufacturing semiconductor devices. More particularly, representative embodiments relate to methods of manufacturing semiconductor devices including a gate structure.

In a gate-last process, a dummy gate structure including a dummy gate insulation layer pattern and a dummy gate electrode may be formed, and a spacer may be formed on a sidewall of the dummy gate structure. The spacer may be oxidized when removing a photoresist pattern serving as an etching mask in various processes. Additionally, a trench may be formed at an upper portion of a substrate adjacent to the dummy gate structure. Surfaces of the substrate defining the trench are cleaned using a cleaning solution. As a result, the oxidized spacer adjacent to the trench may be removed by the cleaning solution thereby forming a void. Thus, when the dummy gate electrode is removed, an etching solution may flow through the void onto the substrate and thereby damage the substrate.

SUMMARY

Representative embodiments include a method of manufacturing a semiconductor device that comprises forming a dummy gate structure on a substrate, forming a spacer layer on the substrate including over the dummy gate structure, nitriding the spacer layer, forming a trench in the substrate by removing an upper portion of the substrate adjacent to the dummy gate structure, cleaning an interior surface that defines the trench, forming an epitaxial layer in the trench, and replacing the dummy gate structure with a gate structure.

Representative embodiments also include a method of manufacturing a semiconductor device that comprises forming first and second dummy gate structures on first and second regions, respectively, of a substrate, forming a spacer layer on the substrate to cover the first and second dummy gate structures, nitriding the spacer layer, forming a first trench in the substrate by removing an upper portion of the substrate adjacent to the first dummy gate structure, cleaning an inner surface defining the first trench, forming a first epitaxial layer in the first trench; and replacing the first and second dummy gate structures with first and second gate structures, respectively.

Representative embodiments also include a method of manufacturing a semiconductor device that comprises forming an isolation layer on a substrate to define a field region covered by the isolation layer and an active region protruding upwardly beyond the level of an upper surface isolation layer, forming a dummy gate structure on the active region of the substrate, forming a spacer layer on the substrate to cover the dummy gate structure, nitriding the spacer layer, forming a trench in the substrate by removing an upper portion of the active region of the substrate adjacent to the dummy gate structure, cleaning an interior surface defining the trench, forming an epitaxial layer in the trench, and replacing the dummy gate structure with a gate structure.

Representative embodiments also include a method of manufacturing a semiconductor device that comprises forming a dummy gate structure on a substrate, forming a spacer layer on the substrate including over the dummy gate structure, subsequently forming a photoresist pattern on the substrate, implanting impurities into the substrate using the dummy gate structure and the photoresist pattern as an ion implantation mask, subsequently removing the photoresist pattern in a process that introduces oxygen into the spacer layer, subsequently reducing the oxygen concentration of the spacer layer, forming a trench in the substrate by removing an upper portion of the substrate adjacent to the dummy gate structure, cleaning an interior surface of the substrate that defines the trench, forming an epitaxial layer in the trench, and replacing the dummy gate structure with a gate structure.

BRIEF DESCRIPTION OF THE DRAWINGS

Representative embodiments will be more clearly understood from the following detailed description made in conjunction with the accompanying drawings.

DETAILED DESCRIPTION OF THE PREFERRED EMBODIMENTS

Figure 1:
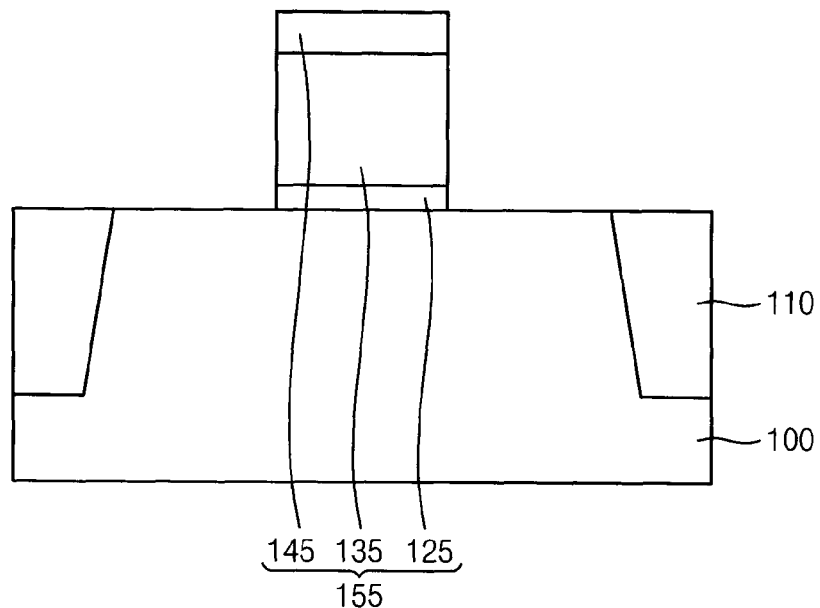
FIGS. 1, 2, 3, 4, 5, 6, 7, 8, 9, 10, 11, 12, 13, 14, 15 and 16 are each a cross-sectional view of a semiconductor device during a stage in its manufacture and collectively illustrate a representative embodiment of a method of manufacturing a semiconductor device in accordance with the inventive concept.

Various representative embodiments will be described more fully hereinafter with reference to the accompanying drawings, in which some representative embodiments are shown. The present inventive concept may, however, be embodied in many different forms and should not be construed as limited to the representative embodiments set forth herein. Rather, these representative embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular Representative embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Representative embodiments are described herein with reference to cross-sectional illustrations that are schematic illustrations of idealized representative embodiments (and intermediate structures). As such, variations from the shapes of the illustrations as a result, for example, of manufacturing techniques and/or tolerances, are to be expected. Thus, representative embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. For example, the term "sidewall" may be understood as referring simply to a side surface of a an element. The term "extending" in a particular direction with reference to a particular element will be understood as referring to the lengthwise or longest dimension of that element even when not explicitly stated. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 16 illustrate representative embodiments of a method of manufacturing a semiconductor device in accordance with the inventive concept.

Referring to FIG. 1, a dummy gate structure 155 may be formed on a substrate 100 having an isolation layer 110 therein.

The substrate 100 may include silicon, germanium, silicon-germanium, or III-V semiconductor compounds, e.g., GaP, GaAs, and GaSb. The substrate 100 may be a silicon-on-insulator (SOI) substrate or a germanium-on-insulator (GOI) substrate.

A field region having a top surface covered by the isolation layer 110 and an active region having a top surface not covered by the isolation layer 110 may be defined in the substrate 100. The isolation layer 110 may be formed by a shallow trench isolation (STI) process, and include an oxide, e.g., silicon oxide.

The dummy gate structure 155 may be formed to include a dummy gate insulation layer pattern 125, a dummy gate electrode 135 and a hard mask 145 sequentially stacked on the substrate 100. More particularly, the dummy gate structure 155 may be formed by sequentially stacking a dummy gate insulation layer, a dummy gate electrode layer and a hard mask layer on the substrate 100 and the isolation layer 110, patterning the hard mask layer by a photolithography process to form a hard mask 145, and sequentially etching the dummy gate electrode layer and the dummy gate insulation layer using the hard mask 145 as an etching mask.

The dummy gate insulation layer may be formed to include an oxide, e.g., silicon oxide, the dummy gate electrode layer may be formed to include polysilicon, for example, and the hard mask layer may be formed to include a nitride, e.g., silicon nitride. The dummy gate insulation layer may be formed by a chemical vapor deposition (CVD) process, an atomic layer deposition (ALD) process, or the like. Alternatively, the dummy gate insulation layer may be formed by a thermal oxidation process on an upper portion of the substrate 100. The dummy gate electrode layer and the hard mask layer may be formed by a CVD process or an ALD process.

In representative embodiments, dummy gate structures 155 formed on the substrate 100 may have the shape of islands spaced from each other, or may have the shape of parallel lines extending lengthwise in a given direction on the substrate 100 and the isolation layer 110.

Figure 2:
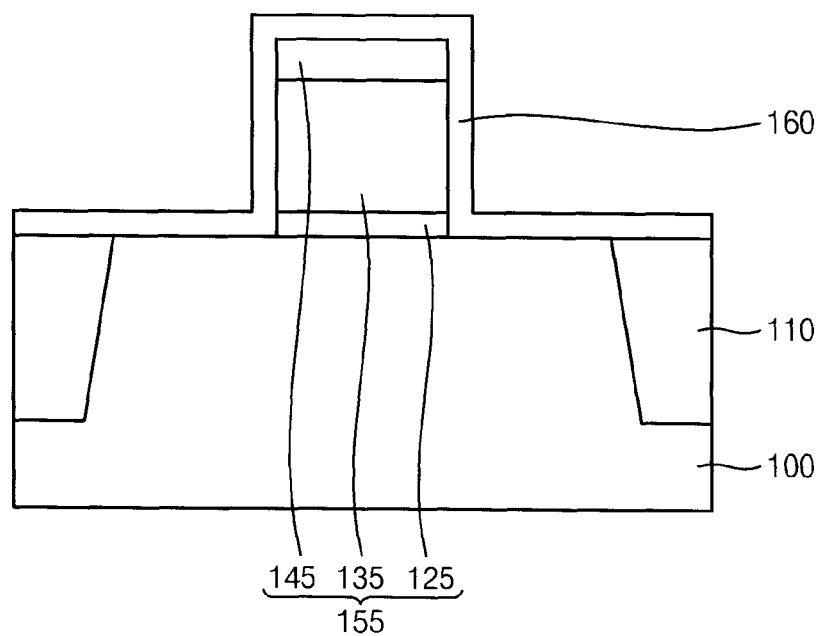

Referring to FIG. 2, a first spacer layer 160 may be formed on the substrate 100 and the isolation layer 110 to cover the dummy gate structure 155.

In representative embodiments, the first spacer layer 160 may be formed using a nitride, e.g., silicon nitride, by an ALD process or a CVD process.

Figure 3:
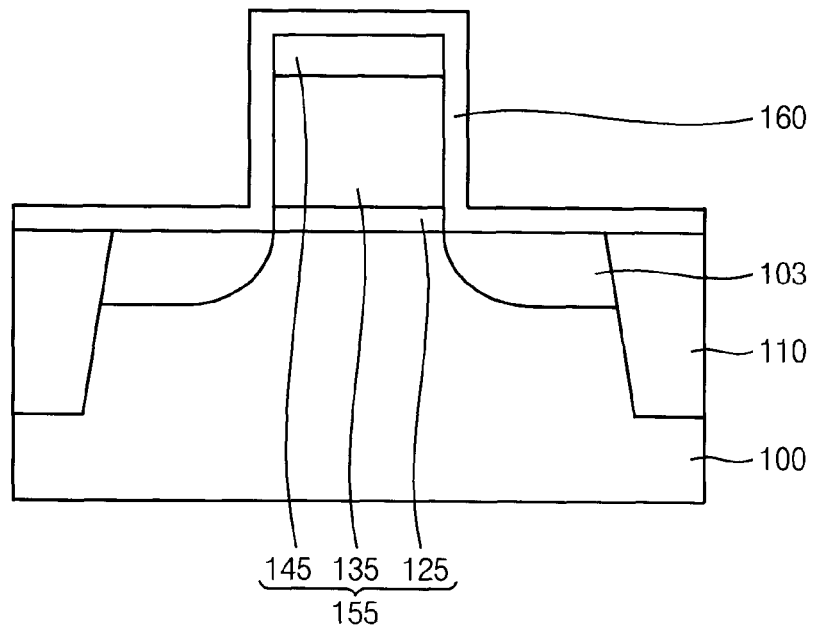

Referring to FIG. 3, an impurity region 103 may be formed at an upper portion of the active region of the substrate 100 adjacent to the dummy gate structure 155.

More particularly, an ion implantation may be performed using the dummy gate structure 155 as an ion implantation mask to form the impurity region 103 at the upper portion of the active region of the substrate 100. The impurity region 103 may be formed to include impurities having a concentration lower than that of an epitaxial layer 180 (refer to FIG. 8) subsequently formed, and thus may be referred to as a lightly doped drain (LDD) region. The impurities implanted into the impurity region 103 may be p-type impurities or n-type impurities according to the type of the semiconductor device. That is, when a positive-channel metal oxide semiconductor (PMOS) transistor is formed, the impurities may be p-type impurities, and when a negative-channel metal oxide semiconductor (NMOS) transistor is formed, the impurities may be n-type impurities.

When the impurity region 103 is formed at a specific region only, a photoresist pattern (not shown) serving as an ion implantation mask may be formed on the substrate 100, and the impurities may be implanted into the specific region exposed by the photoresist pattern to form the impurity region 103. For example, a photoresist pattern (not shown) covering an NMOS region may be formed, and the impurity region 103 may be formed at a PMOS region exposed by the photoresist pattern. The photoresist pattern may be removed by an ashing process and/or a stripping process, and the first spacer layer 160 may be oxidized in the ashing process and/or the stripping process.

Thus, the first spacer layer 160 may be formed to include silicon oxynitride, and a surface of the first spacer layer 160 may include oxygen at a concentration greater than that of a portion of the first spacer layer 160 adjacent to the substrate 100 or the dummy gate structure 155.

Figure 4:
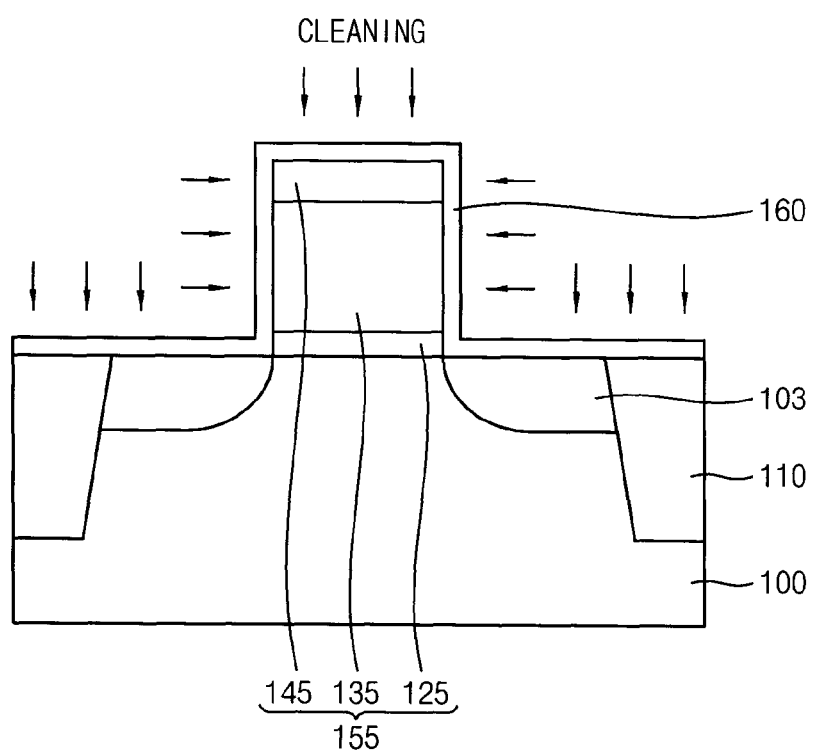

Referring to FIG. 4, a first cleaning process may be performed on the first spacer layer 160.

The first cleaning process may include a dry cleaning using ammonia ($NH_3$) and/or nitrogen trifluoride ($NF_3$) plasma, or a wet cleaning using hydrogen fluoride (HF) and/or buffered oxide etch (BOE). Thus, mainly the surface of the first spacer layer 160 having a relatively high oxygen concentration may be removed, such that the thickness of the first spacer layer 160 is decreased.

The first cleaning process may support a subsequent nitridation process.

Figure 5:
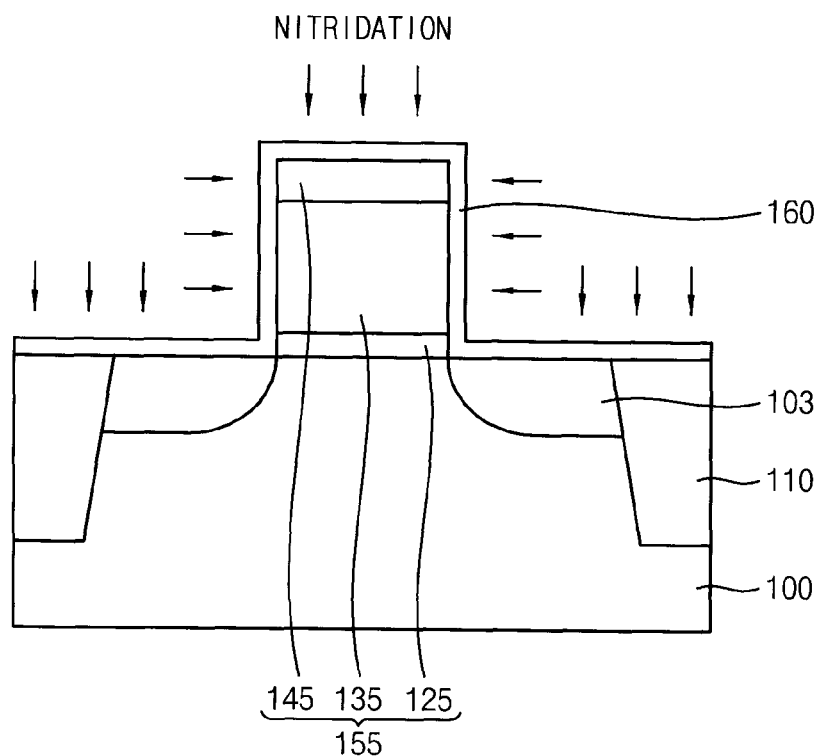

Referring to FIG. 5, the nitridation process may be performed on the first spacer layer 160.

The nitridation process may be performed using nitrogen ($N_2$) gas and/or ammonia ($NH_3$) gas. Thus, the oxidized first spacer layer 160 may be nitridated, and the first spacer layer 160 may include, e.g., silicon nitride.

That is, the first spacer layer 160 may include a large amount of oxygen when the photoresist pattern is removed; however, the surface of the first spacer 160 having a relatively high oxygen concentration may be removed by the first cleaning process illustrated in FIG. 4, and the oxygen concentration of other portions of the first spacer layer 160 may be reduced by the nitridation process.

In other embodiments, the first cleaning process not performed, i.e., is omitted, and the method flows from the removal of the photoresist pattern directly to the nitridation process.

In yet other embodiments, the first cleaning process is performed after the nitridation process.

Figure 6:
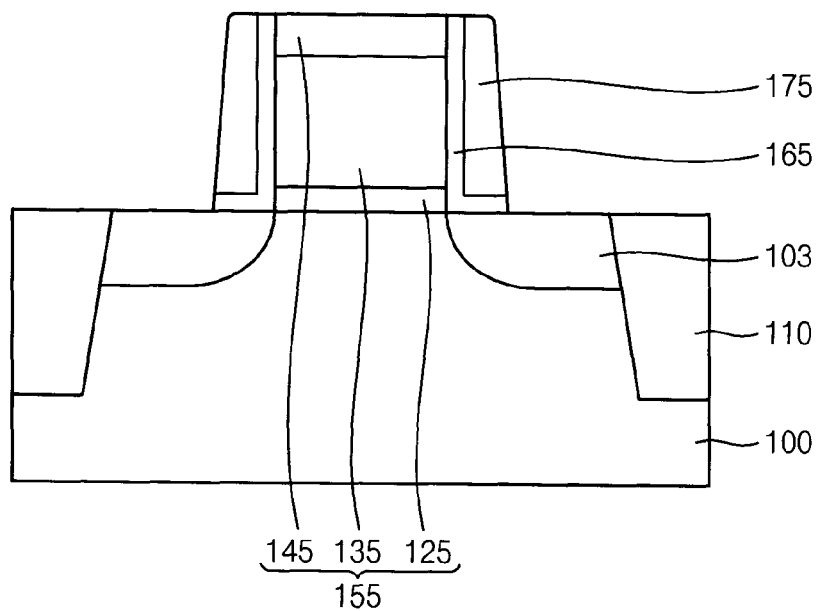

Referring to FIG. 6, after a second spacer layer is formed on the first spacer layer 160, the second spacer layer and the first spacer layer 160 may be sequentially etched to form a second spacer 175 and a first spacer 165, respectively.

In representative embodiments, the second spacer layer may be formed to have a thickness greater than that of the first spacer layer 160, and may be formed to include silicon nitride or a low-k dielectric material, for example.

The second spacer layer and the first spacer layer 160 may be anisotropically etched, and thus the first and second spacers 165 and 175 may be formed on a sidewall of the dummy gate spacer 155. In representative embodiments, the first spacer 165 may be formed to have an L-shaped cross section.

Figure 7:
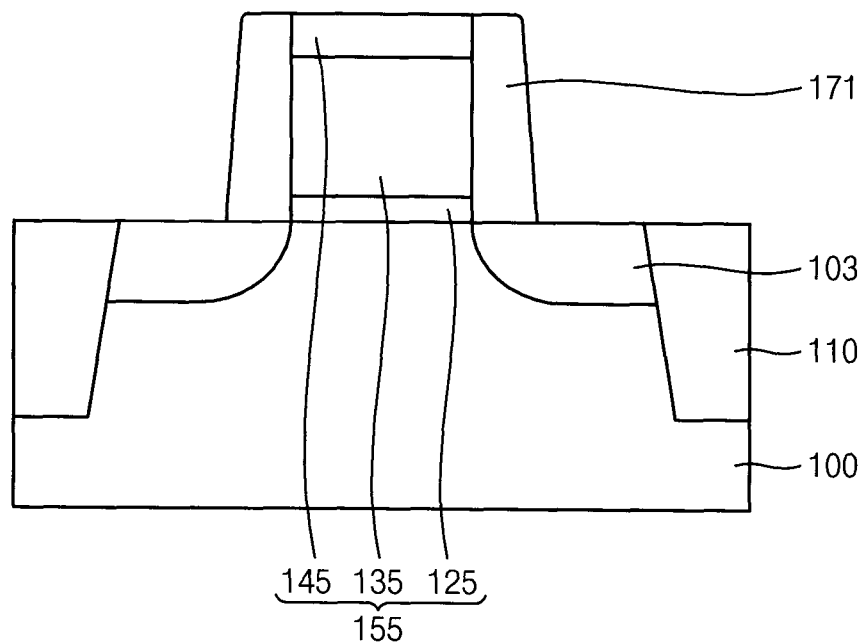

Alternatively, referring to FIG. 7, when the first spacer layer 160 is sufficiently nitridated by the first cleaning process and the nitridation process, and when the second spacer layer is formed to include silicon nitride, the forming of the first and second spacer layers may result in the formation of a unitary spacer structure 171 having a composition that is substantially homogeneous throughout.

Hereinafter, for ease of description, only the case in which the first and second spacers 165 and 175 are formed will be described.

The first and second spacers 165 and 175 may overlap the impurity region 103.

Figure 8:
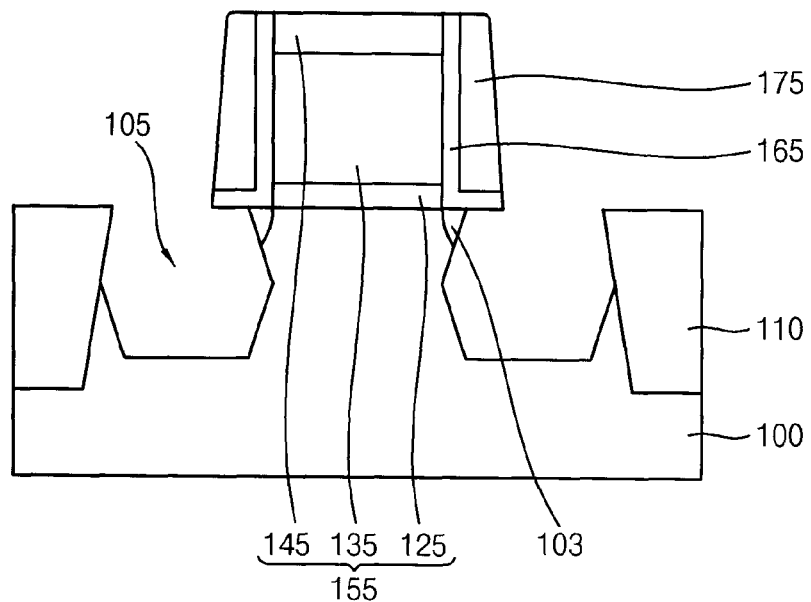

Referring to FIG. 8, an upper portion of the active region of the substrate 100 adjacent to the dummy gate structure 155 may be etched to form a trench 105.

More particularly, the upper portion of the active region of the substrate 100 may be removed using the dummy gate structure 155 and the first and second spacers 165 and 175 on the sidewall of the dummy gate structure 155 as an etching mask to form the trench 105. In representative embodiments, the trench 105 may be formed to have what may be referred to as a sigma-shaped (a profile below the dummy gate structure resembling the Greek letter E). Alternatively, the trench 105 may be formed to have a "U"-shaped profile, a rounded profile, or substantially vertical sides.

As the trench 105 is formed, a portion of the impurity region 103 may be removed, whereas a portion of the impurity region 103 under the first and second spacers 165 and 175 may remain. Also, the bottom of the first spacer 165 may be partially exposed by the trench 105.

A second cleaning process may be performed using a cleaning solution, e.g., ammonia hydroxide ($NH_4OH$), on an upper surface of the substrate 100 exposed by the trench 105.

In representative embodiments, the first spacer 165 may have a reduced oxygen concentration due to the nitridation process and/or the first cleaning process, and thus may not be damaged by the second cleaning process. Otherwise, a portion of the first spacer 165 exposed by the trench 105 could be removed by the cleaning solution used in the second cleaning process, and a portion of the dummy gate insulation layer pattern 125 adjacent thereto could also be removed. However, in representative embodiments, the nitridation process and/or the first cleaning process ensures that the first spacer 165 has a relatively low oxygen concentration. Accordingly, a void is not produced in the first spacer 165 or the dummy gate insulation layer pattern 125 during the second cleaning process, or no portion or only a very small portion of the first spacer 165 or the dummy gate insulation layer pattern 125 is/are removed during the second cleaning process.

Figure 9:
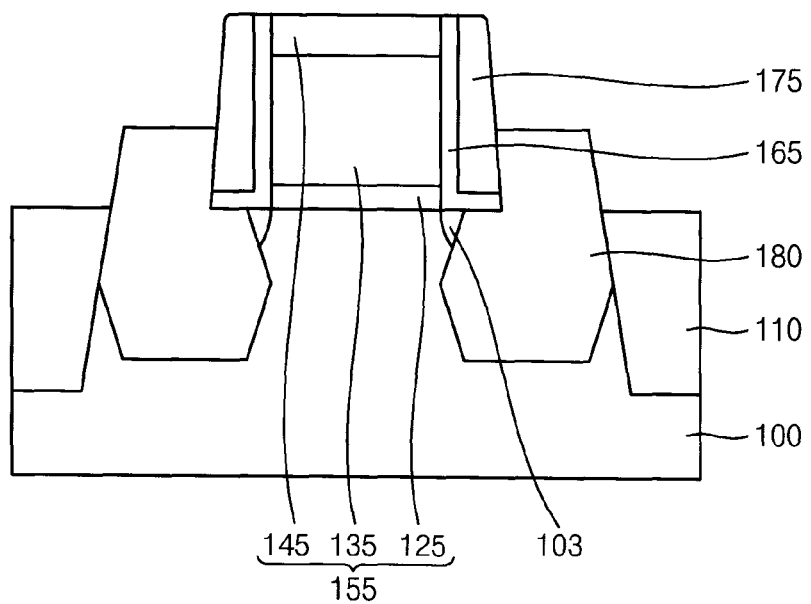

Referring to FIG. 9, an epitaxial layer 180 may be formed to fill the trench 105.

More particularly, the epitaxial layer 180 may be formed by a selective epitaxial growth (SEG) process using an upper surface of the substrate 100 exposed by the trench 105 as a seed. The SEG process may be performed using a silicon source gas, e.g., dichlorosilane ($SiH_2Cl_2$) and a germanium source gas, e.g., germane ($GeH_4$), to form a single crystalline silicon-germanium layer. In representative embodiments, a p-type impurity source gas, e.g., diborane ($B_2H_6$), may be also used to form a single crystalline silicon-germanium layer doped with p-type impurities. Thus, the epitaxial layer 180 may serve as a source/drain region of a PMOS transistor.

Alternatively, the SEG process may be performed using a silicon source gas, e.g., disilane ($Si_2H_6$), and a carbon source gas, e.g., monomethylsilane ($SiH_3CH_3$), to form a single crystalline silicon carbide layer. In representative embodiments, an n-type impurity source gas, e.g., phosphine ($PH_3$), may also be used to form a single crystalline silicon carbide layer doped with n-type impurities. Thus, the epitaxial layer 180 may serve as a source/drain region of an NMOS transistor.

The epitaxial layer 180 may fill the trench 105, and further grow so that a top surface of the epitaxial layer 180 may contact the second spacer 175.

Figure 10:
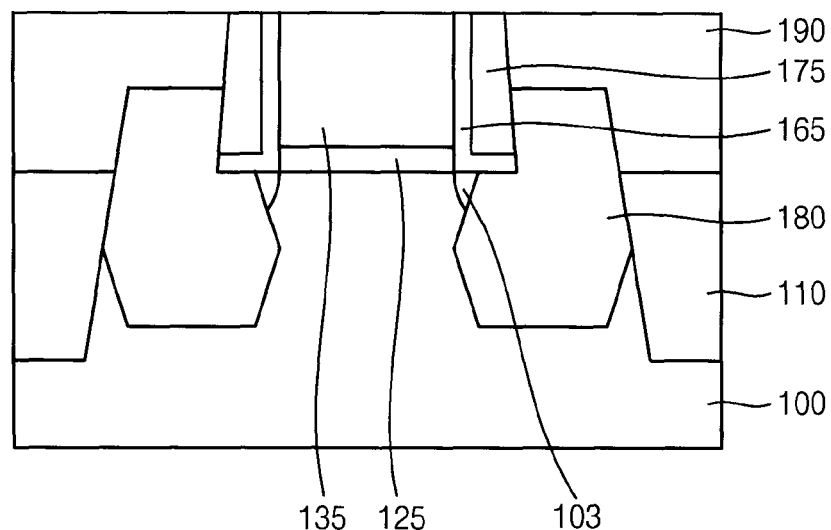

Referring to FIG. 10, a first insulating interlayer 190 may be formed to cover the dummy gate structure 155, the epitaxial layer 180 and the first and second spacers 165 and 175, and may be planarized until a top surface of the dummy gate electrode 135 is exposed. In the planarization process, the hard mask 145 may be also removed, and upper portions of the first and second spacers 165 and 175 may be partially removed.

The first insulating interlayer 190 may be formed to include silicon oxide, for example. The planarization process may be a chemical mechanical polishing (CMP) process and/or an etch back process.

Figure 11:
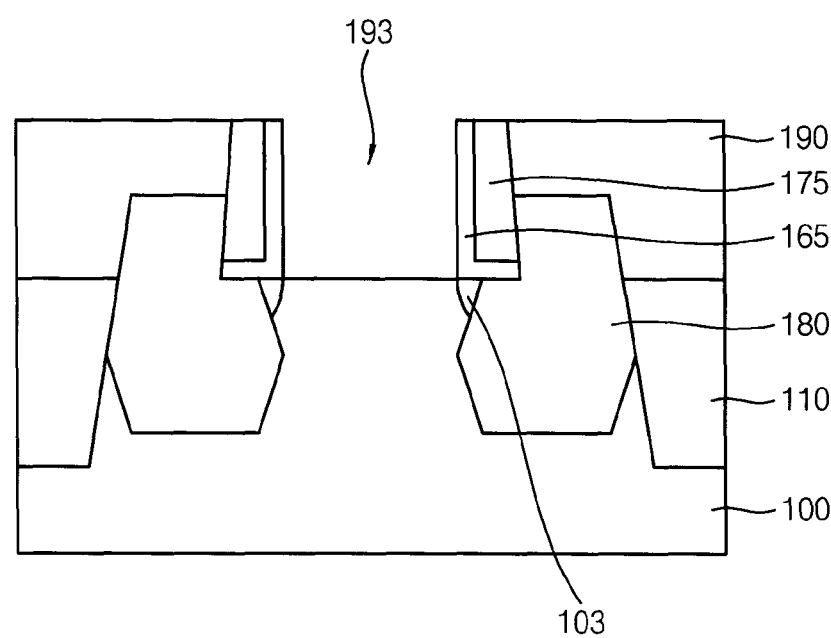

Referring to FIG. 11, the exposed dummy gate electrode 135 and the dummy gate insulation layer pattern 125 under the dummy gate electrode 135 may be removed to form a first opening 193 exposing an inner sidewall of the first spacer 165 and a top surface of the active region of the substrate 100.

In representative embodiments, the exposed dummy gate electrode 135 may be removed by a dry etch process first, and then a wet etch process using ammonia hydroxide ($NH_4OH$) as an etching solution. The dummy gate insulation layer pattern 125 may be removed by a dry etch process and/or a wet etch process using hydrogen fluoride (HF) as an etching solution.

As described above, due to the nitridation and/or the first cleaning of the first spacer layer 160, no void(s) may be generated in the first spacer 165 and the dummy gate insulation layer pattern 125, or no portion(s) thereof may be removed. Thus, the top surface of the active region of the substrate 100 exposed when the first opening 193 is formed may not be damaged. That is, if the first spacer 165 and the dummy gate insulation layer pattern 125 adjacent thereto were oxidized and as a result were removed by the second cleaning process, the etching solution or the etching gas used when the dummy gate electrode 135 and the dummy gate insulation layer pattern 125 are removed to form the first opening 193 could flow onto the active region of the substrate 100 and damage the active region. However, in representative embodiments, the first spacer 165 may have a reduced oxygen concentration due to the nitridation process and/or the first cleaning process, and thus no void may be created therein during the second cleaning process. As a result, a silicon pitting phenomenon in which the active region of the substrate 100 may be damaged during the formation of the first opening 193 may be prevented. Accordingly the semiconductor device may have good characteristics and not produce any electrical shorts.

Figure 12:
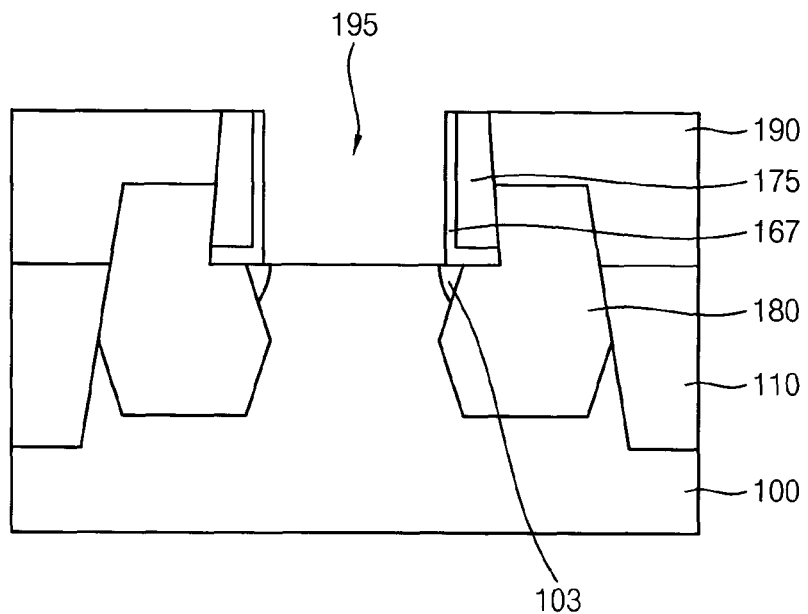

Referring to FIG. 12, the first spacer 165 exposed by the first opening 193 may be partially removed to form a first spacer pattern 167, and thus the first opening 193 may be enlarged to form a second opening 195.

More particularly, a dry cleaning using ammonia ($NH_3$) gas and/or nitrogen trifluoride ($NF_3$) plasma, or a wet cleaning using hydrogen fluoride (HF) and/or buffered oxide etch (BOE) may be performed to partially remove the inner sidewall of the first spacer 165 exposed by the first opening 193. Thus, the first spacer pattern 167 may be formed.

The process for enlarging the first opening 193 to form the second opening 195 may be performed to produce a gate electrode 225 (refer to FIG. 13) of a desired size (area or footprint) and thus, in some cases, may be omitted.

Figure 13:
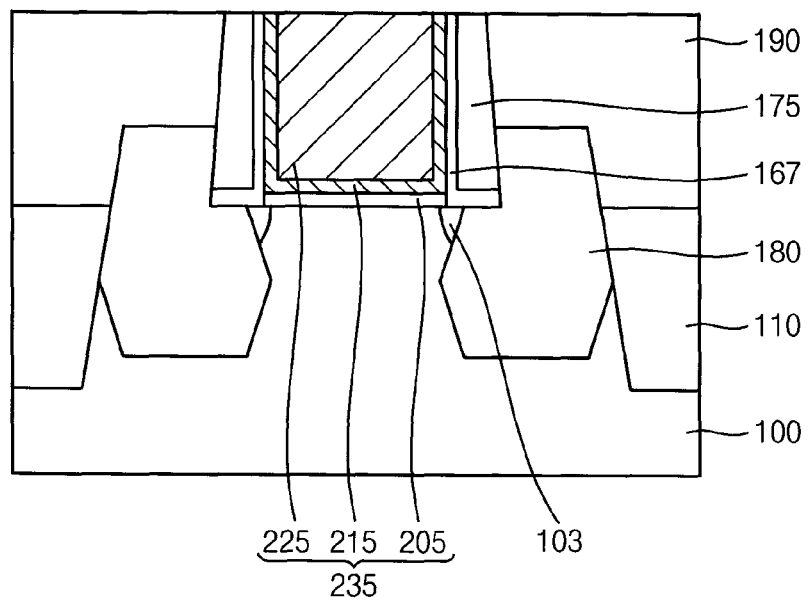

Referring to FIG. 13, a gate structure 235 may be formed to fill the second opening 195.

More particularly, a thermal oxidation process may be preformed on the top surface of the active region of the substrate 100 exposed by the second opening 195 to form a gate insulation layer pattern 205. Then a high-k dielectric layer may be formed on the gate insulation layer pattern 205, a sidewall of the first spacer pattern 167, and the first insulating interlayer 190. Next, a gate electrode layer may be formed on the high-k dielectric layer to fill the remaining portion of the second opening 195.

The high-k dielectric layer may be formed to include a metal oxide having a high dielectric constant, e.g., hafnium oxide, tantalum oxide, zirconium oxide, or the like, by a CVD process or an ALD process. The gate electrode layer may be formed to include a material having a low resistance, e.g., a metal such as aluminum, copper, or tantalum, or a metal nitride thereof by an ALD process, a physical vapor deposition (PVD) process, or the like. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed. Alternatively, the gate electrode layer may be formed to include doped polysilicon.

Instead of being formed by a thermal oxidation process, the gate insulation layer pattern 205 may be formed by a CVD process, an ALD process, or the like, similarly to the high-k dielectric layer or the gate electrode layer. In this case, the gate insulation layer pattern 205 may be formed not only on the active region of the substrate 100 but also on the sidewall of the first spacer pattern 167.

The gate electrode layer and the high-k dielectric layer may be planarized until a top surface of the first insulating interlayer 190 is exposed to form a high-k dielectric layer pattern 215 on the gate insulation layer pattern 205 and the sidewall of the first spacer pattern 167, and the gate electrode 225 filling the remaining portion of the second opening 195 on the high-k dielectric layer pattern 215. Accordingly, a bottom surface and a sidewall of the gate electrode 225 may be surrounded by the high-k dielectric layer pattern 215. In representative embodiments, the planarization process may be a CMP process and/or an etch back process.

The gate insulation layer pattern 205, the high-k dielectric layer pattern 215 and the gate electrode 225 sequentially stacked may form the gate structure 235, and the gate structure 235 and the epitaxial layer 180 may form a PMOS transistor or an NMOS transistor according to the conductivity type of the impurities in the epitaxial layer 180.

Figure 14:
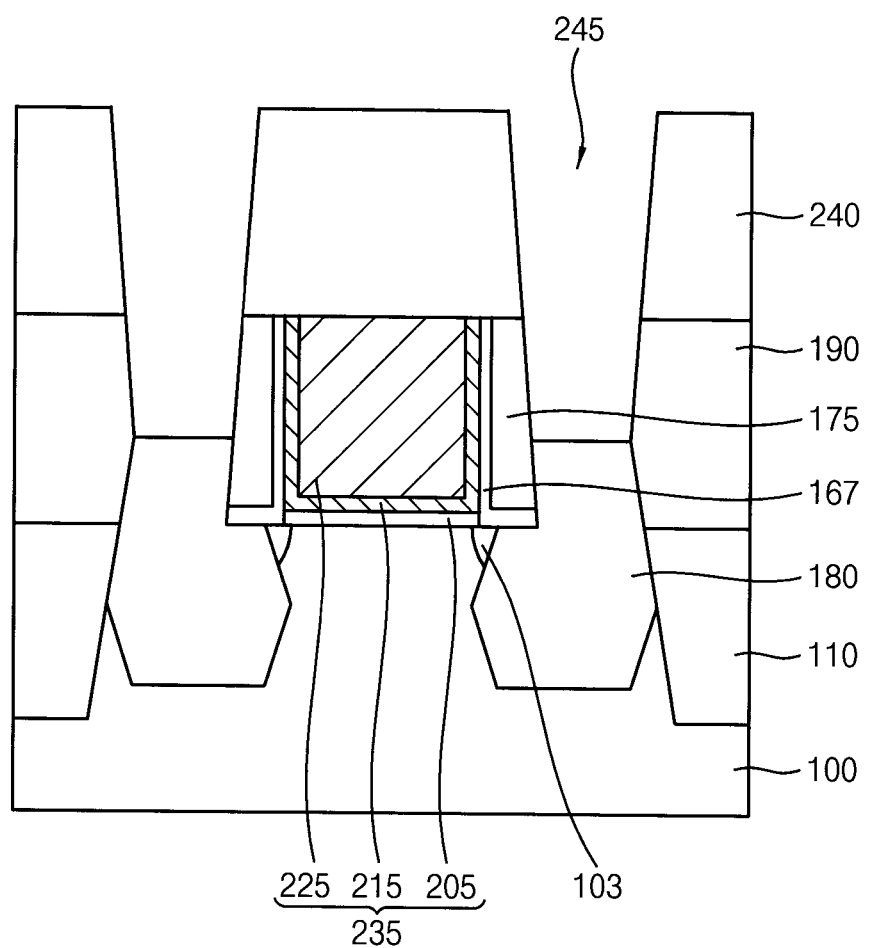

Referring to FIG. 14, a second insulating interlayer 240 may be formed on the first insulating interlayer 190, the gate structure 235, the first spacer pattern 167 and the second spacer 175, and a hole 245 may be formed through the first and second insulating interlayers 190 and 240 to expose a top surface of the epitaxial layer 180.

The second insulating interlayer 240 may be formed to include a material different from that of the first insulating interlayer 190. For example, the second insulating interlayer 240 may be formed to include an oxide, e.g., silicon oxide.

The hole 245 may be formed by forming a photoresist pattern (not shown) on the second insulating interlayer 240, and performing a dry etch process using the photoresist pattern as an etching mask. In representative embodiments, the hole 245 may be formed to be self-aligned with the second spacer 175.

Figure 15:
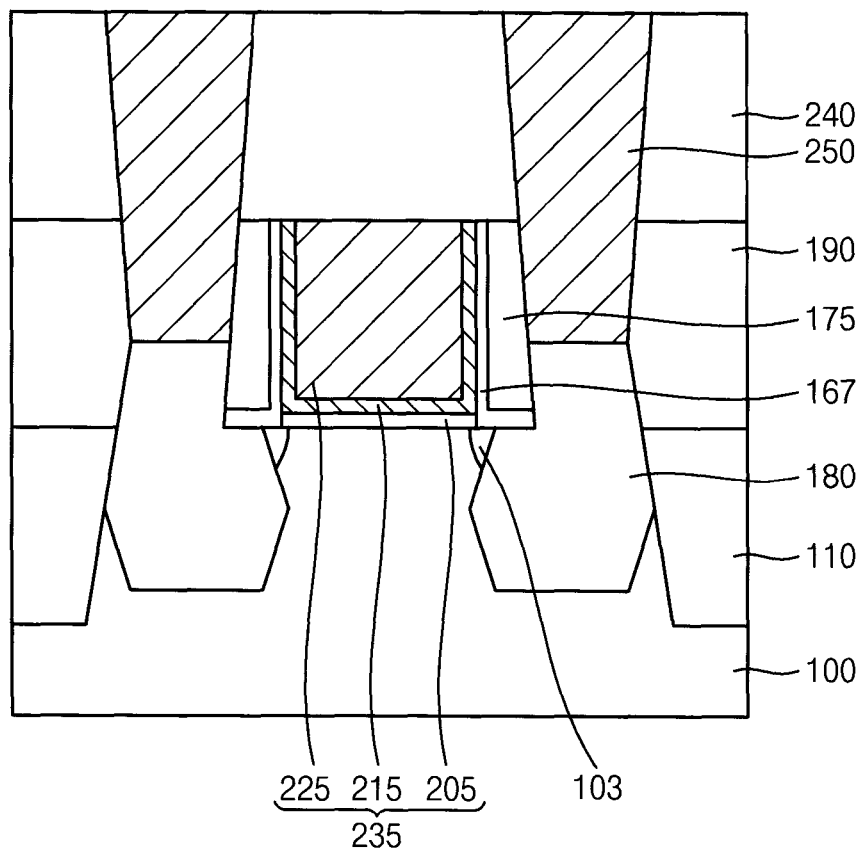

Referring to FIG. 15, a contact plug 250 may be formed to fill the hole 245.

The contact plug 250 may be formed by forming a conductive layer on the exposed top surface of the epitaxial layer 180 of a sufficient thickness to fill the hole 245 and cover the second insulating interlayer 240, and planarizing the conductive layer until a top surface of the second insulating interlayer 240 is exposed. In representative embodiments, the conductive layer may be formed to include doped polysilicon, a metal, a metal nitride and/or a metal silicide. A barrier layer (not shown) may be further formed to surround a bottom and a sidewall of the conductive layer. The barrier layer may be formed to include a metal or a metal nitride.

The semiconductor device manufactured by the above processes may include the gate structure 235 on the substrate 100, the first spacer pattern 167 and the second spacer 175 on the sidewall of the gate structure 235, the epitaxial layer 180 on the substrate 100 adjacent to the gate structure 235, and the contact plug 250 on the epitaxial layer 180. The gate structure 235 may include the gate insulation layer pattern 205, the high-k dielectric layer pattern 215 and the gate electrode 225 sequentially stacked.

Figure 16:
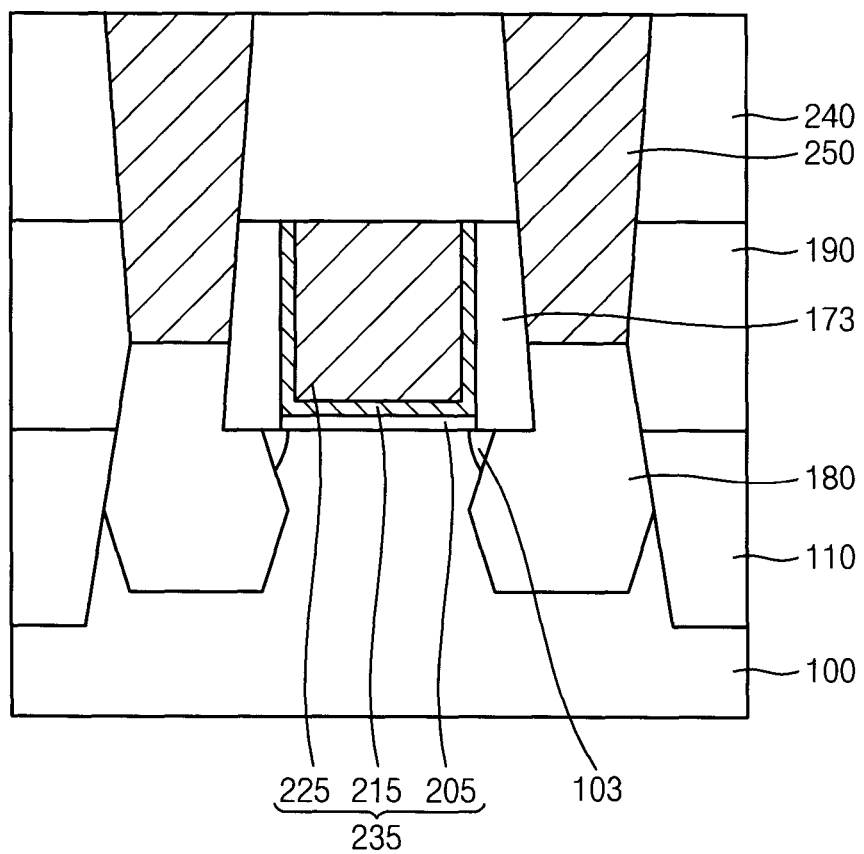

Alternatively, referring to FIG. 16, the semiconductor device may include the gate structure 235 on the substrate 100, a spacer pattern structure 173 on the sidewall of the gate structure 235, the epitaxial layer 180 on the substrate 100 adjacent to the gate structure 235, and the contact plug 250 on the epitaxial layer 180. That is, when the first spacer layer 160 is sufficiently nitridated by the first cleaning process and the nitridation process and when the second spacer layer is formed to include silicon nitride, the unitary spacer pattern structure 173 may be formed.

FIGS. 17 to 34 illustrate other representative embodiments of a method of manufacturing a semiconductor device in accordance with the inventive concept.

This method of manufacturing the semiconductor device of FIGS. 17 to 34 may be an application of the method of manufacturing the semiconductor device illustrated in and described with reference to FIGS. 1 to 16 to a complementary metal oxide semiconductor (CMOS) transistor. Thus, this method may include processes similar to those illustrated in and described with reference to FIGS. 1 to 16.

Figure 17:
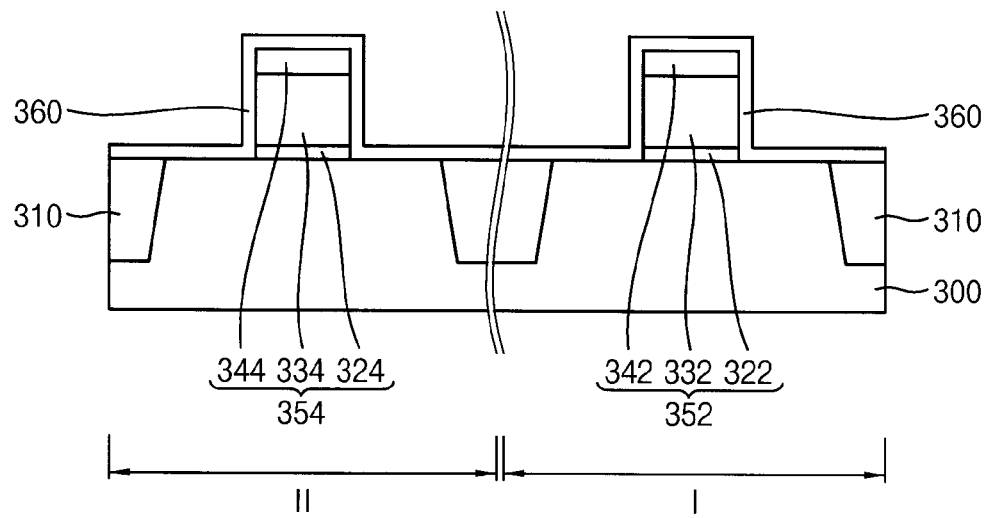
FIGS. 17, 18, 19, 20, 21, 22, 23, 24, 25, 26, 27, 28, 29, 30, 31, 32, 33 and 34 are each a cross-sectional view of a semiconductor device during a stage in its manufacture and collectively illustrate another representative embodiment of a method of manufacturing a semiconductor device in accordance with the inventive concept.

Referring to FIG. 17, processes similar to those illustrated in and described with reference to FIGS. 1 and 2 may be performed.

Thus, first and second dummy gate structures 352 and 354 may be formed on a substrate 300 having an isolation layer 310 thereon, and a first spacer layer 360 may be formed on the substrate 300 and the isolation layer 310 to cover the first and second dummy gate structures 352 and 354.

The device or substrate 300 may include a first region I and a second region II. In representative embodiments, the first region I may be a PMOS region, and the second region II may be an NMOS region. The substrate 300 may include an active region and a field region that may be divided by the isolation layer 310.

The first dummy gate structure 352 may be formed to include a first dummy gate insulation layer pattern 322, a first dummy gate electrode 332 and a first hard mask 342 sequentially stacked on the substrate 300. The second dummy gate structure 354 may be formed to include a second dummy gate insulation layer pattern 324, a second dummy gate electrode 334 and a second hard mask 344 sequentially stacked on the substrate 300.

In representative embodiments, a plurality of first dummy gate structures 352 may have the form of islands spaced from each other on the substrate 300, and a plurality of second dummy gate structures 354 may also have the form of islands spaced from each other on the substrate 300. Alternatively, a plurality of first dummy gate structures 352 may have the form of parallel lines extending lengthwise in a given direction along the substrate 300 and the isolation layer 310, and a plurality of second dummy gate structures 354 may also have the form of parallel lines extending lengthwise in a given direction along the substrate 300 and the isolation layer 310.

The first spacer layer 360 may be formed to include a nitride, e.g., silicon nitride.

Figure 18:
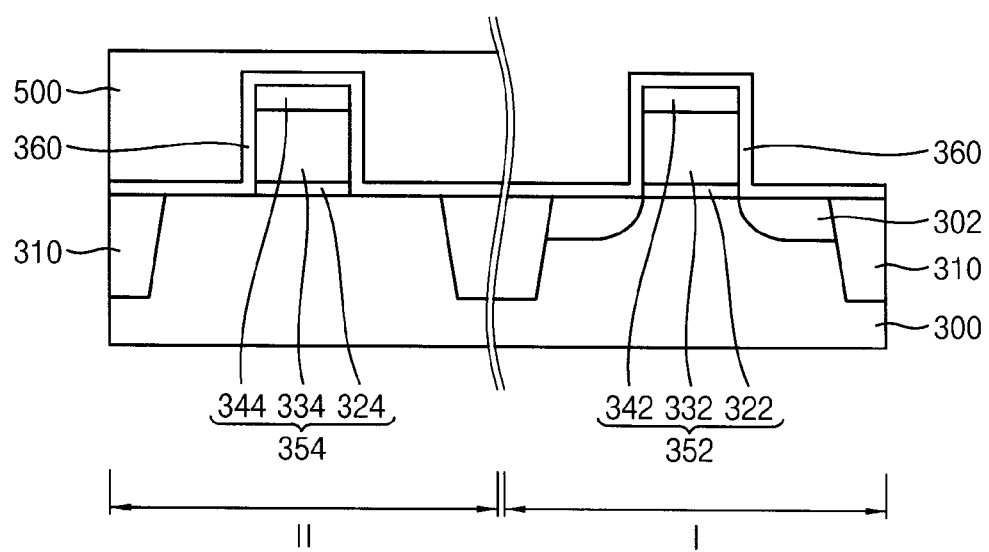

Referring to FIG. 18, a process similar to that illustrated in and described with reference to FIG. 3 may be performed.

More particularly, a first photoresist pattern 500 may be formed to cover the second region II of the substrate 300. Then, a first impurity region 302 may be formed at an upper portion of the substrate 300 left exposed by the first photoresist pattern 500 and the first dummy gate structure 352.

The first impurity region 302 may be formed to include impurities at a concentration lower than that of a first epitaxial layer 382 (refer to FIG. 25) subsequently formed, and thus may be referred to as a first lightly doped drain (LDD) region. In representative embodiments, the first impurity region 302 may be formed by doping an upper portion of the substrate 300 adjacent to the first dummy gate structure 352 in the first region I with p-type impurities.

The first photoresist pattern 500 may be removed by an ashing process and/or a stripping process, and the first spacer layer 360 may be oxidized in the ashing process and/or the stripping process. Thus, the first spacer layer 360 may include silicon oxynitride, for example.

Figure 19:
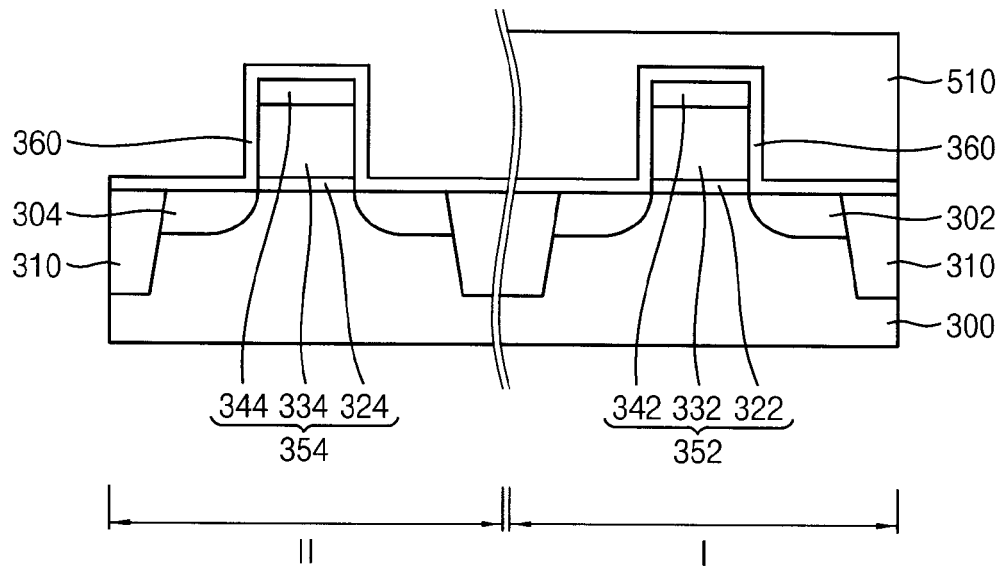

Referring to FIG. 19, a process similar to that illustrated in and described with reference to FIG. 18 may be performed.

More particularly, a second photoresist pattern 510 covering the first region I of the substrate 300. Then a second impurity region 304 may be formed at an upper portion of the substrate 300 left exposed by the second photoresist pattern 510 and the second dummy gate structure 354.

The second impurity region 304 may be formed to include impurities at a concentration lower than that of a second epitaxial layer 384 (refer to FIG. 27) subsequently formed, and thus may be referred to as a second lightly doped drain (LDD) region. In representative embodiments, the second impurity region 304 may be formed by doping an upper portion of the substrate 300 adjacent to the second dummy gate structure 354 in the second region II with n-type impurities.

The second photoresist pattern 510 may be removed by an ashing process and/or a stripping process, and the first spacer layer 360 may be also oxidized in the ashing process and/or the stripping process. Thus, the first spacer layer 360 may include silicon oxynitride, for example.

Figure 20:
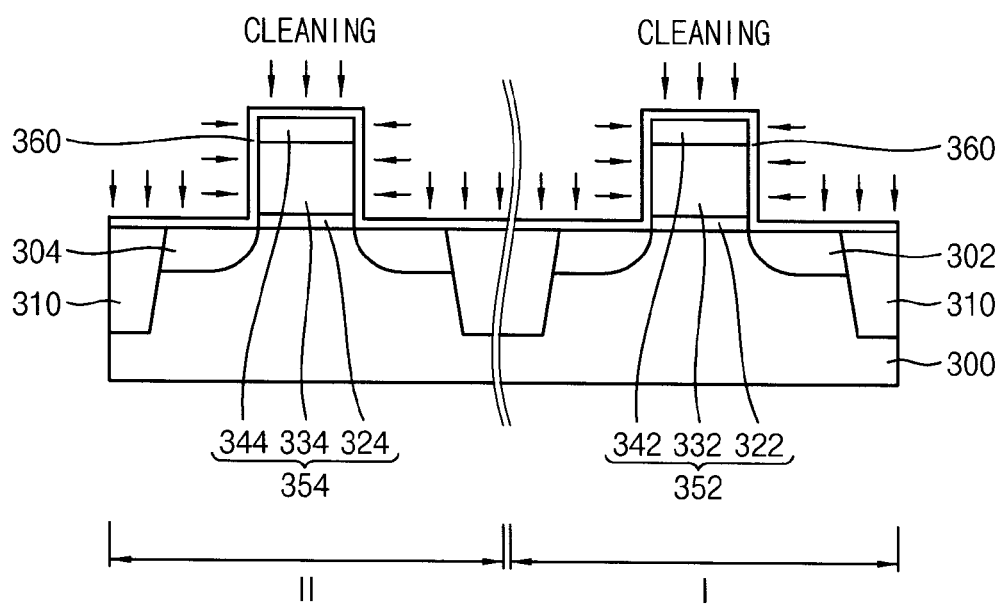

Referring to FIG. 20, a process similar to that illustrated in and described with reference to FIG. 4 may be performed. Thus, a first cleaning process may be performed on the first spacer layer 360.

The first cleaning process may include a dry cleaning using gaseous ammonia ($NH_3$) and/or nitrogen trifluoride ($NF_3$) plasma, or a wet cleaning using hydrogen fluoride (HF) and/or buffered oxide etch (BOE). Thus, mainly the surface of the first spacer layer 360 having a relatively high oxygen concentration may be removed, such that the thickness of the first spacer layer 360 is reduced. The first cleaning process may support a nitridation process substantially performed. In some embodiments, however, the first cleaning process may be omitted.

Figure 21:
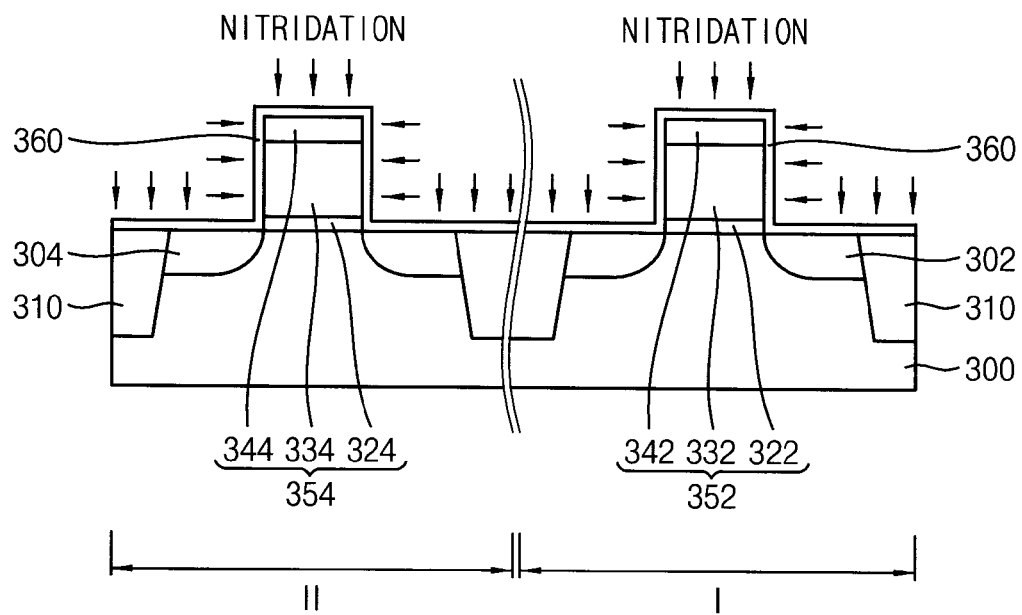

Referring to FIG. 21, a process similar to that illustrated in and described with reference to FIG. 5 may be performed. Thus, the nitridation process may be performed on the first spacer layer 360.

The nitridation process may be performed using gas comprising nitrogen ($N_2$) and/or ammonia ($NH_3$). Thus, the oxidized first spacer layer 360 may be nitridated, and the first spacer layer 360 may include silicon nitride, for example.

That is, the first spacer layer 360 may include a large amount of oxygen when the first and second photoresist patterns 500 and 510 are removed. However, the surface of the first spacer 360 having a relatively high oxygen concentration may be removed by the first cleaning process illustrated in a described with reference to FIG. 20, and the oxygen concentration of other portions of the first spacer layer 360 may be reduced by the nitridation process.

In some embodiments, the first cleaning process may be performed after the nitridation process.

Figure 22:
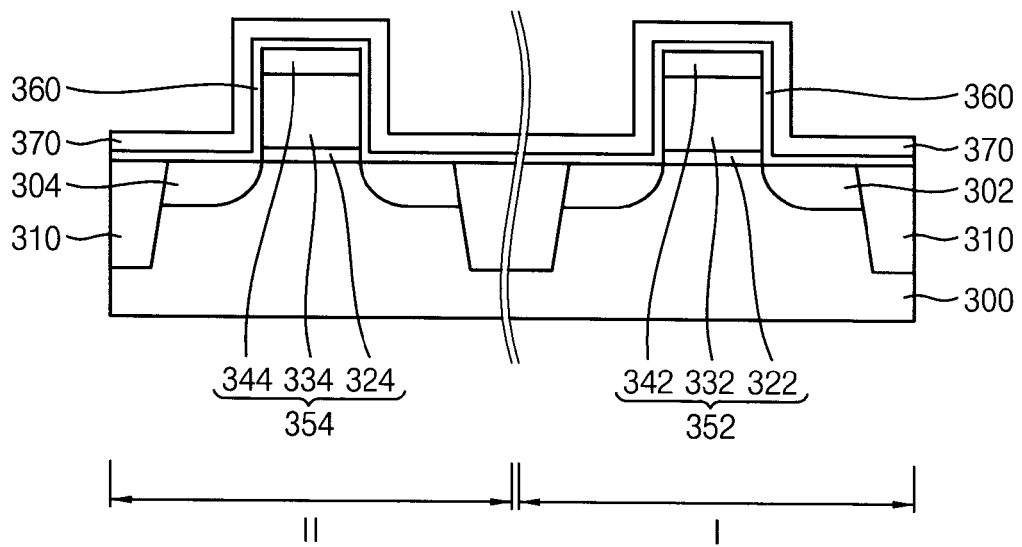

Referring to FIG. 22, a second spacer layer 370 may be formed on the first spacer layer 360.

In representative embodiments, the second spacer layer 370 may be formed to have a thickness greater than that of the first spacer layer 360, and may be formed to include silicon nitride or a low-k dielectric material, for example.

Figure 23:
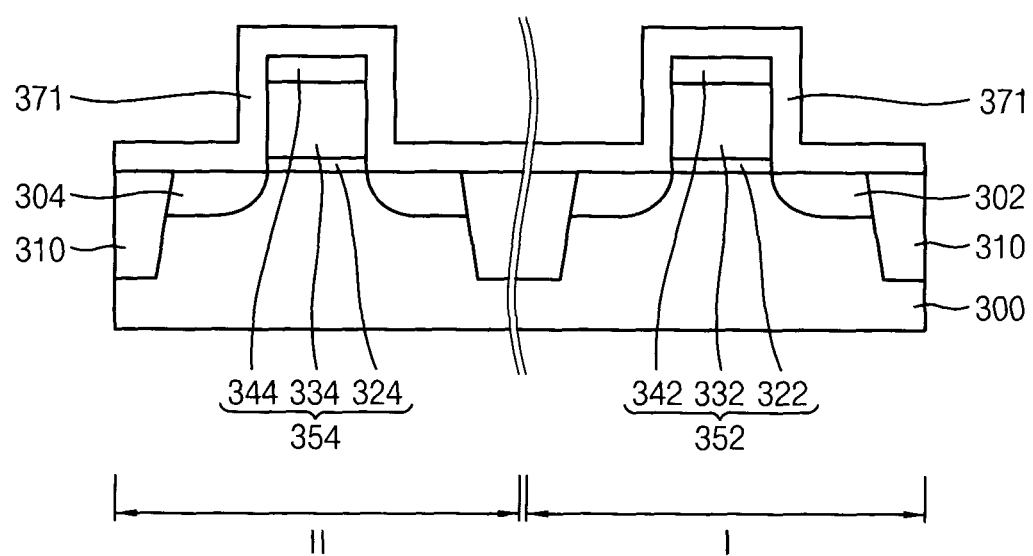

Alternatively, referring to FIG. 23, when the first spacer layer 360 is sufficiently nitridated by the first cleaning process and the nitridation process, and when the second spacer layer 370 is formed to include silicon nitride, the second spacer layer 370 a unitary spacer layer structure 371 may be formed.

Hereinafter, for ease of description, only the case in which the first and second spacer layers 360 and 370 are formed will be described hereinafter.

Figure 24:
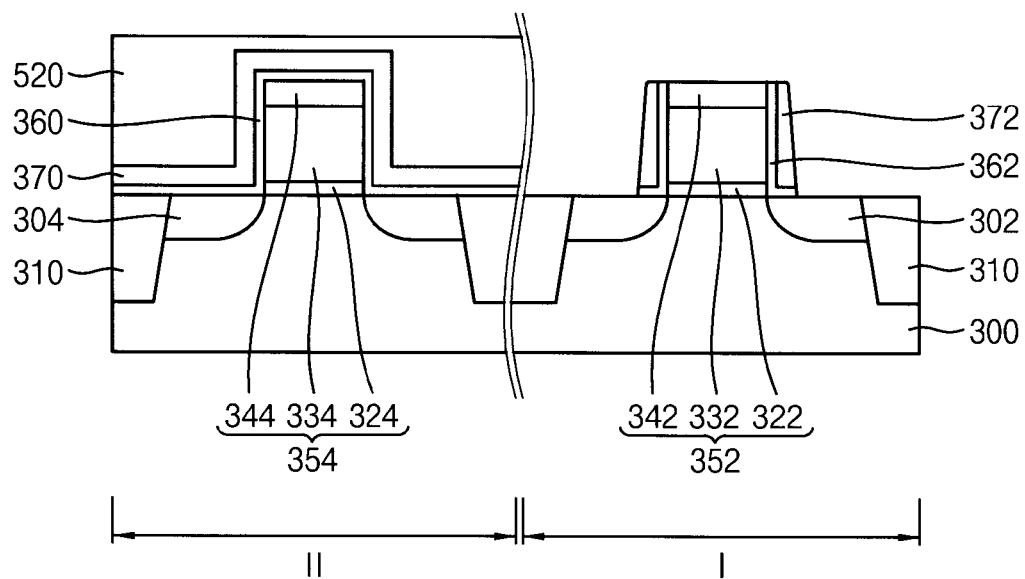

Referring to FIG. 24, a process similar to that illustrated in and described with reference to FIG. 6 may be performed.

More particularly, a third photoresist pattern 520 is formed to cover the second region II. Then the second spacer layer 370 and the first spacer layer 360 in the first region I of the substrate 300 may be sequentially etched to form a second spacer 372 and a first spacer 362, respectively.

In representative embodiments, each of the first and second spacers 362 and 372 may be formed on a sidewall of the first dummy gate structure 352, and the first spacer 362 may be formed to have an L-shaped cross section.

The first and second spacers 362 and 372 may overlap the first impurity region 302.

Figure 25:
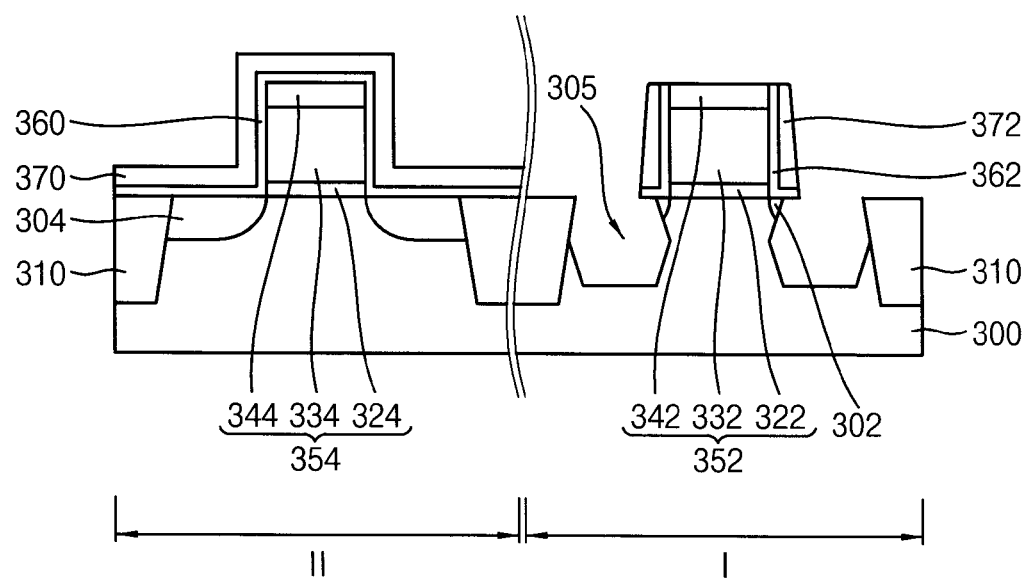

Referring to FIG. 25, a process similar to that illustrated in and described with reference to FIG. 8 may be performed.

More particularly, the third photoresist pattern 520 is removed. Then an upper portion of the active region of the substrate 300 adjacent to the first dummy gate structure 352 may be etched to form a first trench 305. Even though the third photoresist pattern 520 may be removed by an ashing process and/or a stripping process, the second spacer 372 may have a thickness greater than that of the first spacer 362 on which it is formed. Thus, the first spacer 362 may hardly be oxidized. Thus, after the third photoresist pattern 520 is removed, an additional nitridation process on the first spacer 362 may not be needed.

As the first trench 305 is formed, a portion of the first impurity region 302 may be removed, a portion of the first impurity region 302 may remain under the first and second spacers 362 and 372, and a bottom of the first spacer 362 may be partially exposed by the first trench 305. Even though the first trench 305 has a sigma-shaped profile in the figure, the first trench 305 may have other profiles instead including those mentioned earlier with respect to the first embodiment.

A second cleaning process may be performed, using a cleaning solution, e.g., ammonia hydroxide ($NH_4OH$), on an upper surface of the substrate 300 exposed by the first trench 305.

In representative embodiments, the first spacer 362 may have a reduced oxygen concentration due to the nitridation process and/or the first cleaning process, and thus may not be damaged by the second cleaning process. That is, no void may be generated in the first spacer 362 or the first dummy gate insulation layer pattern 322 adjacent thereto, or no portion or a very small portion of the first spacer 362 or the first dummy gate insulation layer pattern 322 thereto may be removed.

Figure 26:
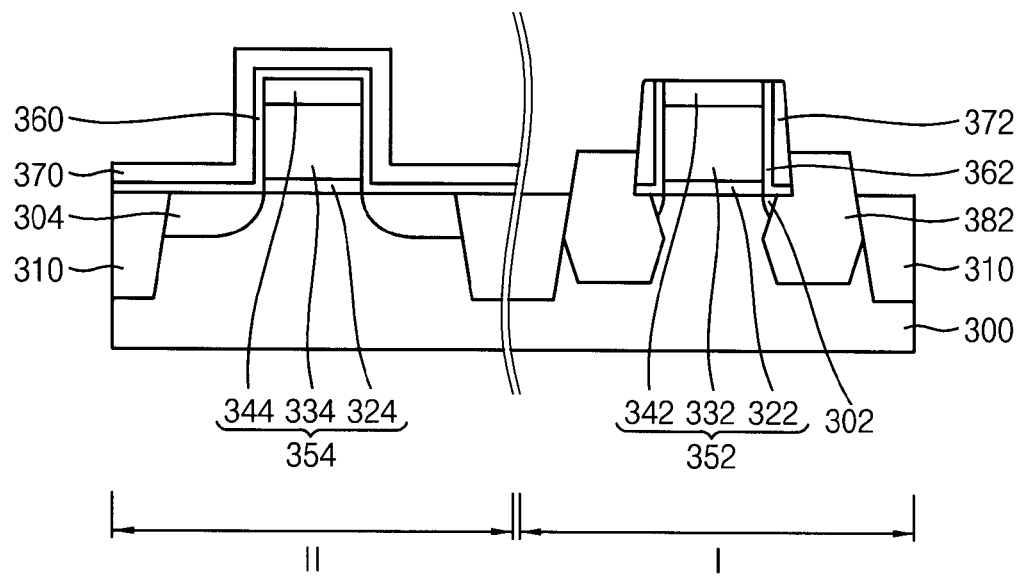

Referring to FIG. 26, a process similar to that illustrated in and described with reference to FIG. 9 may be performed. Thus, a first epitaxial layer 382 may be formed to fill the first trench 305, and a top surface of the first epitaxial layer 382 may contact the second spacer 372.

The first epitaxial layer 382 may be formed by a selective epitaxial growth (SEG) process using a silicon source gas, e.g., dichlorosilane ($SiH_2Cl_2$) and a germanium source gas, e.g., germane ($GeH_4$), to form a single crystalline silicon-germanium layer. In representative embodiments, a p-type impurity source gas, e.g., diborane ($B_2H_6$), may be also used to form a single crystalline silicon-germanium layer doped with p-type impurities. Thus, the first epitaxial layer 382 may serve as a source/drain region of a PMOS transistor.

Figure 27:
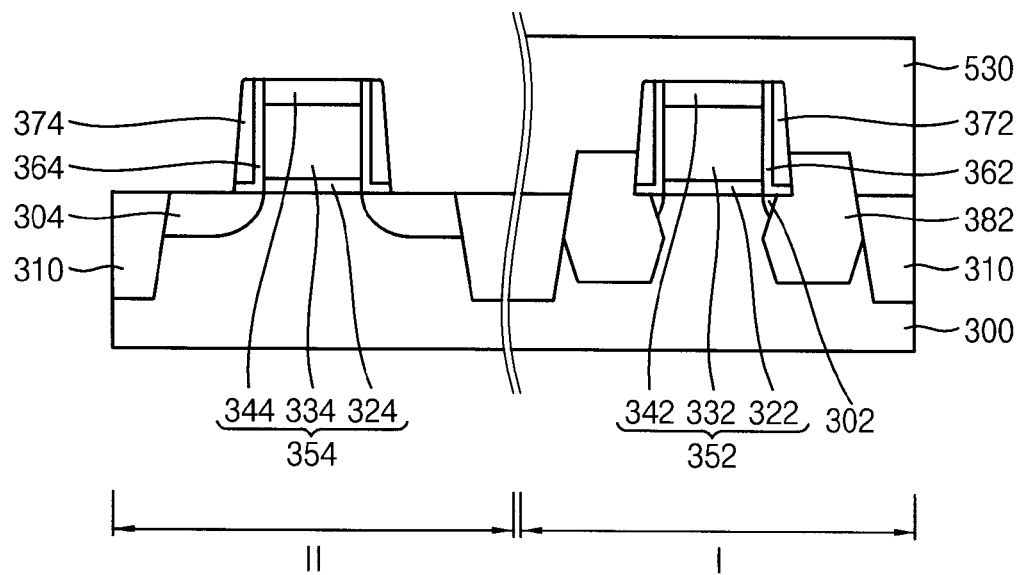

Referring to FIG. 27, a process similar to that illustrated in and described with reference to FIG. 24 may be performed.

More particularly, a fourth photoresist pattern 530 is formed to cover the first region I. Then the second spacer layer 370 and the first spacer layer 360 in the second region II of the substrate 300 may be sequentially etched to form a fourth spacer 374 and a third spacer 364, respectively.

In representative embodiments, each of the third and fourth spacers 364 and 374 may be formed on a sidewall of the second dummy gate structure 354, and the third spacer 364 may be formed to have an L-shaped cross section.

The third and fourth spacers 364 and 374 may overlap the second impurity region 304.

Figure 28:
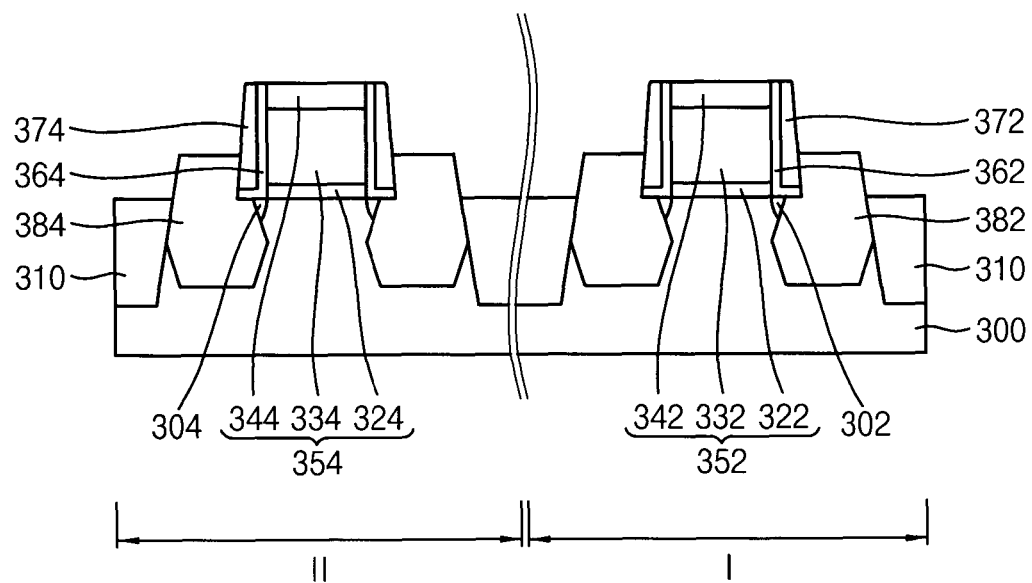

Referring to FIG. 28, processes similar to those illustrated in and described with reference to FIGS. 25 and 26 may be performed.

Thus, a second epitaxial layer 384 may be formed to fill the second trench (not shown), and a top surface of the second epitaxial layer 384 may contact the fourth spacer 374.

The second epitaxial layer 384 may be formed by an SEG process using a silicon source gas, e.g., disilane ($Si_2H_6$), and a carbon source gas, e.g., monomethylsilane ($SiH_3CH_3$), to form a single crystalline silicon carbide layer. In representative embodiments, an n-type impurity source gas, e.g., phosphine ($PH_3$), may be also used to form a single crystalline silicon carbide layer doped with n-type impurities. Thus, the second epitaxial layer 384 may serve as a source/drain region of an NMOS transistor.

Figure 29:
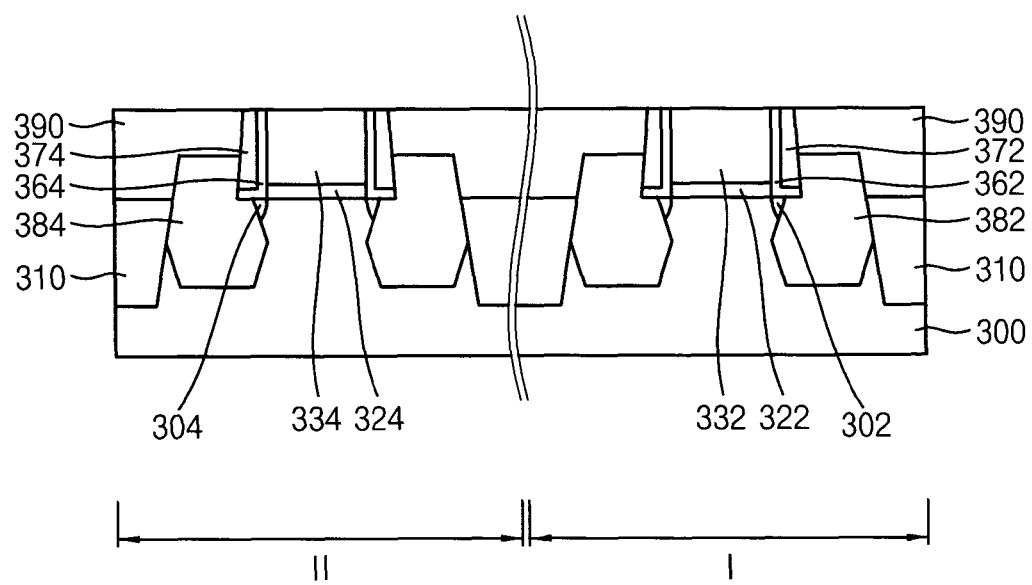

Referring to FIG. 29, a process similar to that illustrated in and described with reference to FIG. 10 may be performed.

Thus, a first insulating interlayer 390 may be formed to cover the first and second dummy gate structures 352 and 354, the first and second epitaxial layers 382 and 384, and the first to fourth spacers 362, 372, 364 and 374, and may be planarized until a top surface of the first and second dummy gate electrodes 332 and 334 is exposed. In the planarization process, the first and second hard masks 342 and 344 may be also removed, and upper portions of the first to fourth spacers 362, 372, 364 and 374 may be partially removed.

Figure 30:
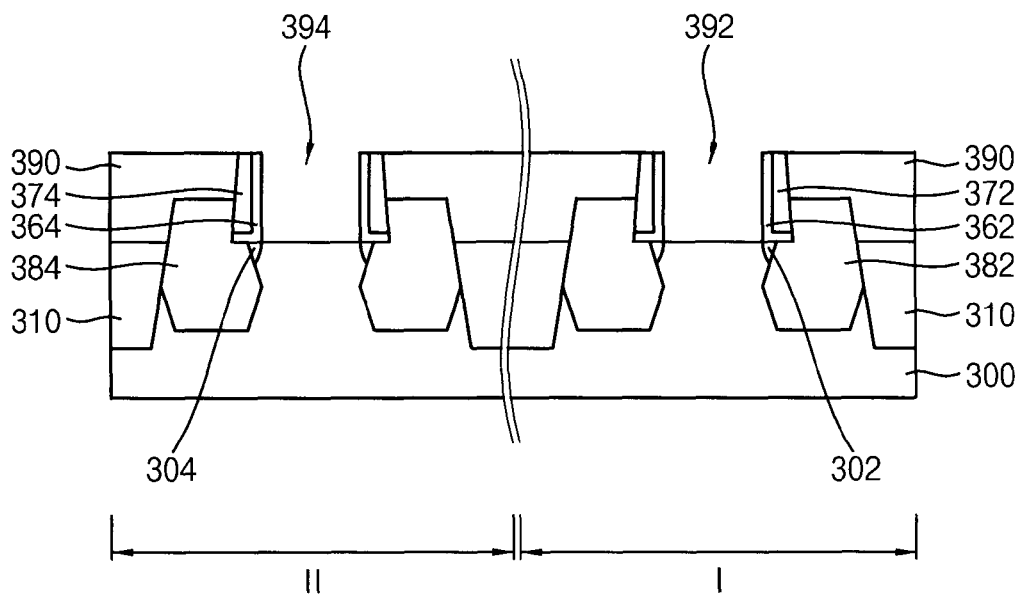

Referring to FIG. 30, a process similar to that illustrated in and described with reference to FIG. 11 may be performed.

Thus, the exposed first and second dummy gate electrodes 332 and 334, and the first and second dummy gate insulation layer patterns 322 and 324 under the first and second dummy gate electrodes 332 and 334 may be removed to form a first opening 392 exposing an inner sidewall of the first spacer 362 and a top surface of the active region of the substrate 300 in the first region I, and a second opening 394 exposing an inner sidewall of the third spacer 364 and a top surface of the active region of the substrate 300 in the second region II.

As described above, due to the nitridation process and/or the first cleaning process performed on the first spacer layer 360, a void is not produced in the first and third spacers 362 and 364 and the first and second dummy gate insulation layer patterns 322 and 324, or no portions thereof are removed. Thus, the top surfaces of the active regions of the substrate 300 exposed when the first and second openings 392 and 394 are formed may not be damaged. Thus, a silicon pitting phenomenon, in which the active region of the substrate 300 may be damaged during the formation of the first and second openings 392 and 394, may be prevented.

Figure 31:
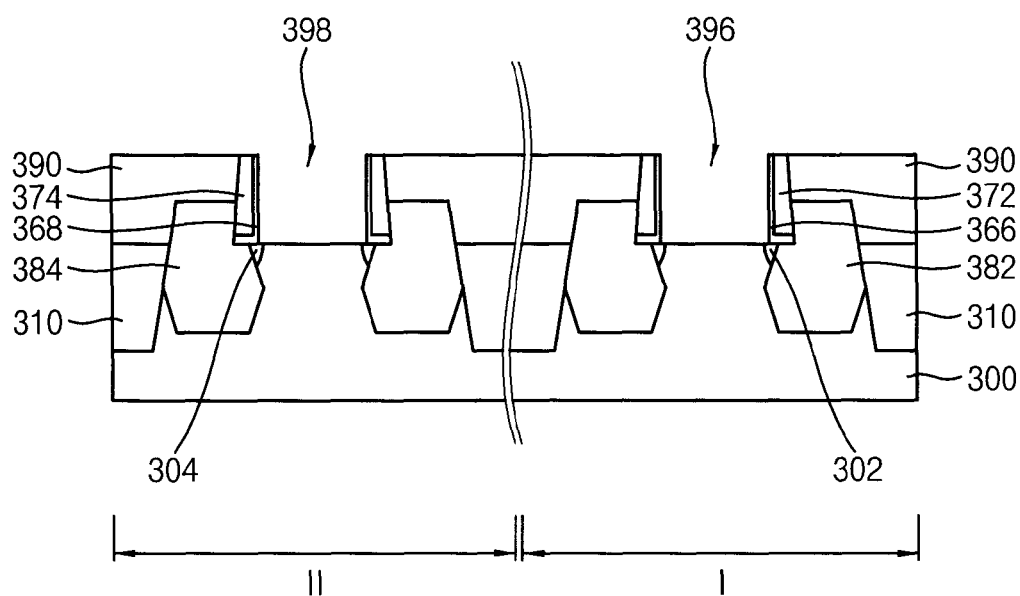

Referring to FIG. 31, a process similar to that illustrated in and described with reference to FIG. 12 may be performed.

Thus, the first and third spacers 362 and 364 exposed by the first and second openings 392 and 394, respectively, may be partially removed to form first and third spacer patterns 366 and 368, respectively, and thus the first and second openings 392 and 394 may be enlarged to form third and fourth openings 396 and 398, respectively.

The process for enlarging the first and second openings 392 and 394 to form the third and fourth openings 396 and 398, respectively, may be performed to produce the desired sizes (footprints) of first and second gate electrodes 422 and 424, respectively, (refer to FIG. 32) and thus, in some cases, may be omitted.

Figure 32:
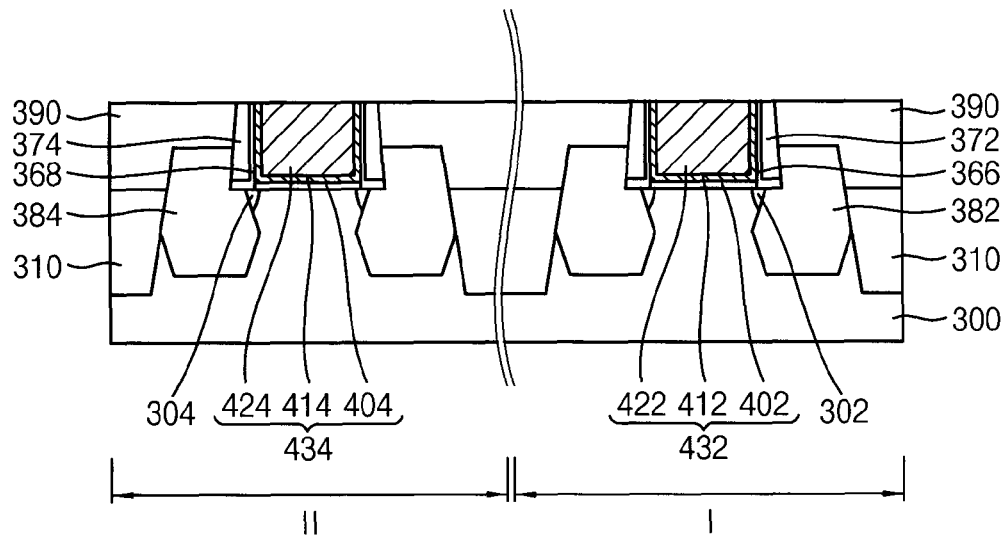

Referring to FIG. 32, a process similar to that illustrated in and described with reference to FIG. 13 may be performed.

Thus, first and second gate structures 432 and 434 may be formed to fill the third and fourth openings 396 and 398, respectively.

The first gate structure 432 may be formed to include a first gate insulation layer pattern 402, a first high-k dielectric layer pattern 412 and a first gate electrode 422 sequentially stacked, and the first gate structure 432 and the first epitaxial layer 382 may form a PMOS transistor. The second gate structure 434 may be formed to include a second gate insulation layer pattern 404, a second high-k dielectric layer pattern 414 and a second gate electrode 424 sequentially stacked, and the second gate structure 434 and the second epitaxial layer 384 may form an NMOS transistor.

Figure 33:
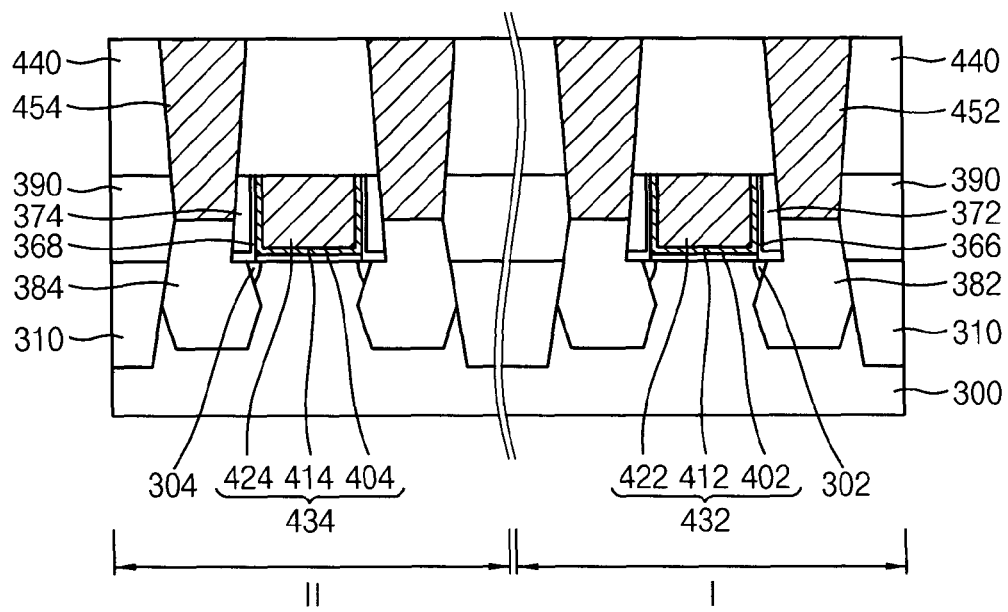

Referring to FIG. 33, a process similar to that illustrated in and described with reference to FIG. 14 may be performed.

Thus, a second insulating interlayer 440 may be formed on the first insulating interlayer 390, the first and second gate structures 432 and 434, the first and third spacer patterns 366 and 368, and the second and fourth spacers 372 and 374, and first and second contact plugs 452 and 454 may be formed through the first and second insulating interlayers 390 and 440 to contact top surfaces of the first and second epitaxial layers 382 and 384, respectively.

As described above, by performing the nitridation process on the first spacer layer 360, the oxidized first spacer layer 360 may have a reduced oxygen concentration. Thus, no void may be generated in the first and third spacers 362 and 364, or the first and second dummy gate insulation layer patterns 322 and 324 adjacent thereto during the second cleaning process for forming the first and second epitaxial layers 382 and 384. Accordingly, the active regions of the substrate 300 under the first and second gate electrodes 422 and 424 may not be damaged, and the semiconductor device may have good characteristics with no electrical shorts occurring.

The semiconductor device manufactured by the above processes may include the first gate structure 432 on the substrate 300 in the first region I, the first spacer pattern 366 and the second spacer 372 on the sidewall of the first gate structure 432, the first epitaxial layer 382 on the substrate 300 adjacent to the first gate structure 432, and the first contact plug 452 on the first epitaxial layer 382. The first gate structure 432 may include the first gate insulation layer pattern 402, the first high-k dielectric layer pattern 412 and the first gate electrode 422 sequentially stacked.

The semiconductor device may also include the second gate structure 434 on the substrate 300 in the second region II, the third spacer pattern 368 and the fourth spacer 374 on the sidewall of the second gate structure 434, the second epitaxial layer 384 on the substrate 300 adjacent to the second gate structure 434, and the second contact plug 454 on the second epitaxial layer 384. The second gate structure 434 may include the second gate insulation layer pattern 404, the second high-k dielectric layer pattern 414 and the second gate electrode 424 sequentially stacked.

Figure 34:
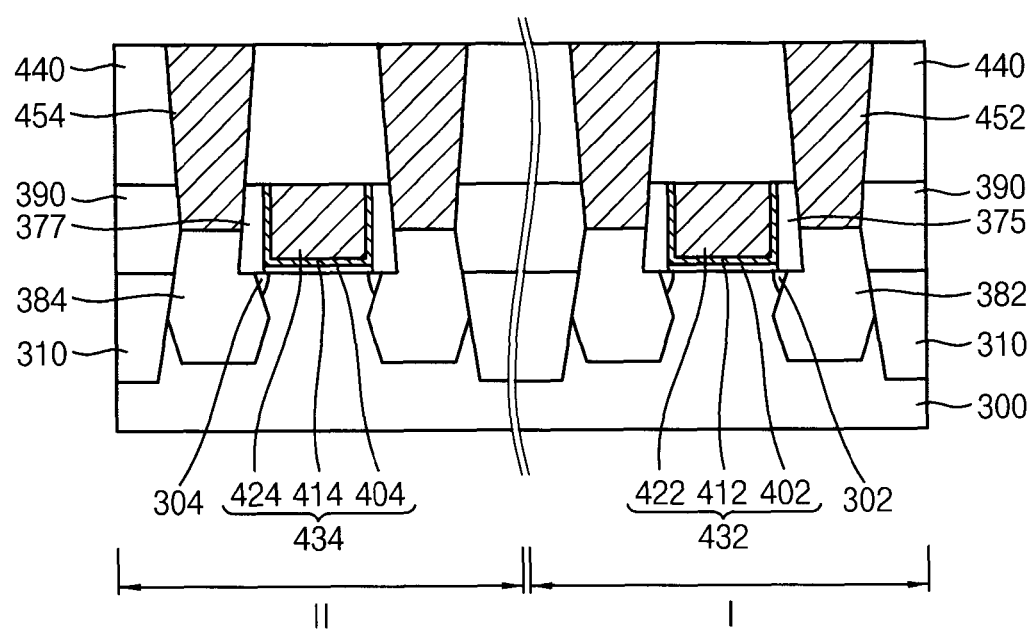

Alternatively, referring to FIG. 34, the semiconductor device may include first and second unitary spacer pattern structures 375 and 377 on the sidewalls of the first and second gate structures 432 and 434, respectively. That is, when the first spacer layer 360 is sufficiently nitridated by the first cleaning process and the nitridation process and when the second spacer layer 370 is formed to include silicon nitride, the unitary first spacer pattern structure 375 and the unitary second spacer pattern structure 377 may be formed.

FIGS. 35 to 67 illustrate representative embodiments of still another a method of manufacturing a semiconductor device in accordance with the inventive concept.

This method of manufacturing the semiconductor device of FIGS. 35 to 67 may be an application of the method of manufacturing the semiconductor device illustrated in and described with reference to FIGS. 17 to 34 to a method of manufacturing a fin-type field effect transistor (finFET). Thus, this method may include processes similar to those described in and illustrated in and described with reference to FIGS. 1 to 16 and FIGS. 17 to 34.

Figure 35:
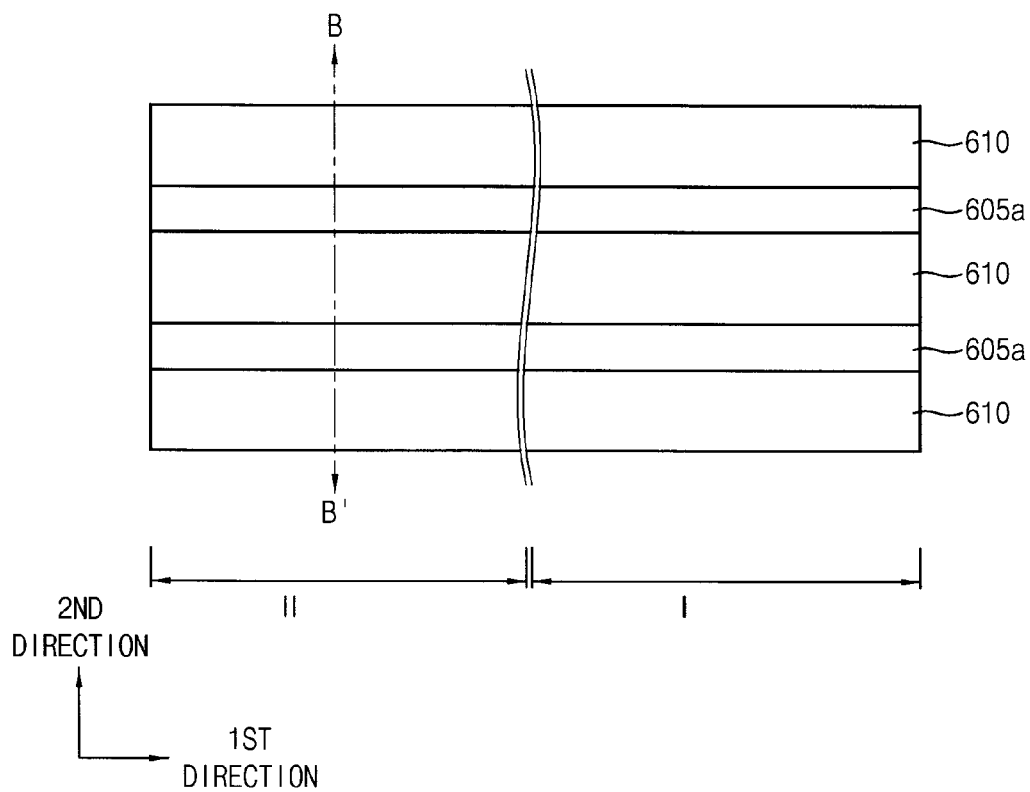
FIGS. 35 to 67 collectively illustrate still another representative embodiment of a method of manufacturing a semiconductor device in accordance with inventive concept, with FIGS. 35, 37, 47, 52, 55, 59, 61 and 63 each being a plan view of the device during a stage in its manufacture, FIGS. 38, 40, 41, 42, 43, 44, 45, 46, 48, 49, 51, 53, 56, 57, 60, 62, 64, 66 and 67 each being a cross-sectional view of the device during a stage in its manufacture, as taken along line A-A' of a corresponding plan view, FIG. 36 being a cross-sectional view of the device during a stage in its manufacture, as taken along line B-B' of a corresponding plan view, FIGS. 39 and 65 each being a cross-sectional view of the device during a stage in its manufacture, as taken along line D-D' of a corresponding plan view, and FIGS. 50, 54 and 58 being a cross-sectional view of the device during a stage in its manufacture, as take along line E-E' of a corresponding plan view.
Figure 36:
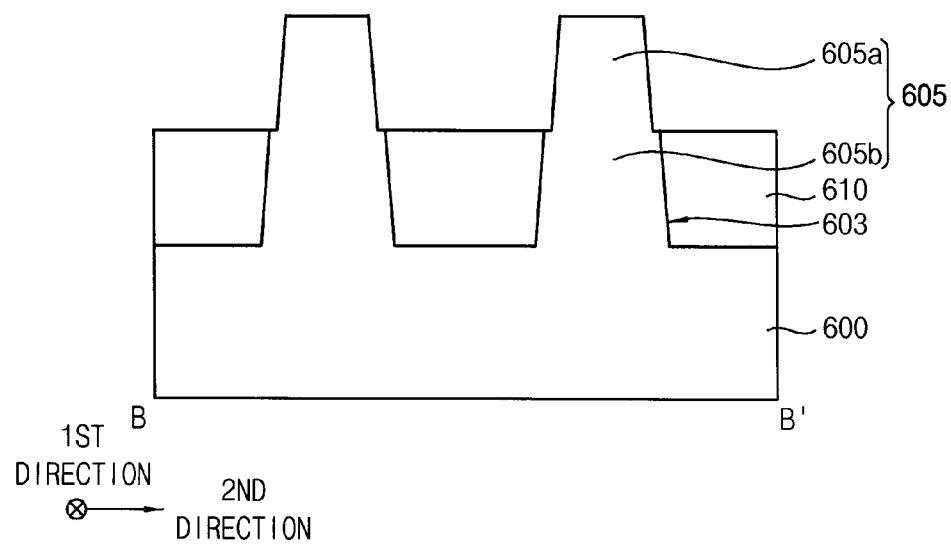

Referring to FIGS. 35 and 36, an upper portion of a substrate 600 may be etched to form a recess 603, and an isolation layer 610 may be formed on the substrate 600 to fill a lower portion of the recess 603.

The substrate 600 may include a first region I and a second region II. In representative embodiments, the first region I may be a PMOS region, and the second region II may be an NMOS region.

Before forming the recess 603, an ion implantation process may be performed to form a well region (not shown) in the substrate 600. In representative embodiments, the well region may be formed by implanting p-type impurities, e.g., boron, aluminum or the like. Alternatively, the well region may be formed by implanting n-type impurities, e.g., phosphorus, arsenic or the like.

In representative embodiments, the isolation layer 610 may be formed by forming an insulation layer on the substrate 600 to sufficiently fill the recess 603, planarizing the insulation layer until a top surface of the substrate 600 is exposed, and removing an upper portion of the insulation layer until an upper portion of the substrate 600 is exposed. When the upper portion of the insulation layer is removed, a portion of the substrate 600 adjacent thereto may be also removed, so that the substrate 600 may have a reduced thickness. The insulation layer may be formed to include an oxide, e.g., silicon oxide.

An active region and a field region may be defined in the substrate 600 by forming the isolation layer 610. A top surface of a field region may be covered by the isolation layer 610 and a top surface of the active region may be exposed by the isolation layer 610. The active region may protrude from the isolation layer 610 and have a fin-like shape so as to be referred to as an active fin 605. The active fin 605 may include a lower portion 605b whose sidewall may be covered by the isolation layer 610 and an upper portion 605a protruding from the isolation layer 610 and whose sidewall is exposed by the isolation layer 610.

In representative embodiments, the active fin 605 may extend in a first direction substantially parallel to the top surface of the substrate 600. More particularly, though, active fins 605 each extending lengthwise in the first direction and spaced from one another in a second direction substantially parallel to the top surface of the substrate 600 and at a given angle with respect to the first direction may be formed. In a representative embodiment, the second direction may form an angle of 90 degrees with respect to the first direction, and thus the first and second directions may be substantially perpendicular to each other.

Figure 37:
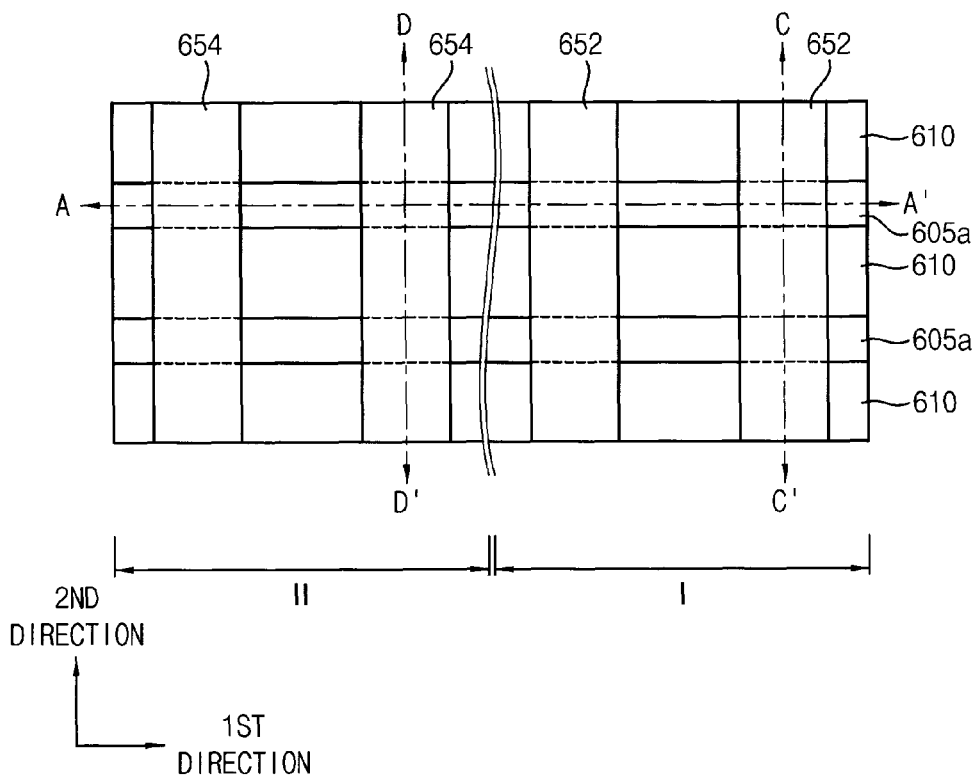
Figure 38:
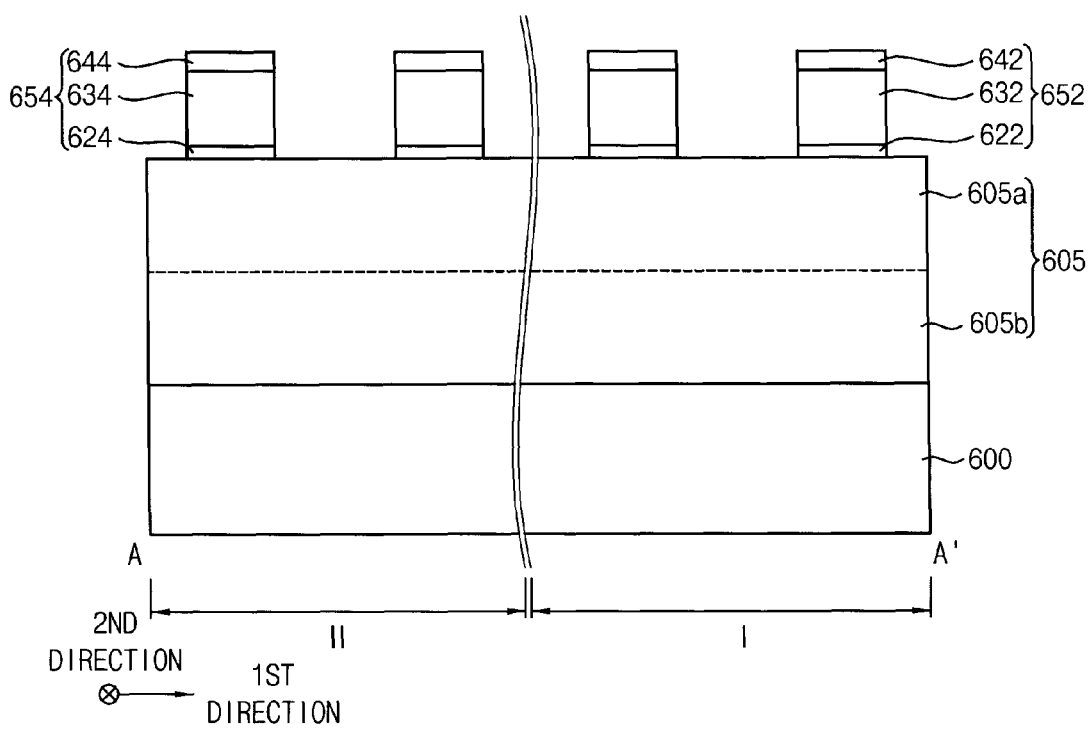
Figure 39:
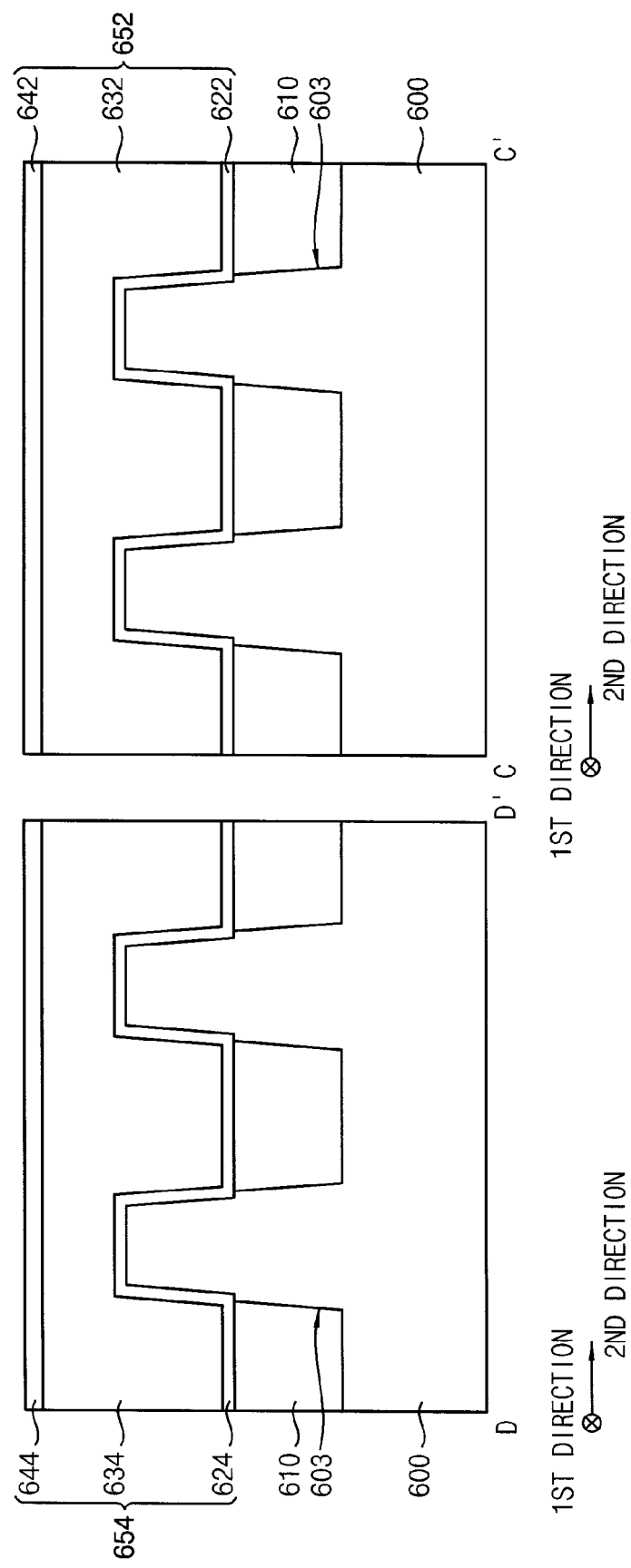

Referring to FIGS. 37 to 39, first and second dummy gate structures 652 and 654 may be formed on the substrate 600.

The first and second dummy gate structures 652 and 654 may be formed by sequentially forming a dummy gate insulation layer, a dummy gate electrode layer and a gate mask layer on the active fin 605 of the substrate 600 and the isolation layer 610, patterning the gate mask layer to form first and second gate masks 642 and 644 in the first and second regions I and II, respectively, and sequentially etching the dummy gate electrode layer and the dummy gate insulation layer using the first and second gate masks 642 and 644 as an etching mask.

Thus, the first dummy gate structure 652 may be formed to include a first dummy gate insulation layer pattern 622, a first dummy gate electrode 632 and a first gate mask 642 sequentially stacked on the substrate 600, and the second dummy gate structure 654 may be formed to include a second dummy gate insulation layer pattern 624, a second dummy gate electrode 634 and a second gate mask 644 sequentially stacked on the substrate 600.

The dummy gate insulation layer may be formed to include an oxide, e.g., silicon oxide, the dummy gate electrode layer may be formed to include polysilicon, for example, and the gate mask layer may be formed to include a nitride, e.g., silicon nitride. The dummy gate insulation layer, the dummy gate electrode layer and the gate mask layer may be formed by a chemical vapor deposition (CVD) process, an atomic layer deposition (ALD) process, or the like. Alternatively, the dummy gate insulation layer may be formed by a thermal oxidation process on an upper portion of the substrate 600.

In representative embodiments, the first dummy gate structures 652 may be formed on the substrate 600 to each extend in the second direction on the active fins 605 of the substrate 600 and the isolation layer 610, and the first dummy gate structures 652 may be spaced from one another in the first direction. Additionally, the second dummy gate structures 654 may be formed on the substrate 600 to each extend in the second direction on the active fins 605 of the substrate 600 and the isolation layer 610, and the second dummy gate structures 654 may be spaced from one another in the first direction.

Figure 40:
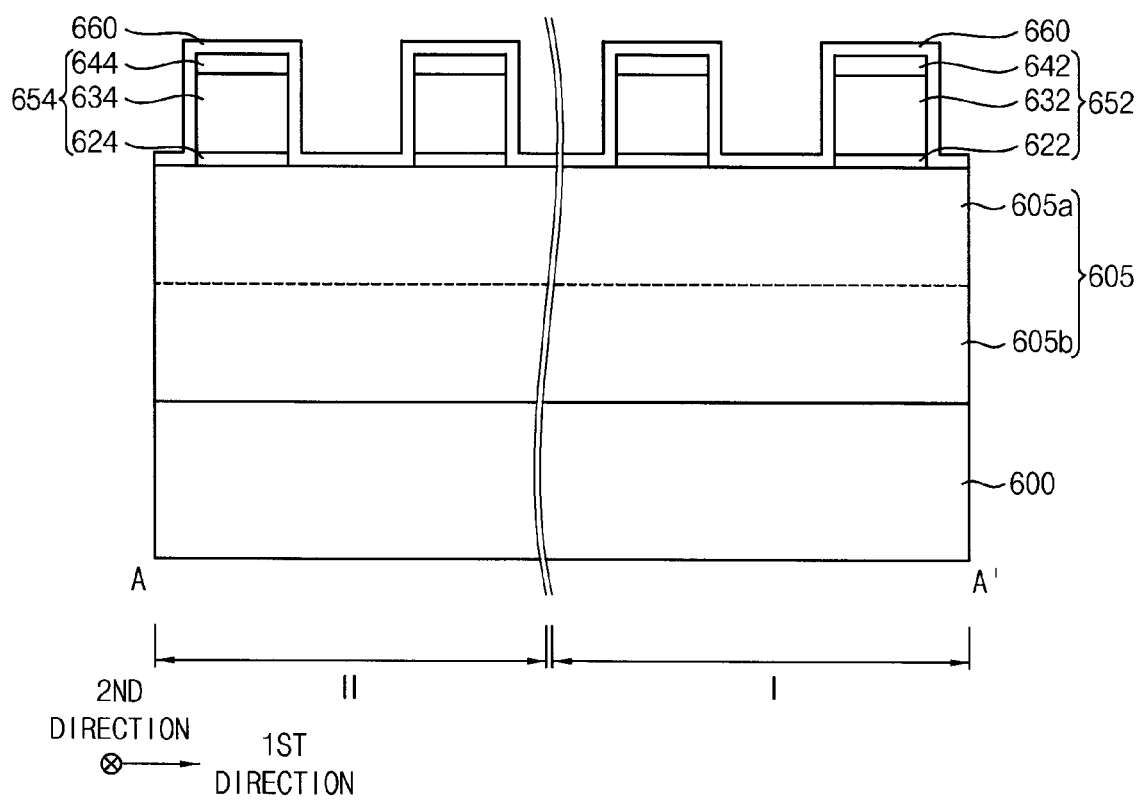

Referring to FIG. 40, a first spacer layer 660 may be formed on the active fin 605 of the substrate 600 and the isolation layer 610 to cover the first and second dummy gate structures 652 and 654.

The first spacer layer 660 may be formed to include a nitride, e.g., silicon nitride.

Figure 41:
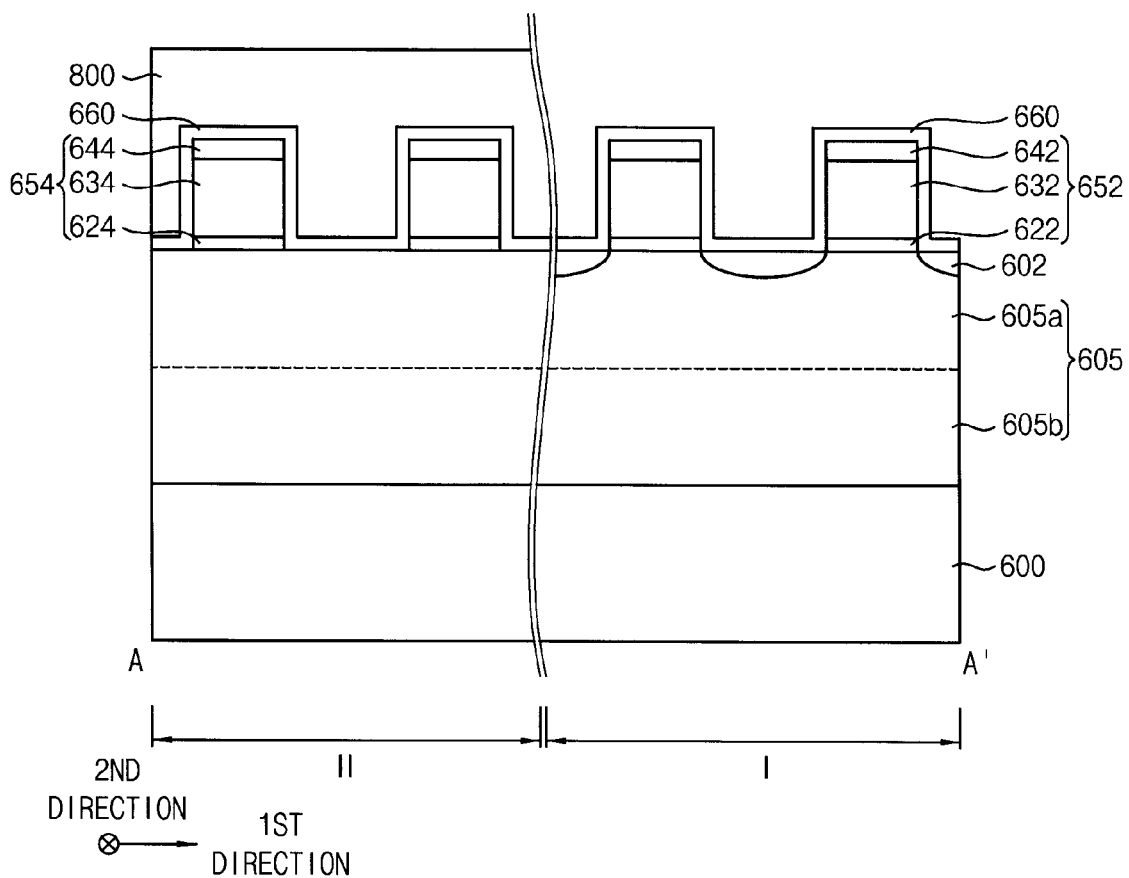

Referring to FIG. 41, a process similar to that illustrated in and described with reference to FIG. 18 may be performed.

Thus, after a first photoresist pattern 800 covering the second region II of the substrate 600 is formed, a first impurity region 602 may be formed at an upper portion of the substrate 600 exposed by the first photoresist pattern 800 and the first dummy gate structure 652.

The first impurity region 602 may be formed to include impurities at a concentration lower than that of a first epitaxial layer 682 (refer to FIGS. 53 and 54) subsequently formed, and thus may be referred to as a first lightly doped drain (LDD) region. In representative embodiments, the first impurity region 602 may be formed by doping an upper portion of the substrate 600 adjacent to the first dummy gate structure 652 in the first region I with p-type impurities.

The first photoresist pattern 800 may be removed by an ashing process and/or a stripping process, and the first spacer layer 660 may be oxidized. Thus, the first spacer layer 660 may include silicon oxynitride, for example.

Figure 42:
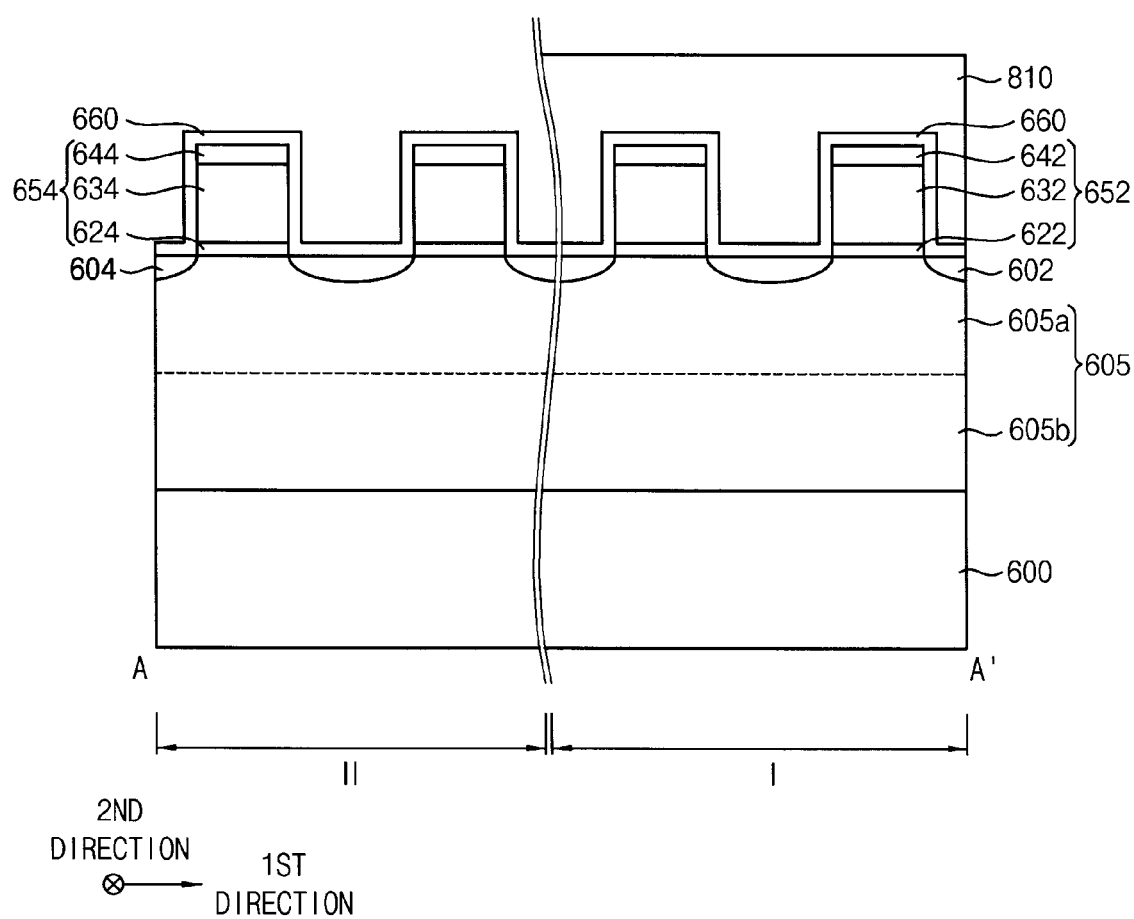

Referring to FIG. 42, a process similar to that illustrated in and described with reference to FIG. 19 may be performed.

Thus, after a second photoresist pattern 810 covering the first region I of the substrate 600 is formed, a second impurity region 604 may be formed at an upper portion of the substrate 600 exposed by the second photoresist pattern 810 and the second dummy gate structure 654.

The second impurity region 604 may be formed to include impurities at a concentration lower than that of a second epitaxial layer 684 (refer to FIGS. 57 and 58) subsequently formed, and thus may be referred to as a second lightly doped drain (LDD) region. In representative embodiments, the second impurity region 604 may be formed by doping an upper portion of the substrate 600 adjacent to the second dummy gate structure 654 in the second region II with n-type impurities.

The second photoresist pattern 810 may be removed by an ashing process and/or a stripping process, and the first spacer layer 660 may be also oxidized. Thus, the first spacer layer 660 may include silicon oxynitride, for example.

Figure 43:
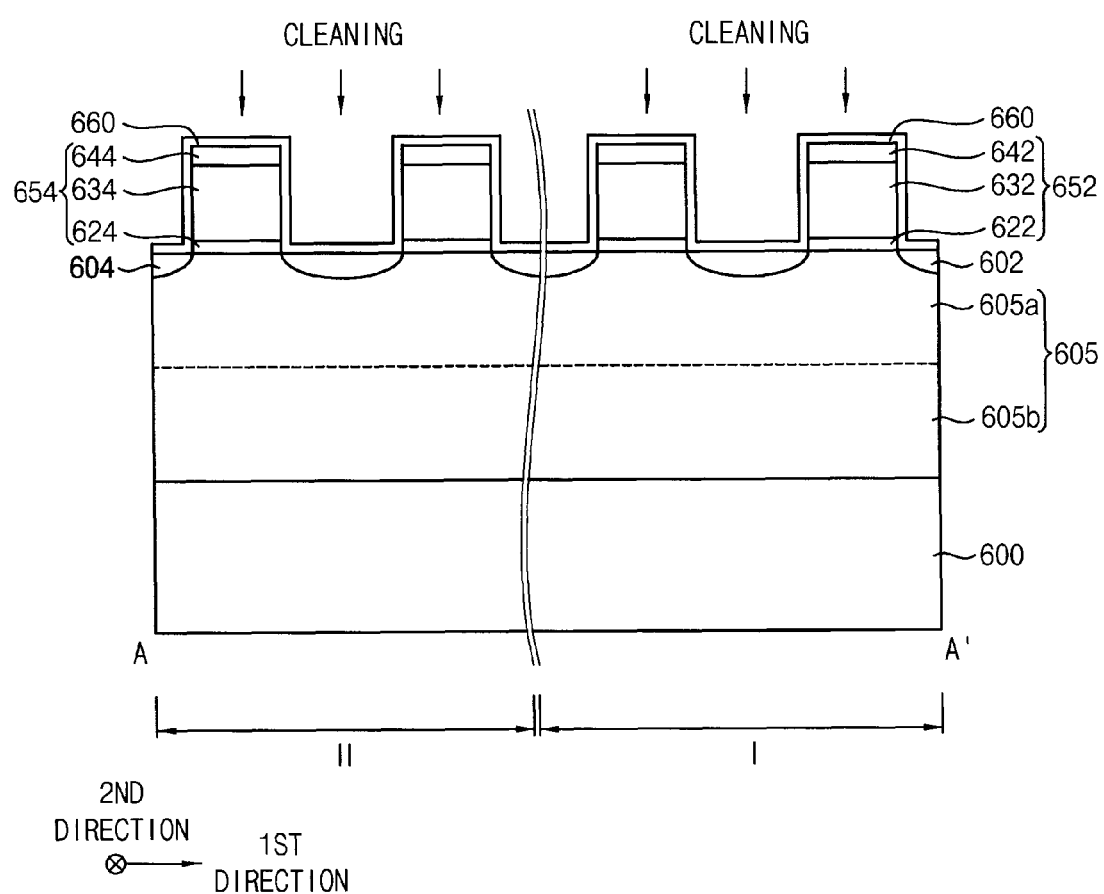

Referring to FIG. 43, a process similar to that illustrated in and described with reference to FIG. 20 may be performed. Thus, a first cleaning process may be performed on the first spacer layer 660.

The first cleaning process may mainly remove a surface portion of the first spacer layer 660 having a relatively high oxygen concentration, such that the thickness of the first spacer layer 660 is decreased. The first cleaning process may support a subsequently performed nitridation process. In some embodiments, however, the first cleaning process may be omitted.

Figure 44:
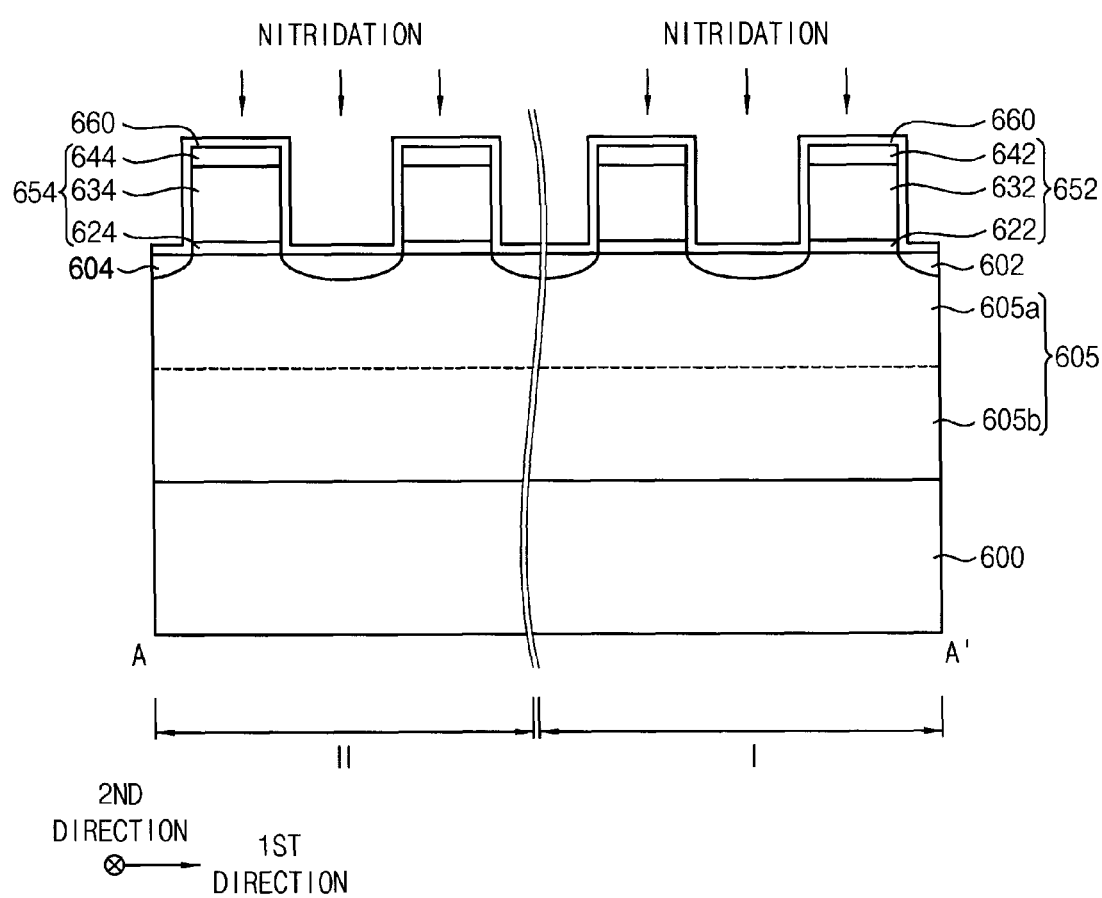

Referring to FIG. 44, a process similar to that illustrated in and described with reference to FIG. 21 may be performed. Thus, the nitridation process may be performed on the first spacer layer 660.

As a result, the first spacer layer 660 may include silicon nitride, for example.

That is, the first spacer layer 660 may include a large amount of oxygen when the first and second photoresist patterns 800 and 810 are removed. However, the surface of the first spacer 660 having a relatively high oxygen concentration may be removed by the first cleaning process illustrated in and described with reference to FIG. 43, and the oxygen concentration of other portions of the first spacer layer 660 may be reduced by the nitridation process.

In some embodiments, the first cleaning process may be further performed after the nitridation process.

Figure 45:
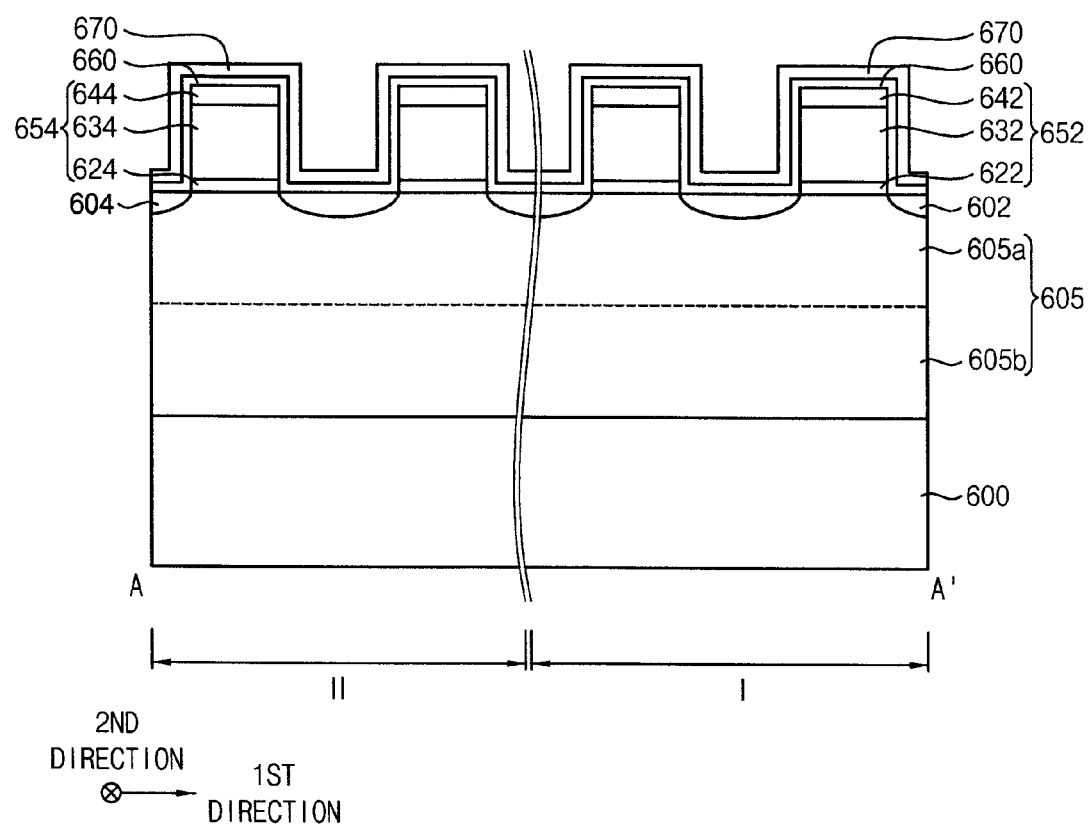

Referring to FIG. 45, a second spacer layer 670 may be formed on the first spacer layer 660.

In representative embodiments, the second spacer layer 670 may be formed to a thickness greater than that of the first spacer layer 660, and may be formed to include silicon nitride or a low-k dielectric material, for example.

Figure 46:
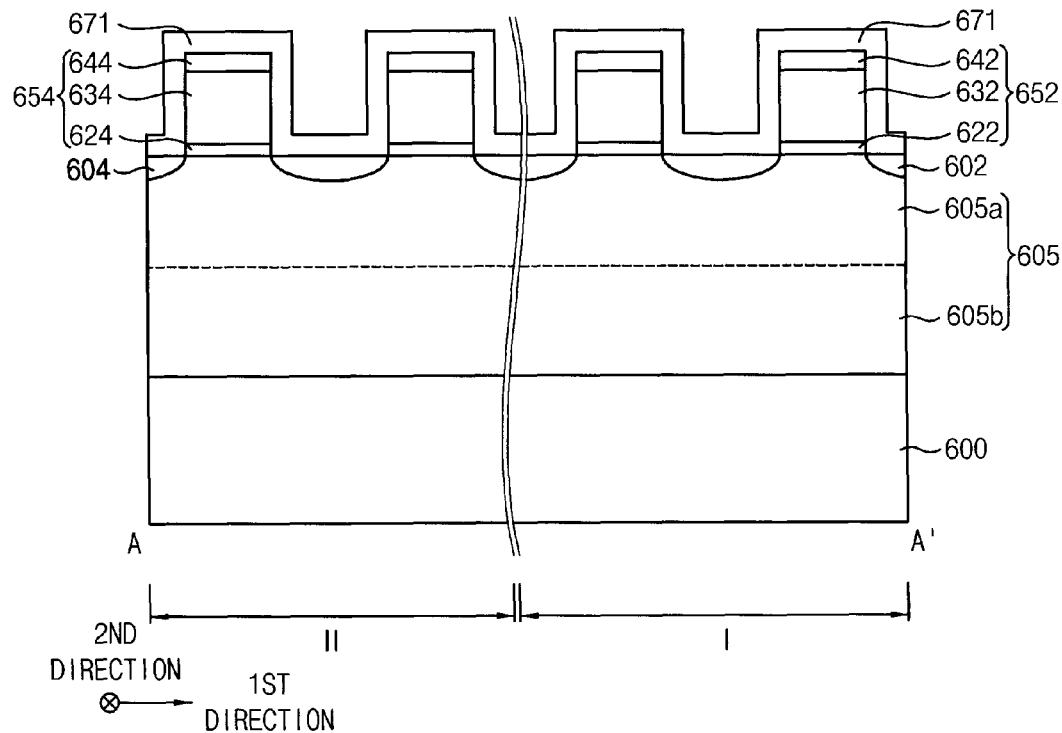

Alternatively, referring to FIG. 46, when the first spacer layer 660 is sufficiently nitridated by the first cleaning process and the nitridation process, and when the second spacer layer 670 is formed to include silicon nitride, a unitary spacer layer structure 671 may be formed.

Hereinafter, for ease of description, only the case in which the first and second spacer layers 660 and 670 are formed will be described.

Figure 47:
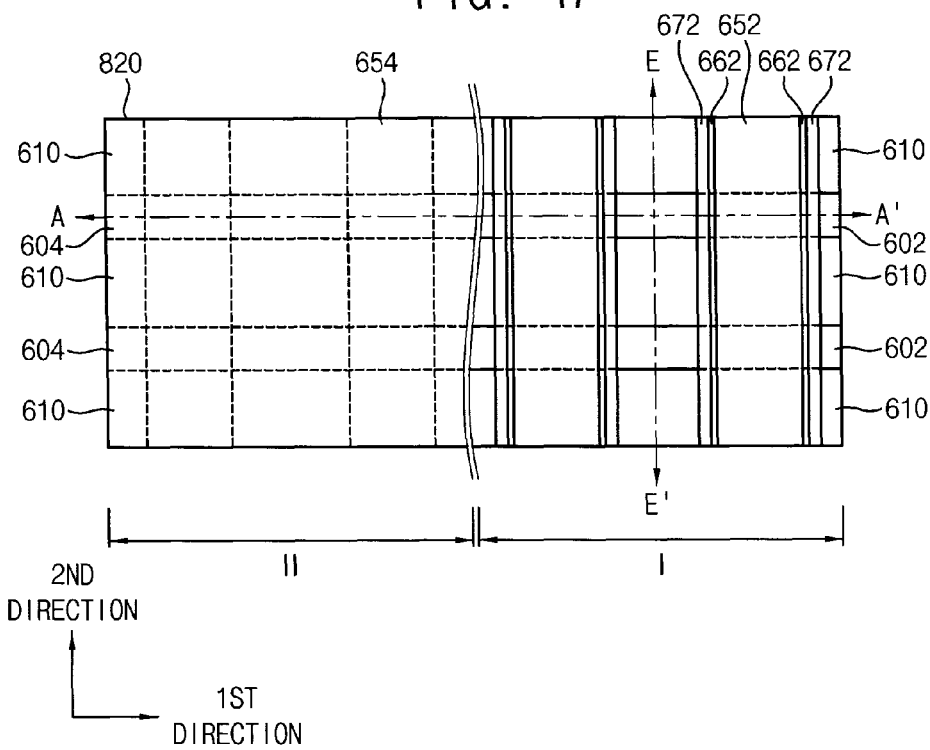
Figure 48:
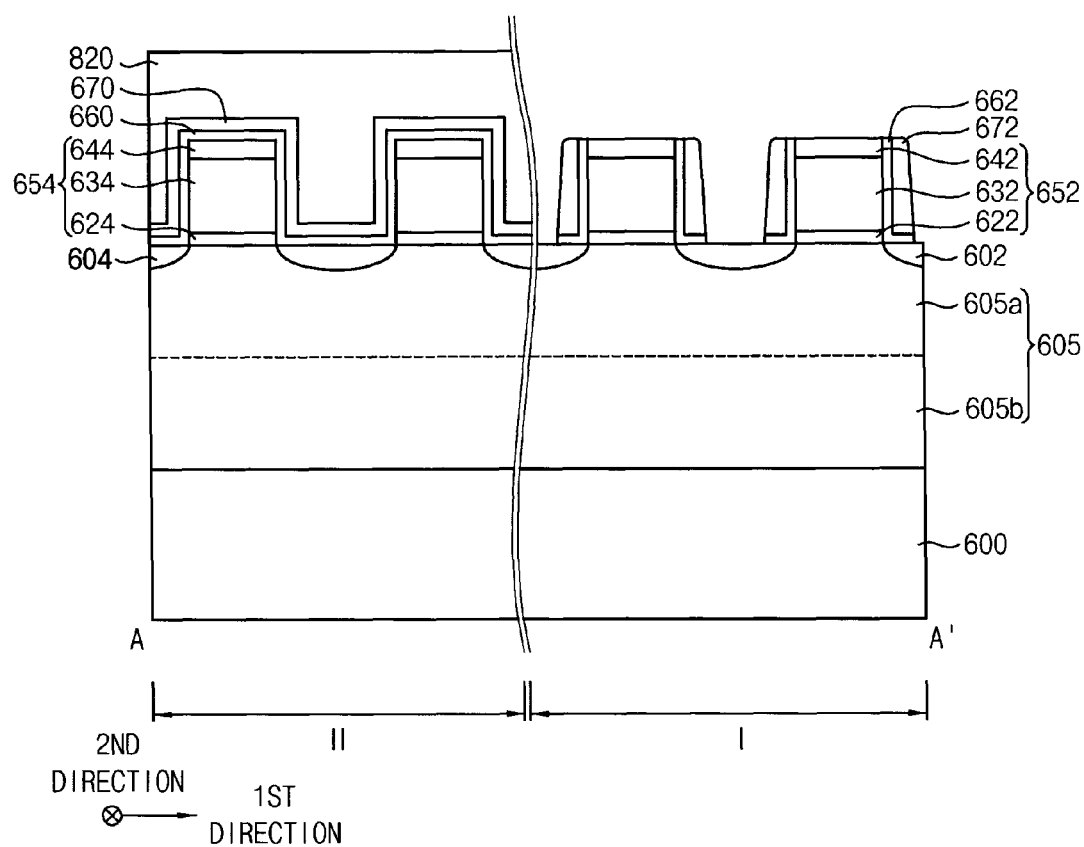

Referring to FIGS. 47 and 48, a process similar to that illustrated in and described with reference to FIG. 24 may be performed.

Thus, after a third photoresist pattern 820 is formed to cover the second region II, the second spacer layer 670 and the first spacer layer 660 in the first region I of the substrate 600 may be sequentially etched to form a second spacer 672 and a first spacer 662, respectively.

In representative embodiments, each of the first and second spacers 662 and 672 may be formed on a sidewall of the first dummy gate structure 652, and the first spacer 662 may be formed to have an L-shaped cross section.

The first and second spacers 662 and 672 may overlap the first impurity region 602.

Figure 49:
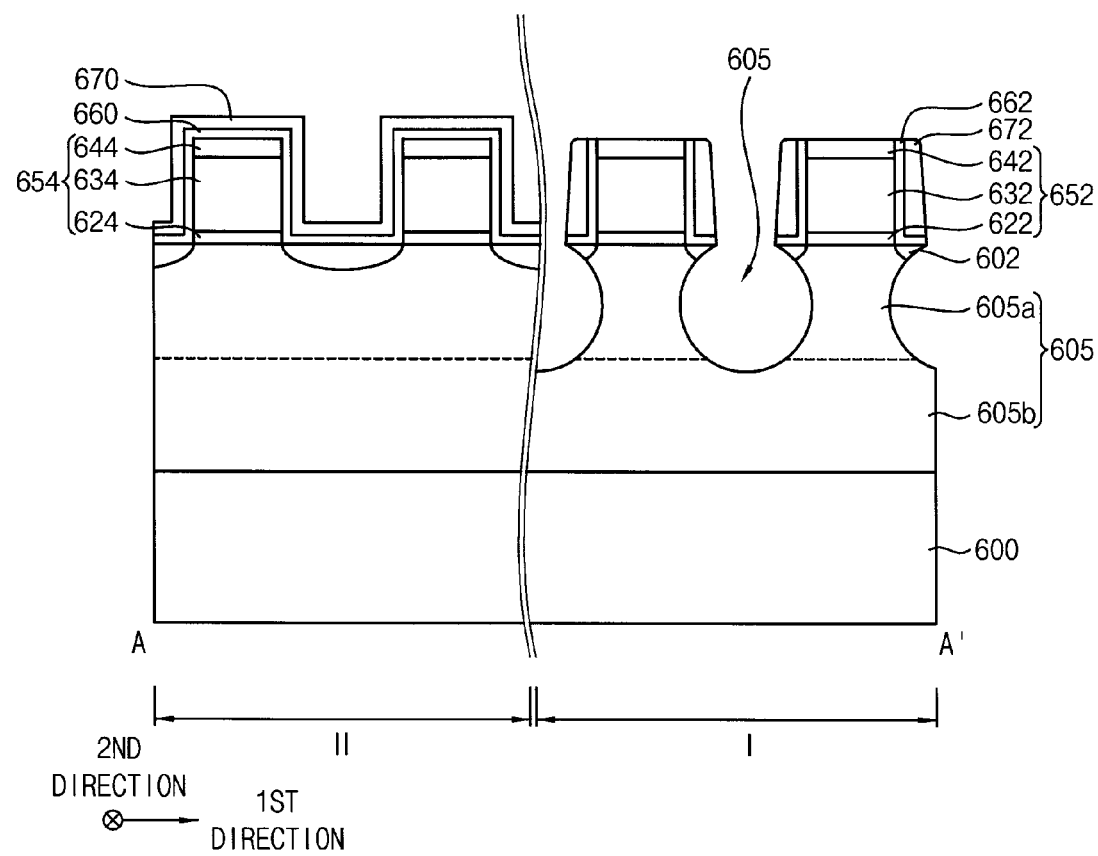
Figure 50:
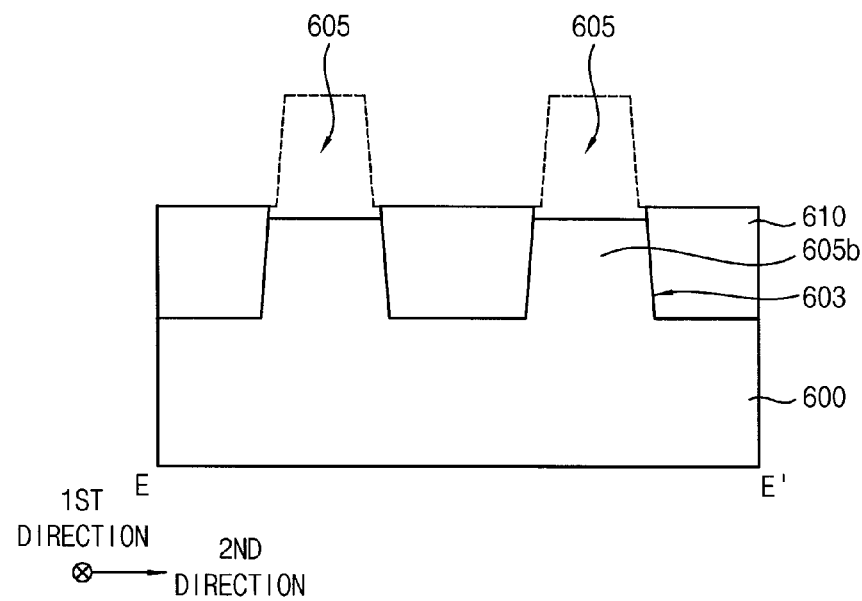

Referring to FIGS. 49 and 50, a process similar to that illustrated in and described with reference to FIG. 25 may be performed.

Thus, after the third photoresist pattern 820 is removed, an upper portion of the active fin 605 of the substrate 600 adjacent to the first dummy gate structure 652 may be etched to form a first trench 605c. The first trench 605c may be formed by etching through the upper portion 605a of the active fin 605 and part of the lower portion 605b of the active fin 605. Thus, a bottom of the first trench 605c may be formed at a level below the level of a top of the lower portion 605b of the active fin 605. In representative embodiments, the first trench 605 has rounded profile, e.g., the shape of a ball.

Figure 51:
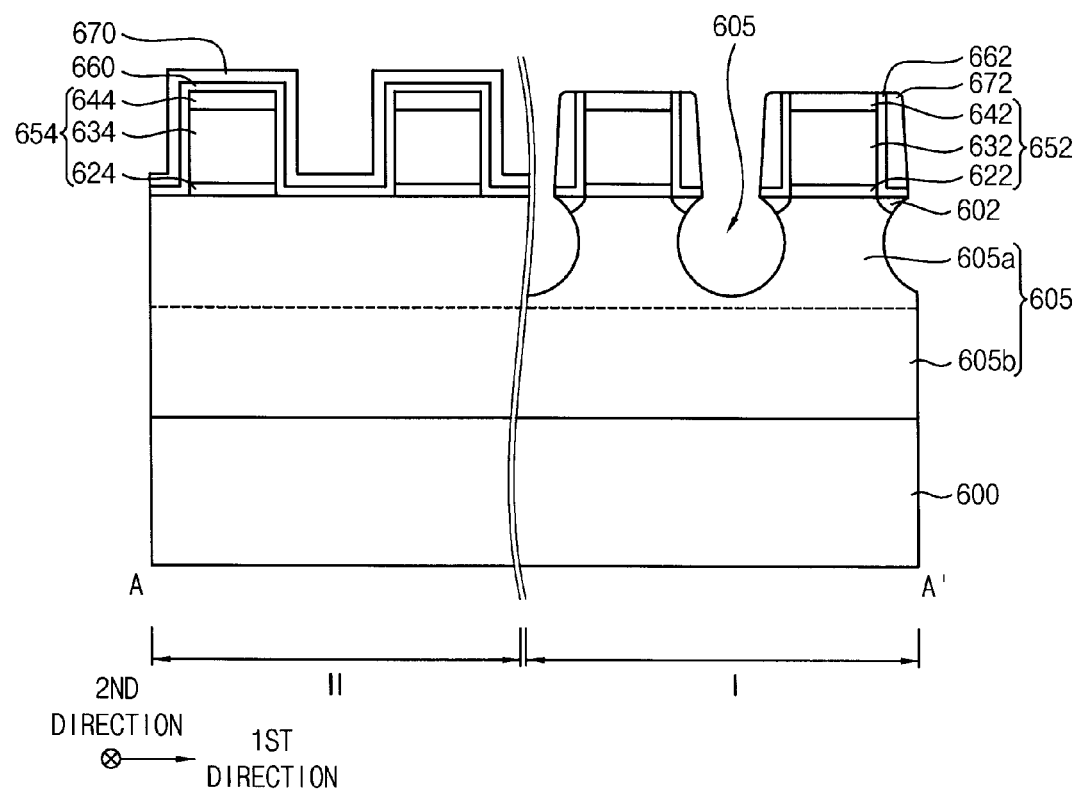

Alternatively, referring to FIG. 51, the first trench 605 may be formed by etching through only a portion of the upper portion 605a of the active fin 605. Thus a bottom of the first trench 605c may be formed at a level above that of the bottom of the upper portion 605a of the active fin 605.

Hereinafter, for ease of description, only the case in which the bottom of the first trench 605c is beneath the level of the top of the lower portion 605b of the active fin 605 will be described.

The etching process for forming the first trench 605c and the anisotropical etching process on the first and second spacer layers 660 and 670 illustrated in and described with reference to FIGS. 47 and 48 may be performed in-situ.

As the first trench 605c is formed, a portion of the first impurity region 602 may be removed, a portion of the first impurity region 602 under the first and second spacers 662 and 672 may remain, and a bottom of the first spacer 662 may be partially exposed by the first trench 605c.

A second cleaning process may be performed, using a cleaning solution, e.g., ammonia hydroxide ($NH_4OH$), on an upper surface of the substrate 600 exposed by the first trench 605c.

In representative embodiments, the first spacer 662 may have a reduced oxygen concentration due to the nitridation process and/or the first cleaning process, and thus may not be damaged by the second cleaning process. That is, a void may not be produced in the first spacer 662 or the first dummy gate insulation layer pattern 622 adjacent thereto, or no portion or a very small portion of the first spacer 662 or the first dummy gate insulation layer pattern 622 thereto may be removed.

Figure 52:
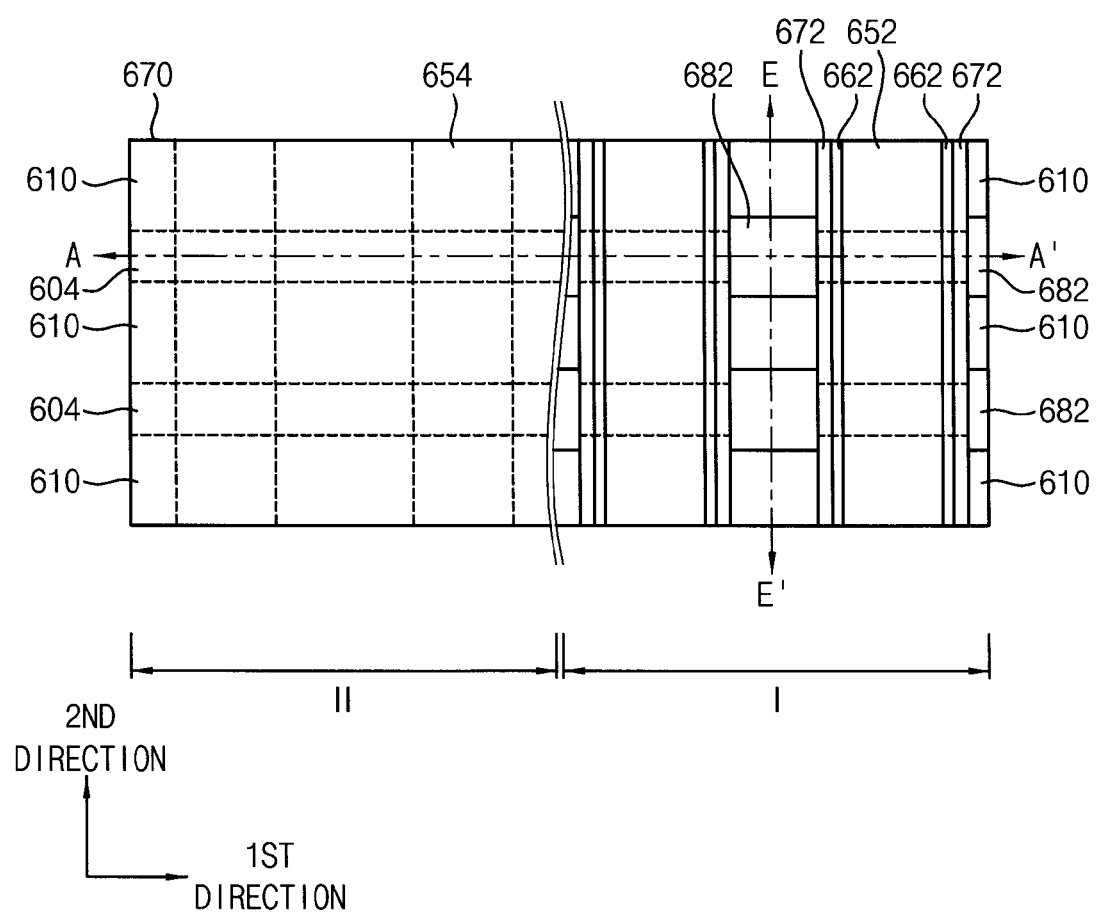
Figure 53:
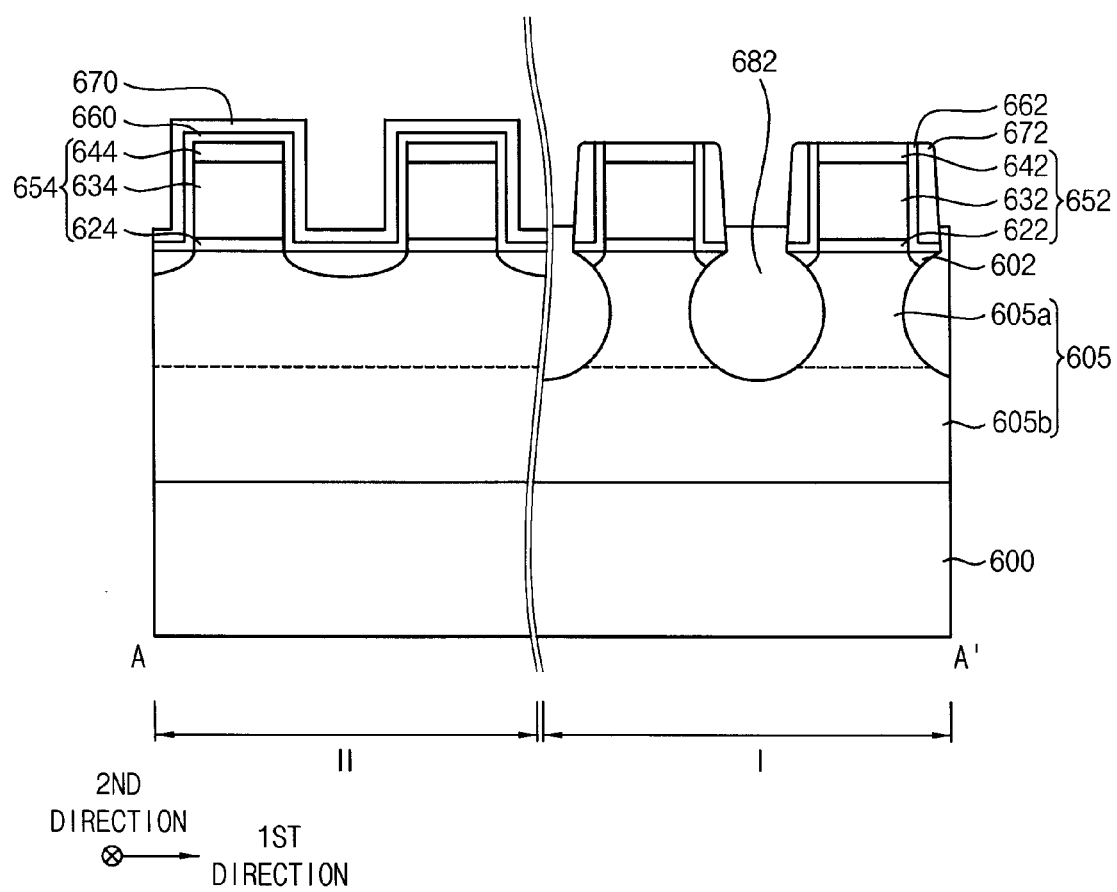
Figure 54:
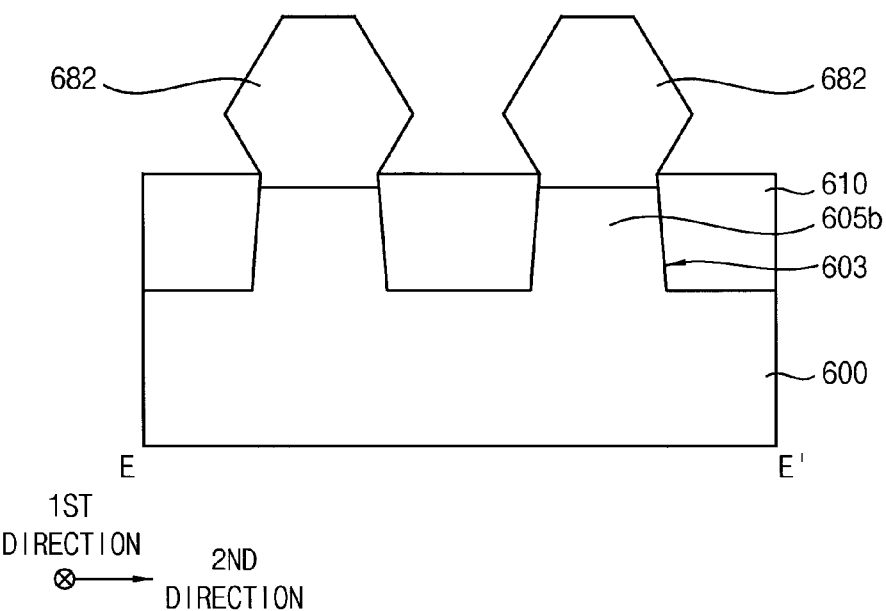

Referring to FIGS. 52 to 54, a process similar to that illustrated in and described with reference to FIG. 26 may be performed. Thus, a first epitaxial layer 682 may be formed to fill the first trench 605, and a top surface of the first epitaxial layer 682 may contact the second spacer 672.

The first epitaxial layer 682 may be formed by a selective epitaxial growth (SEG) process using a silicon source gas, e.g., dichlorosilane ($SiH_2Cl_2$) and a germanium source gas, e.g., germane ($GeH_4$), to form a single crystalline silicon-germanium layer. In representative embodiments, a p-type impurity source gas, e.g., diborane ($B_2H_6$), may be also used to form a single crystalline silicon-germanium layer doped with p-type impurities. Thus, the first epitaxial layer 682 may serve as a source/drain region of a PMOS transistor. In representative embodiments, the first epitaxial layer 682 may grow both in the vertical and horizontal directions, and an upper portion of the first epitaxial layer 682 may be formed to have a cross section, as taken in a vertical plane extending the second direction, in the shape of a pentagon or hexagon.

Figure 55:
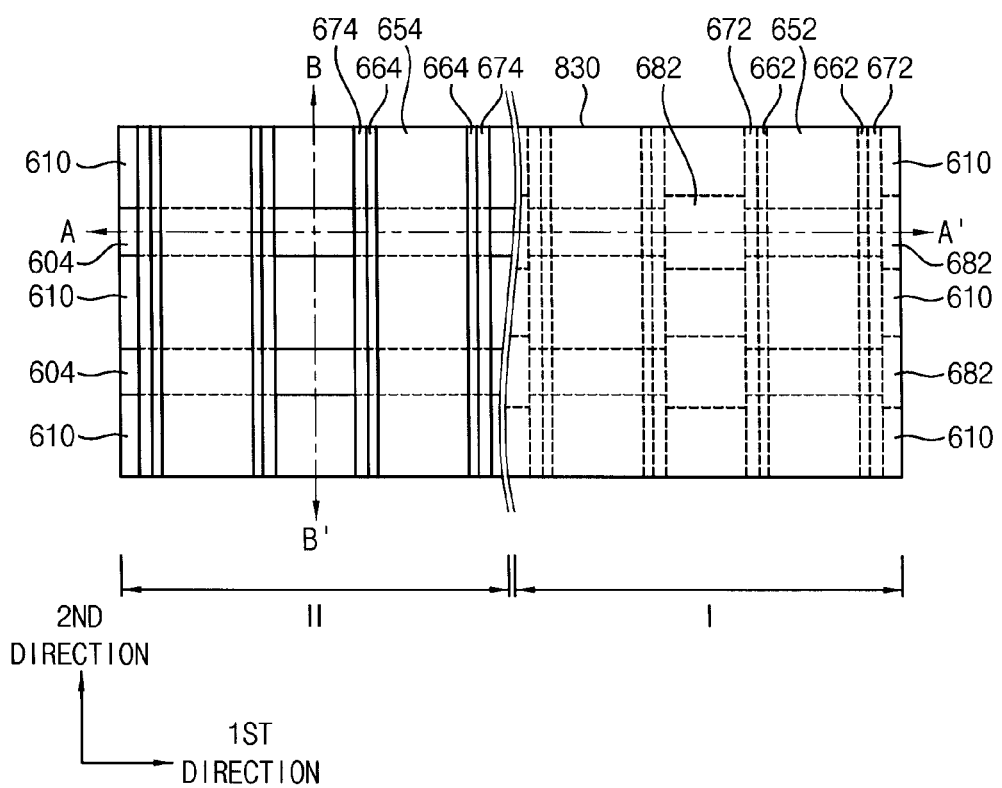
Figure 56:
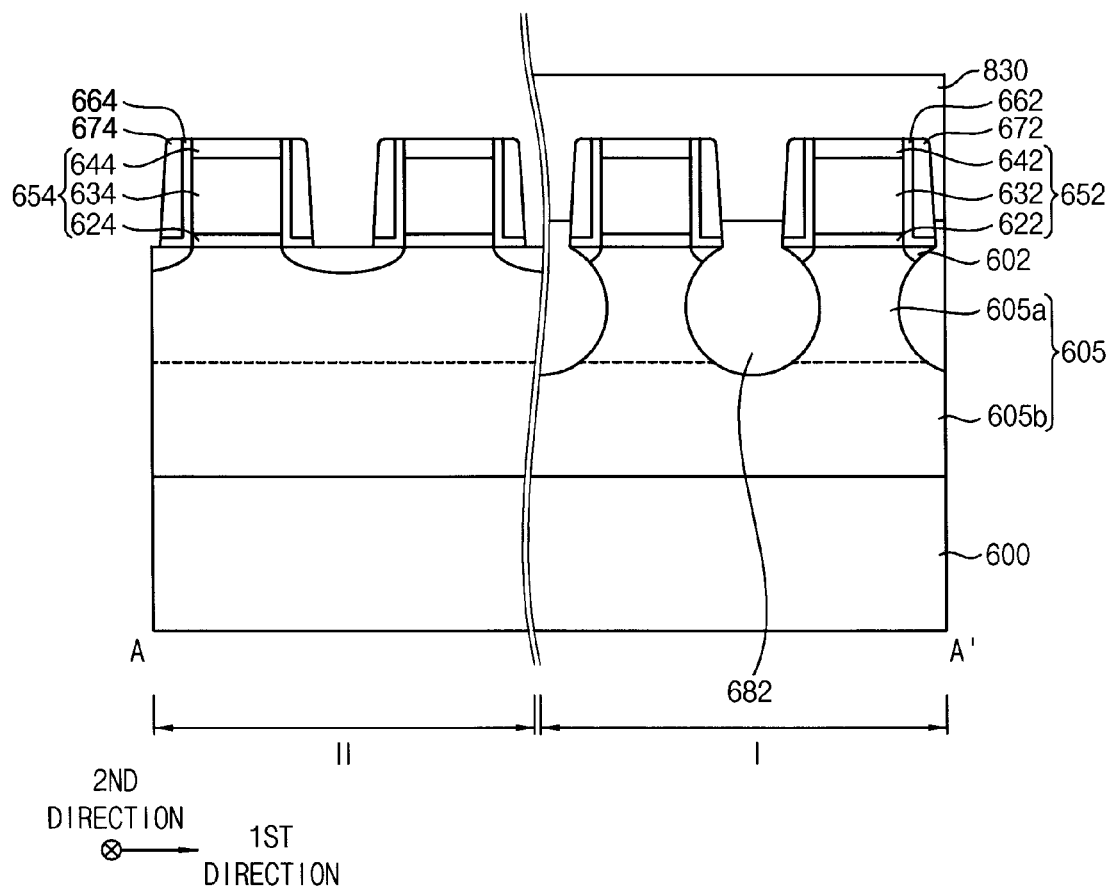

Referring to FIGS. 55 and 56, a process similar to that illustrated in and described with reference to FIG. 27 may be performed.

Thus, after a fourth photoresist pattern 830 is formed to cover the first region I, the second spacer layer 670 and the first spacer layer 660 in the second region II of the substrate 600 may be sequentially etched to form a fourth spacer 674 and a third spacer 664, respectively.

In representative embodiments, each of the third and fourth spacers 664 and 674 may be formed on a sidewall of the second dummy gate structure 654, and the third spacer 664 may be formed to have an L-shaped cross section.

The third and fourth spacers 664 and 674 may overlap the second impurity region 604.

Figure 57:
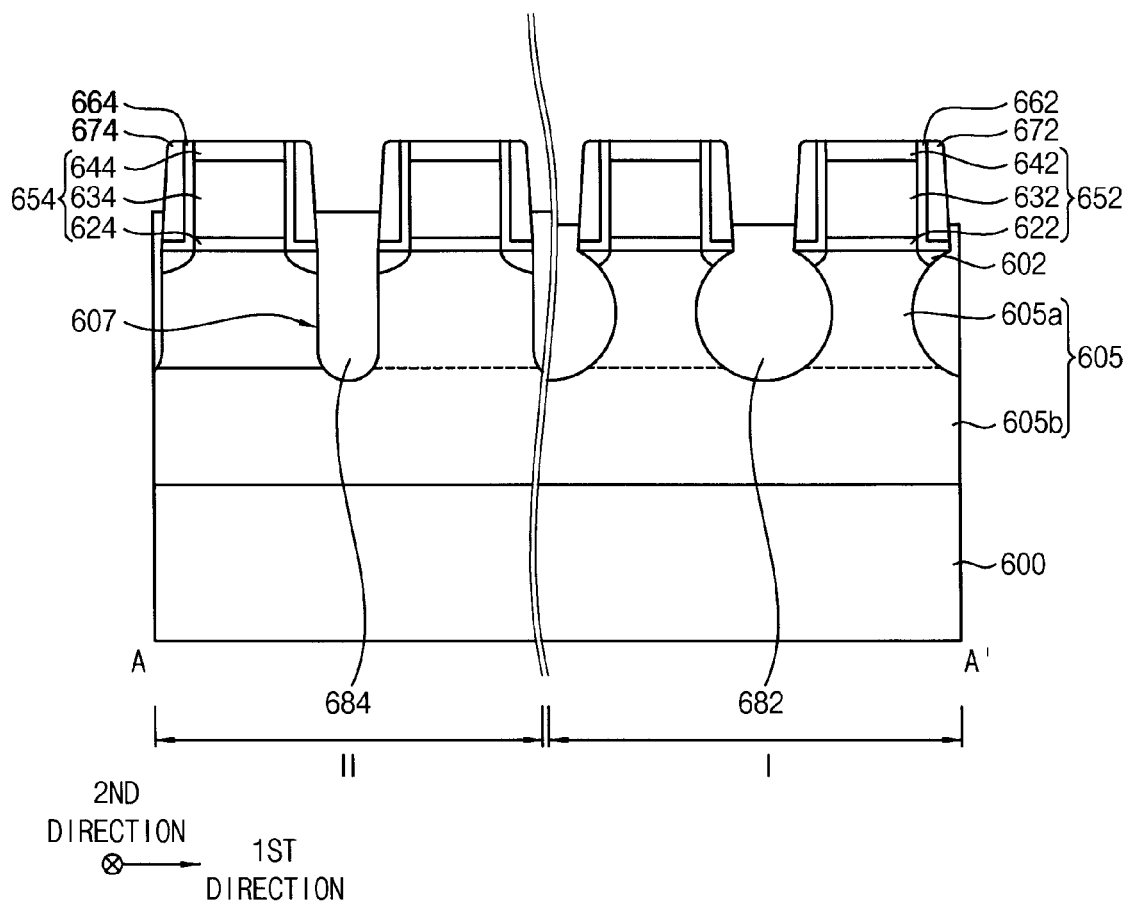
Figure 58:
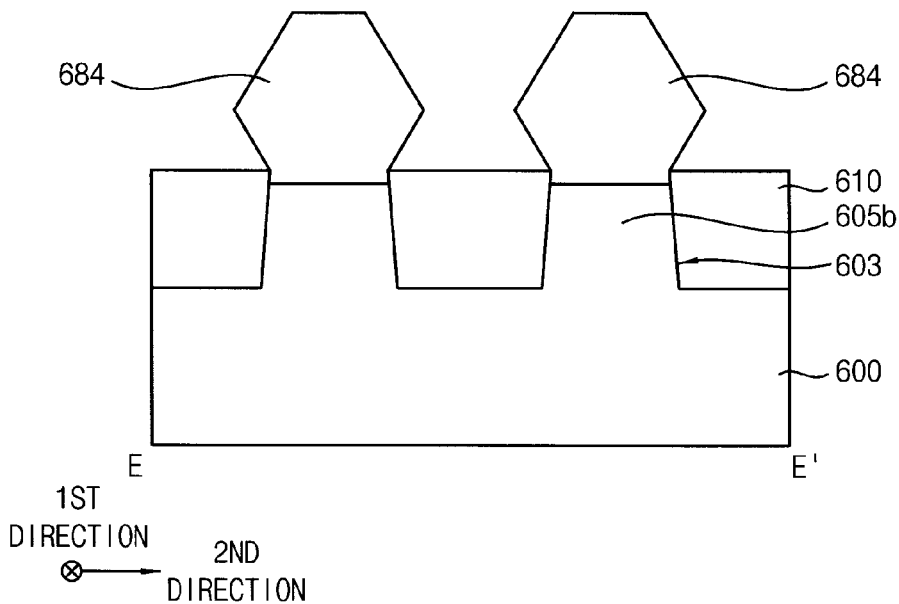

Referring to FIGS. 57 and 58, processes similar to those illustrated in and described with reference to FIG. 28 may be performed.

Thus, a second epitaxial layer 684 may be formed to fill the second trench 607, and a top surface of the second epitaxial layer 684 may contact the fourth spacer 674. In Representative embodiments, the second trench 607 may be formed to have a "U"-shaped profile.

The second epitaxial layer 684 may be formed by an SEG process using a silicon source gas, e.g., disilane ($Si_2H_6$), and a carbon source gas, e.g., monomethylsilane ($SiH_3CH_3$), to form a single crystalline silicon carbide layer. In representative embodiments, an n-type impurity source gas, e.g., phosphine ($PH_3$), may be also used to form a single crystalline silicon carbide layer doped with n-type impurities. Thus, the second epitaxial layer 684 may serve as a source/drain region of an NMOS transistor. In representative embodiments, the second epitaxial layer 684 may grow both in the vertical and horizontal directions, and an upper portion of the first epitaxial layer 684 may be formed to have a cross section, in a vertical plane extending in the second direction, in the shape of a pentagon or hexagon.

In representative embodiments, a top surface of the second epitaxial layer 684 may be formed to be located at a level different from that of the first epitaxial layer 682. For example, as shown in the figure, the top surface of the second epitaxial layer 684 is higher than that of the first epitaxial layer 682. However, in some embodiments, the top surface of the second epitaxial layer 684 may be lower than or substantially coplanar with that of the first epitaxial layer 682.

Figure 59:
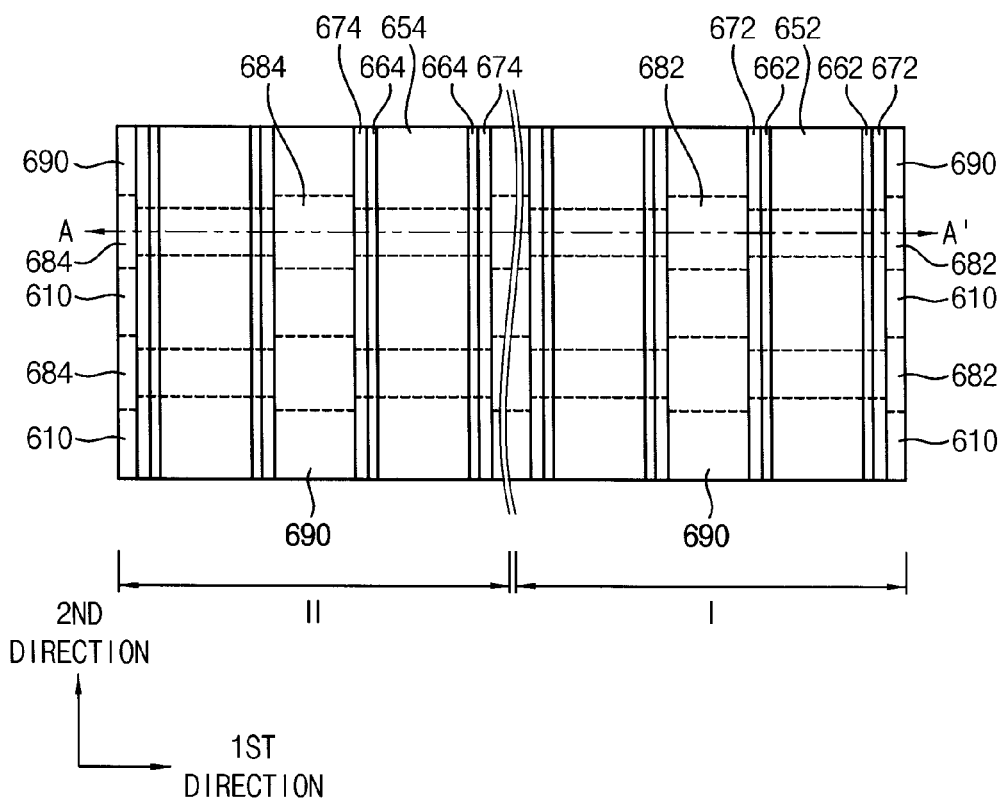
Figure 60:
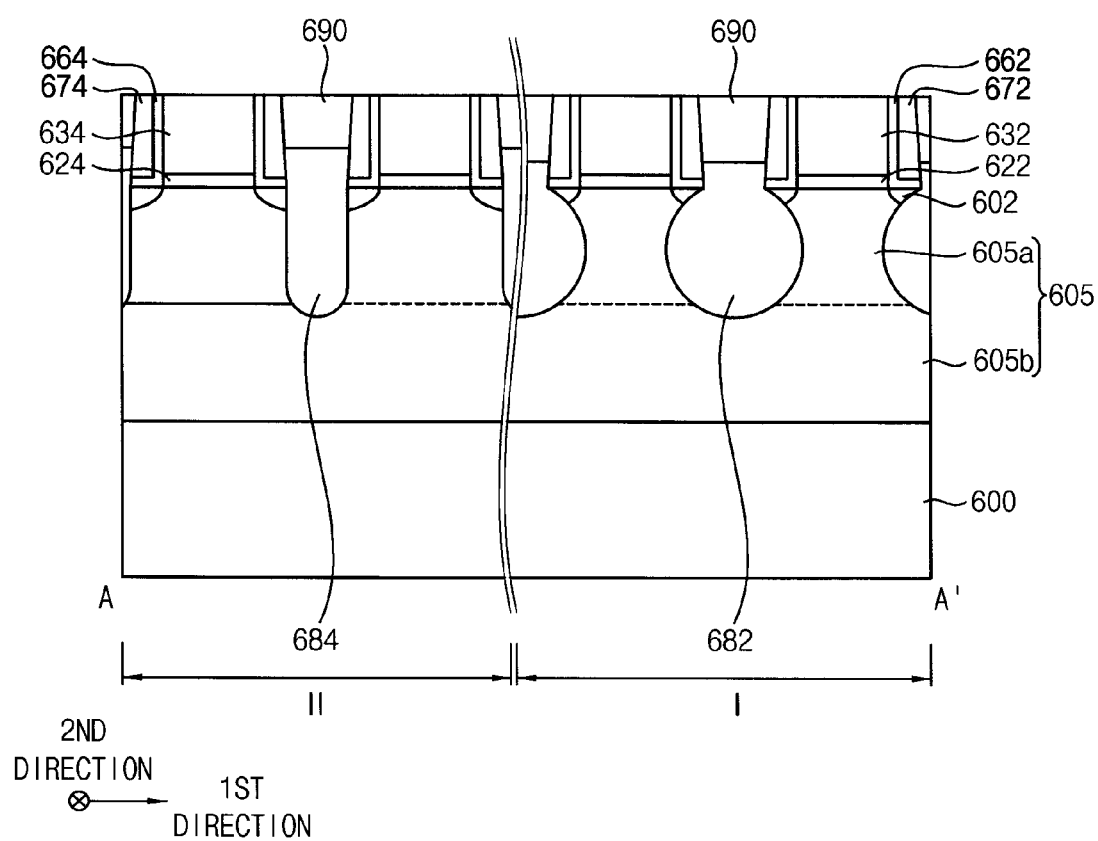

Referring to FIGS. 59 and 60, a process or similar to that illustrated in and described with reference to FIG. 29 may be performed.

Thus, a first insulating interlayer 690 may be formed to cover the first and second dummy gate structures 652 and 654, the first and second epitaxial layers 682 and 684, and the first to fourth spacers 662, 672, 664 and 674, and may be planarized until a top surface of the first and second dummy gate electrodes 632 and 634 is exposed. In the planarization process, the first and second hard masks 642 and 644 may be also removed, and upper portions of the first to fourth spacers 662, 672, 664 and 674 may be partially removed.

Figure 61:
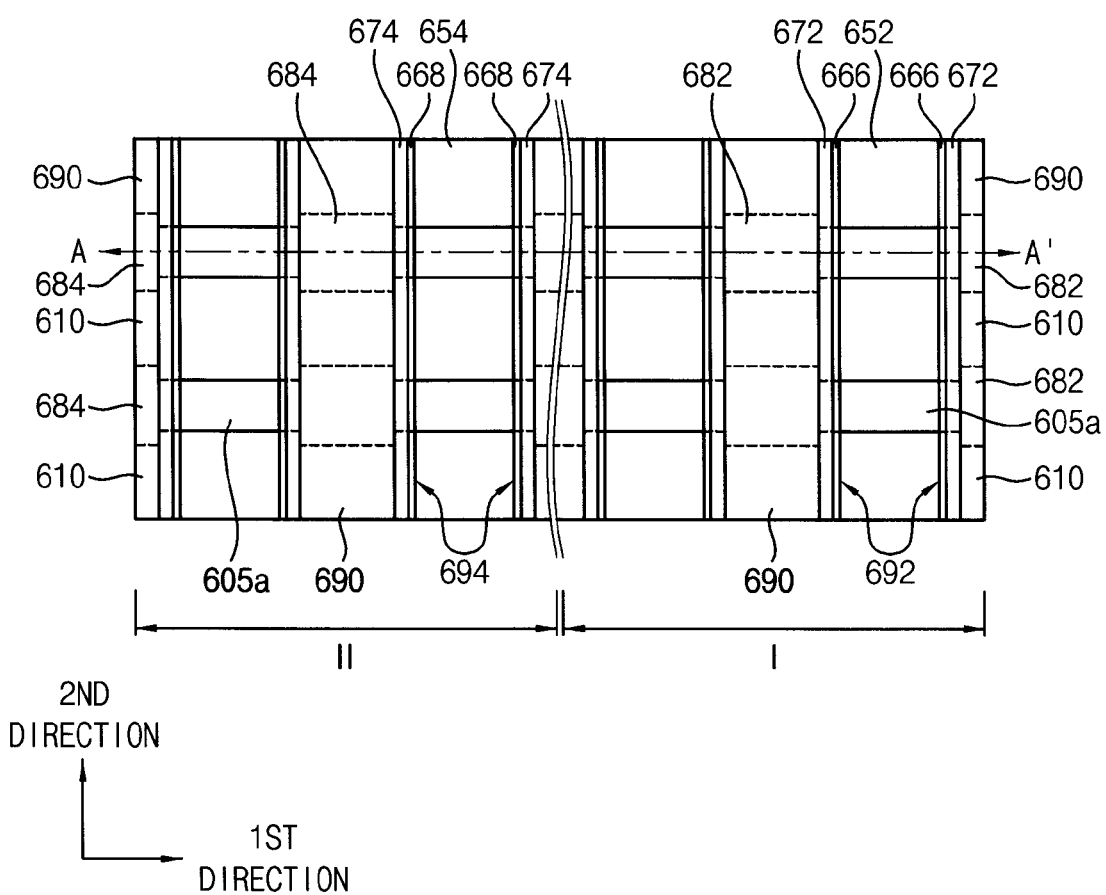
Figure 62:
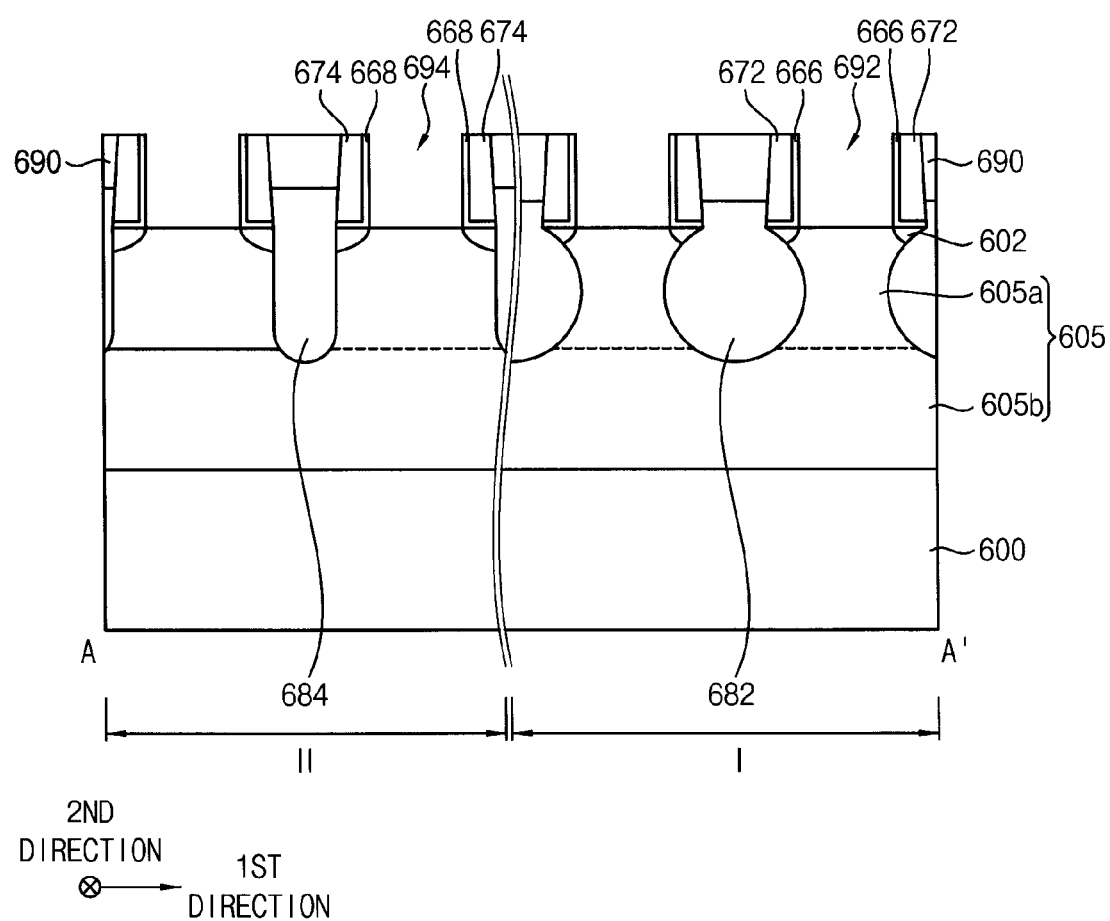

Referring to FIGS. 61 and 62, a process similar to that illustrated in and described with reference to FIGS. 30 and 31 may be performed.

Thus, the exposed first and second dummy gate electrodes 632 and 634, and the first and second dummy gate insulation layer patterns 622 and 624 under the first and second dummy gate electrodes 632 and 634 may be removed to form a first opening 692 exposing an inner sidewall of the first spacer 662 and a top surface of the active fin 605 of the substrate 600 in the first region I, and a second opening 694 exposing an inner sidewall of the third spacer 664 and a top surface of the active fin 605 of the substrate 600 in the second region II.

Additionally, the first and third spacers 662 and 664 exposed by the first and second openings 692 and 694, respectively, may be partially removed to form first and third spacer patterns 666 and 668, respectively, and thus the first and second openings 692 and 694 may be enlarged to form second and fourth openings 696 and 698, respectively.

As described above, due to the nitridation process and/or the first cleaning process performed on the first spacer layer 660, a void is not produced in the first and third spacers 662 and 664 and the first and second dummy gate insulation layer patterns 622 and 624, or no portion thereof is removed. Thus, the top surfaces of the active fins 605 of the substrate 600 exposed when the first and second openings 692 and 694 are formed may not be damaged. Thus, a silicon pitting phenomenon, in which the active fins 605 of the substrate 600 may be damaged during the formation of the first and second openings 692 and 694, may be prevented.

Figure 63:
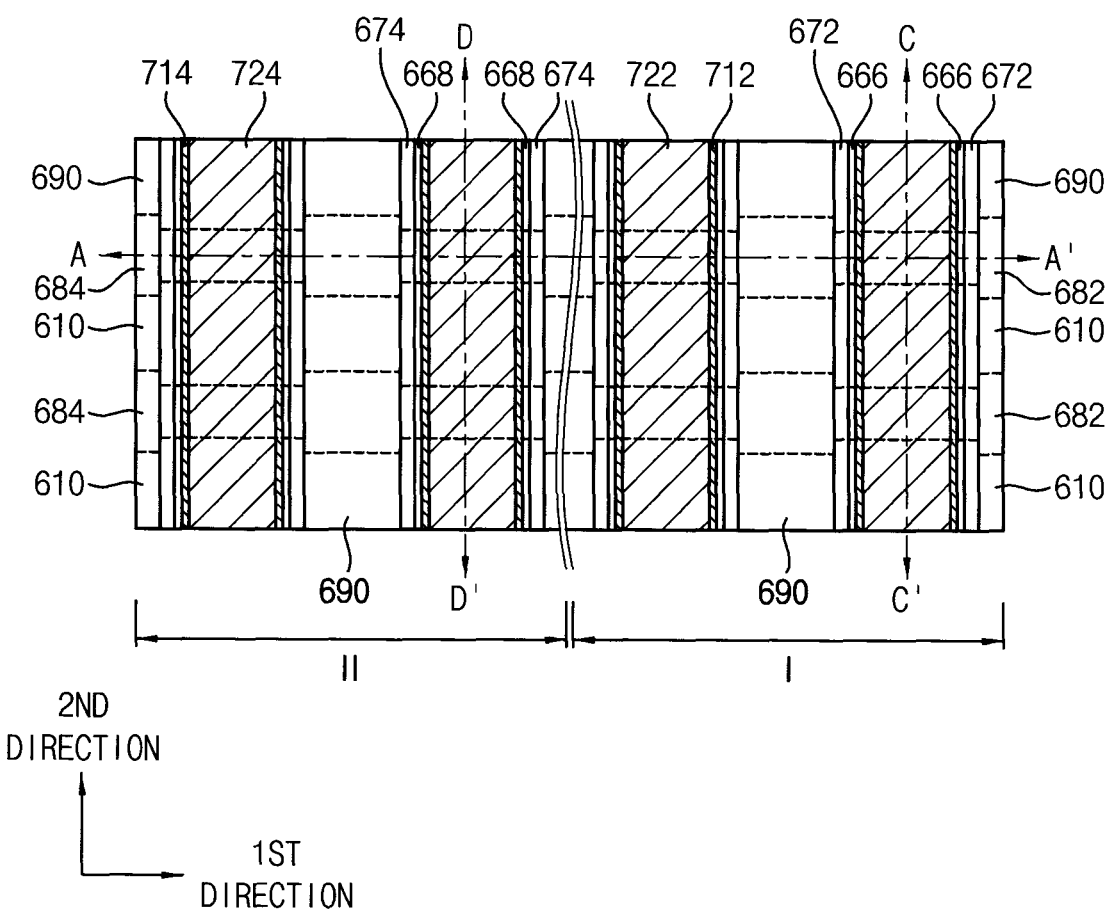
Figure 64:
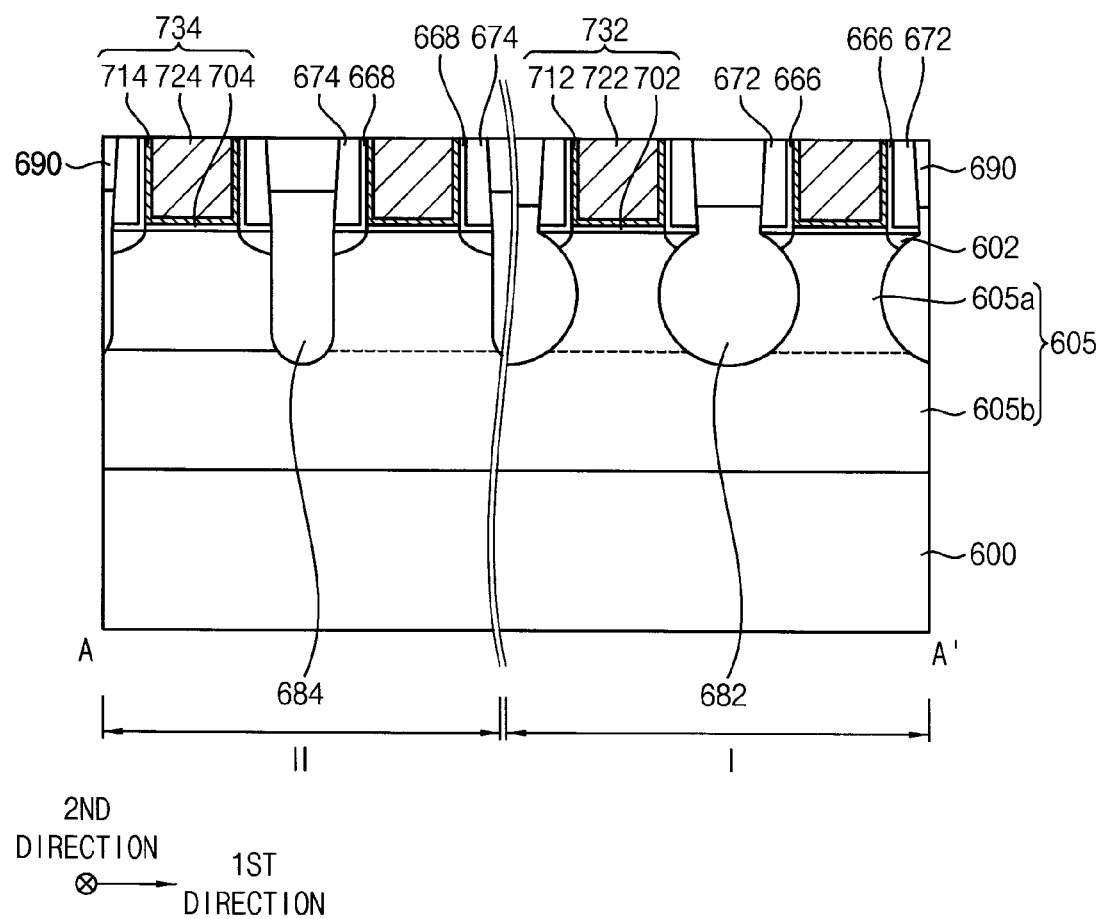
Figure 65:
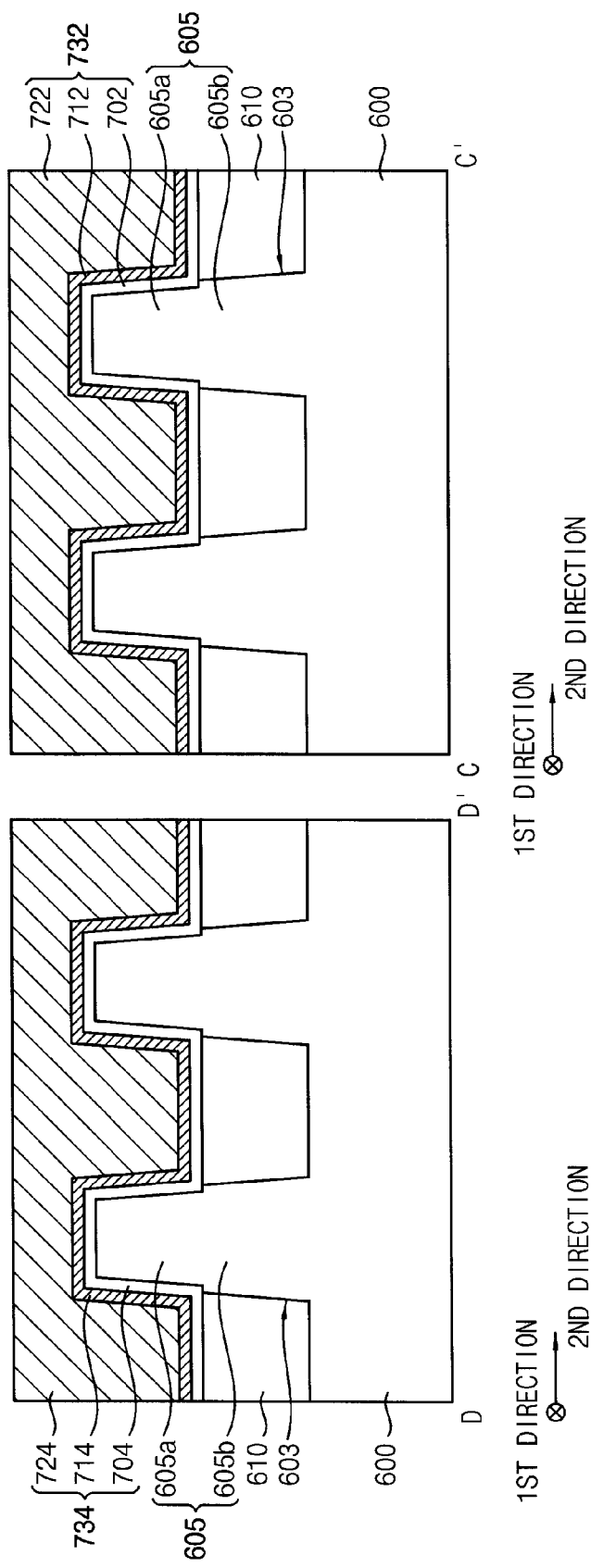

Referring to FIGS. 63 to 65, a process similar to that illustrated in and described with reference to FIG. 32 may be performed.

Thus, first and second gate structures 732 and 734 may be formed to fill the third and fourth openings 696 and 698, respectively.

The first gate structure 732 may be formed to include a first gate insulation layer pattern 702, a first high-k dielectric layer pattern 712 and a first gate electrode 722 sequentially stacked, and the first gate structure 732 and the first epitaxial layer 682 may form a PMOS transistor. The second gate structure 734 may be formed to include a second gate insulation layer pattern 704, a second high-k dielectric layer pattern 714 and a second gate electrode 724 sequentially stacked, and the second gate structure 734 and the second epitaxial layer 684 may form an NMOS transistor.

Figure 66:
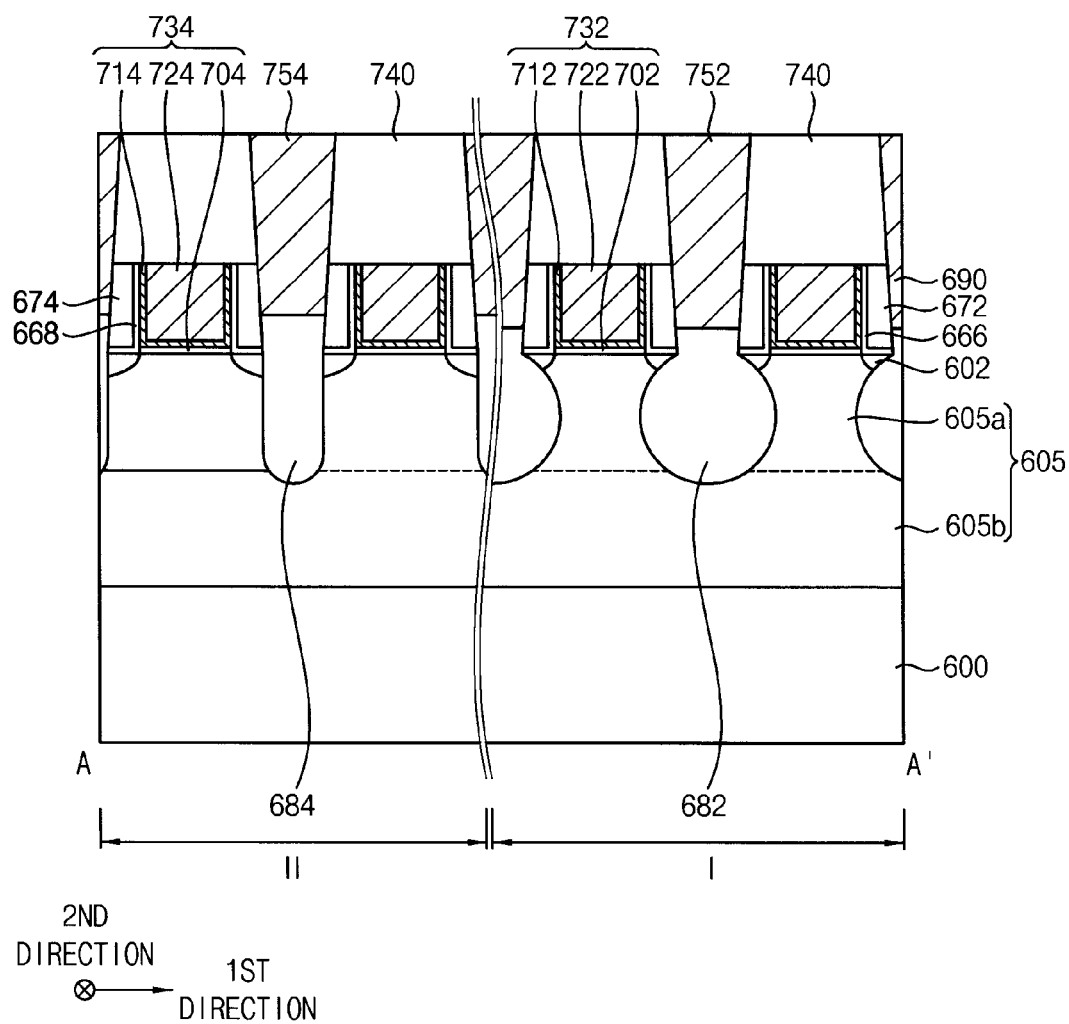

Referring to FIG. 66, a process similar to that illustrated in and described with reference to FIG. 33 may be performed.

Thus, a second insulating interlayer 740 may be formed on the first insulating interlayer 690, the first and second gate structures 732 and 734, the first and third spacer patterns 666 and 668, and the second and fourth spacers 672 and 674, and first and second contact plugs 752 and 754 may be formed through the first and second insulating interlayers 690 and 740 to contact top surfaces of the first and second epitaxial layers 682 and 684, respectively.

As described above, by performing the nitridation process on the first spacer layer 660, the oxidized first spacer layer 660 may have a reduced oxygen concentration. Thus, a void is not produced in the first and third spacers 662 and 664, or the first and second dummy gate insulation layer patterns 622 and 624 adjacent thereto, during the second cleaning process for forming the first and second epitaxial layers 682 and 684. Accordingly, the active fins 605 of the substrate 600 under the first and second gate electrodes 722 and 724 may not be damaged, and the semiconductor device may have good characteristics with no electrical shorts occurring.

The semiconductor device may include the first gate structure 732 on the substrate 600 in the first region I, the first spacer pattern 666 and the second spacer 672 on the sidewall of the first gate structure 732, the first epitaxial layer 682 on the substrate 600 adjacent to the first gate structure 732, and the first contact plug 752 on the first epitaxial layer 682. The first gate structure 732 may include the first gate insulation layer pattern 702, the first high-k dielectric layer pattern 712 and the first gate electrode 722 sequentially stacked.

The semiconductor device may also include the second gate structure 734 on the substrate 600 in the second region II, the third spacer pattern 668 and the fourth spacer 674 on the sidewall of the second gate structure 734, the second epitaxial layer 684 on the substrate 600 adjacent to the second gate structure 734, and the second contact plug 754 on the second epitaxial layer 684. The second gate structure 734 may include the second gate insulation layer pattern 704, the second high-k dielectric layer pattern 714 and the second gate electrode 724 sequentially stacked.

Figure 67:
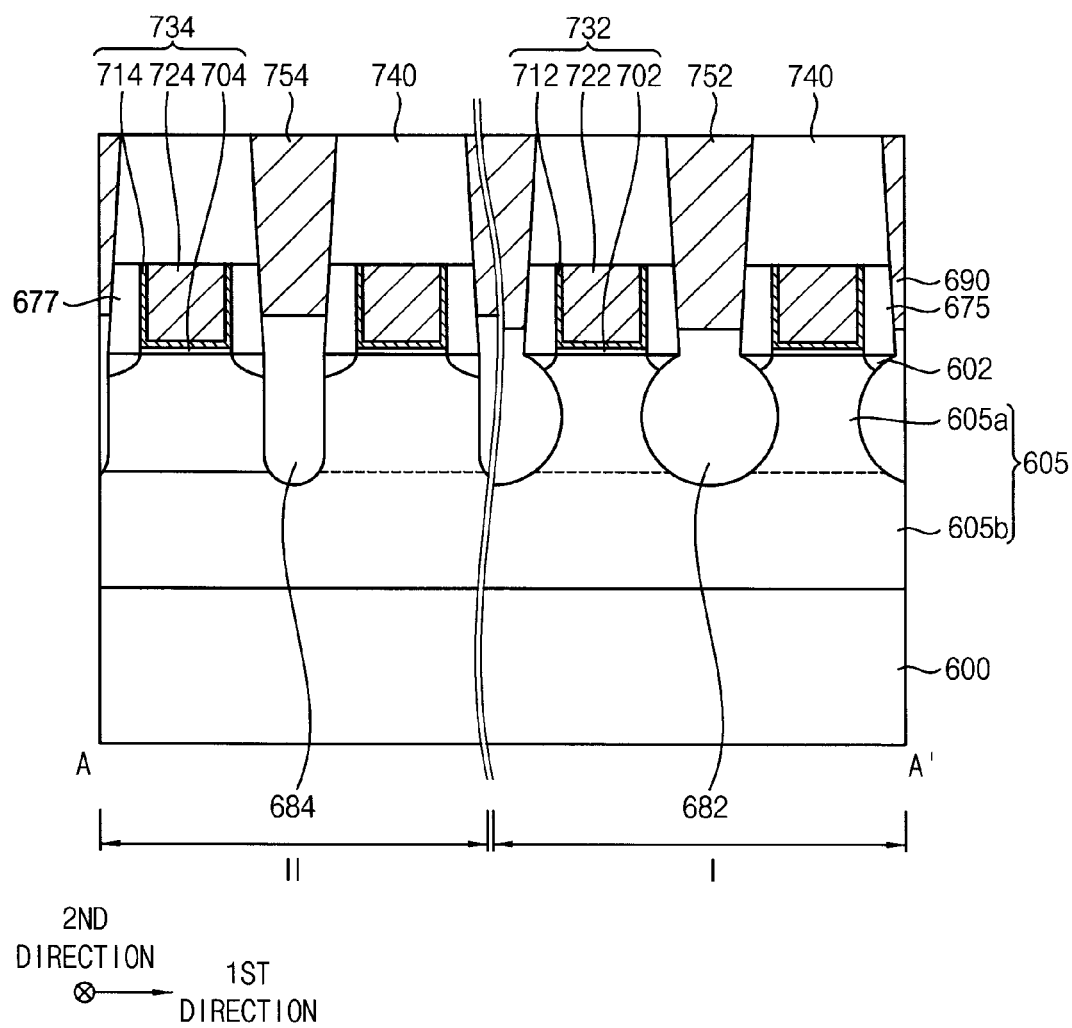

Alternatively, referring to FIG. 67, the semiconductor device may include first and unitary second spacer pattern structures 675 and 677 on the sidewalls of the first and second gate structures 732 and 734, respectively. That is, when the first spacer layer 660 is sufficiently nitridated by the first cleaning process and the nitridation process and when the second spacer layer 670 is formed to include silicon nitride, the unitary first spacer pattern structure 675 and the unitary second spacer pattern structure 677 may be formed.

The above-described methods of manufacturing a semiconductor device may be applied to the manufacturing of various types of memory devices having gate structures. For example, the method may be applied to the manufacturing of logic devices such as central processing units (CPUs), main processing units (MPUs), application processors (APs), or the like. Additionally, the methods may be applied to the manufacturing of volatile memory devices such as DRAM devices or SRAM devices, or non-volatile memory devices such as flash memory devices, PRAM devices, MRAM devices, RRAM devices, or the like.

Finally, representative embodiments of the inventive concept and examples thereof have been described above in detail. The inventive concept may, however, be embodied in many different forms and should not be construed as being limited to the representative embodiments described above. Rather, these embodiments were described so that this disclosure is thorough and complete, and fully conveys the inventive concept to those skilled in the art. Thus, the true spirit and scope of the inventive concept is not limited by the representative embodiments and examples described above but by the following claims.

What is claimed is:

1. A method of manufacturing a semiconductor device, the method comprising:
    forming a dummy gate structure on a substrate;
    forming a spacer layer on the substrate to cover the dummy gate structure;
    subsequently performing an implantation process comprising implanting impurities into an upper portion of the substrate using the dummy gate structure as a mask to thereby form an impurity region of the substrate adjacent to the dummy gate structure;
    subsequently nitriding the spacer layer;
    etching the nitrided spacer layer to form a spacer on a side surface of the dummy gate structure;
    forming a trench in the substrate by removing an upper portion of the substrate adjacent to the dummy gate structure;
    cleaning an interior surface that defines the trench;
    forming an epitaxial layer in the trench; and
    replacing the dummy gate structure with a gate structure.

2. The method of claim 1, wherein the implantation process comprises:
    forming a photoresist pattern on the substrate to expose a region including the dummy gate structure;
    implanting the impurities into the upper portion of the substrate using both the photoresist pattern and the dummy gate pattern as a mask; and
    removing the photoresist pattern by an ashing process and/or a stripping process.

3. The method of claim 2, wherein the spacer layer is formed of silicon nitride, and wherein removing the photoresist pattern includes oxidizing the first spacer layer.

4. The method of claim 1, wherein the nitriding is performed using nitrogen ($N_2$) and/or ammonia ($NH_3$).

5. The method of claim 1, further comprising cleaning the spacer layer before the spacer layer is nitrided.

6. The method of claim 5, wherein the cleaning of the spacer layer decreases the thickness of the spacer layer.

7. The method of claim 5, wherein the cleaning is a dry cleaning process using gaseous ammonia ($NH_3$) and/or nitrogen trifluoride ($NF_3$) plasma, or a wet cleaning process using hydrogen fluoride (HF) and/or buffered oxide etch (BOE).

8. The method of claim 1, further comprising cleaning the spacer layer after the spacer layer is nitrided.

9. The method of claim 1, wherein the cleaning of the interior surface defining the trench is a wet etch process using ammonia hydroxide ($NH_4OH$) as an etching solution.

10. The method of claim 1, wherein the spacer layer is a first spacer layer, further comprising:
    forming a second spacer layer on the first spacer layer after the first spacer layer is nitrided; and
    anisotropically etching the first and second spacer layers to form first and second spacers, respectively, sequentially stacked on the side surface of the dummy gate structure.

11. The method of claim 10, wherein the second spacer layer is formed of silicon nitride and to a thickness greater than that of the first spacer layer.

12. The method of claim 1, wherein forming the dummy gate structure includes:
    forming a dummy gate insulation layer of silicon oxide on the substrate;
    forming a dummy gate electrode layer comprising polysilicon on the dummy gate insulation layer;
    forming a hard mask of silicon nitride on the dummy gate electrode layer; and
    sequentially etching the dummy gate electrode layer and the dummy gate insulation layer using the hard mask as an etching mask to form a dummy gate insulation layer pattern, a dummy gate electrode, and a hard mask sequentially stacked on the substrate.

13. The method of claim 12, wherein forming the spacer comprises anisotropically etching the spacer layer, and
    wherein replacing the dummy gate structure with the gate structure includes:
    removing the hard mask, the dummy gate electrode and the dummy gate insulation layer pattern to form an opening exposing an inner wall surface of the spacer and a top surface of the substrate; and
    forming a gate insulation layer pattern, a high-k dielectric layer pattern and a gate electrode that fill the opening and are sequentially stacked on the exposed top surface of the substrate.

14. The method of claim 13, further comprising removing part of the exposed spacer to enlarge the opening.

15. The method of claim 14, wherein removing the part of the first spacer to enlarge the opening comprises performing a dry process using gaseous ammonia ($NH_3$) and/or nitrogen trifluoride ($NF_3$) plasma, or a wet process using hydrogen fluoride (HF) and/or buffered oxide etch (BOE).

16. A method of manufacturing a semiconductor device, the method comprising:
    forming first and second dummy gate structures on first and second regions, respectively, of a substrate;
    forming a spacer layer on the substrate to cover the first and second dummy gate structures;
    subsequently performing an implantation process comprising implanting impurities into an upper portion of the substrate using the dummy gate structures as a mask to thereby form first and second impurity regions of the substrate adjacent to the first and second dummy gate structures, respectively;
    subsequently nitriding the spacer layer;
    etching the nitrided spacer layer to form spacers on side surfaces of the first and second dummy gate structures, respectively;
    forming a first trench in the substrate by removing an upper portion of the substrate adjacent to the first dummy gate structure;
    cleaning an inner surface defining the first trench;
    forming a first epitaxial layer in the first trench; and
    replacing the first and second dummy gate structures with first and second gate structures, respectively.

17. The method of claim 16, wherein the implantation process comprises:
    forming a first photoresist pattern on the substrate to cover the second region;
    forming the first impurity region at an upper portion of the first region of the substrate using both the first dummy gate pattern and the first photoresist pattern as a mask;
    removing the first photoresist pattern by an ashing process and/or a stripping process;
    forming a second photoresist pattern on the substrate to cover the first region;
    forming the second impurity region at an upper portion of the second region of the substrate using both the second dummy gate pattern and the second photoresist pattern as a mask; and
    removing the second photoresist pattern by an ashing process and/or a stripping process.

18. The method of claim 17, wherein the spacer layer is formed of silicon nitride, and wherein removing the first photoresist pattern or removing the second photoresist pattern includes oxidizing the first spacer layer.

19. The method of claim 16, wherein the spacer layer is a first spacer layer, and after nitriding the first spacer layer, further comprising:
    forming a second spacer layer on the first spacer layer;
    forming a third photoresist pattern on the substrate to cover the second region; and
    anisotropically etching the first and second spacer layers to form first and second spacers sequentially stacked on the side surface of the first dummy gate structure.

20. The method of claim 19, after forming the first epitaxial layer, further comprising:
    forming a fourth photoresist pattern on the substrate to cover the first region;
    anisotropically etching the first and second spacer layers to form third and fourth spacers sequentially stacked on the side surface of the second dummy gate structure;
    forming a second trench in the substrate by removing one portion of said second impurity region of the substrate remote from the second dummy gate structure while leaving another portion of said second impurity region in place adjacent to the second dummy gate structure;
    cleaning an interior surface defining the second trench; and
    forming a second epitaxial layer in the second trench.

* * * * *